US009508529B2

(12) United States Patent
Valcore, Jr. et al.

(10) Patent No.: US 9,508,529 B2
(45) Date of Patent: Nov. 29, 2016

(54) SYSTEM, METHOD AND APPARATUS FOR RF POWER COMPENSATION IN A PLASMA PROCESSING SYSTEM

(71) Applicant: Lam Research Corporation, Fremont, CA (US)

(72) Inventors: John C. Valcore, Jr., Berkeley, CA (US); Henry Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 104 days.

(21) Appl. No.: 14/521,776

(22) Filed: Oct. 23, 2014

(65) Prior Publication Data

US 2016/0118227 A1  Apr. 28, 2016

(51) Int. Cl.
*H01J 37/32* (2006.01)

(52) U.S. Cl.
CPC .... *H01J 37/32082* (2013.01); *H01J 37/32165* (2013.01); *H01J 37/32174* (2013.01); *H01J 37/32183* (2013.01); *H01J 37/32926* (2013.01)

(58) Field of Classification Search
CPC .............. H01J 37/32082; H01J 37/32449; C23C 16/505; C23C 16/52; H01L 21/67069
USPC ................... 315/111.21; 156/345.28, 345.44
See application file for complete search history.

(56) References Cited

U.S. PATENT DOCUMENTS

| 2014/0265851 A1* | 9/2014 | Albarede .......... H01J 37/32899 315/111.21 |
| 2015/0048740 A1* | 2/2015 | Valcore, Jr. ....... H01J 37/32183 315/111.21 |

* cited by examiner

*Primary Examiner* — Daniel D Chang
(74) *Attorney, Agent, or Firm* — Martine Penilla Group, LLP

(57) ABSTRACT

Plasma processing systems and methods including a plasma processing chamber and an RF transmission path. The plasma processing chamber including an electrostatic chuck. The RF transmission path including one or more RF generators, a match circuit coupled the RF generator and an RF feed coupling the match circuit to the electrostatic chuck. The system also includes an RF return path coupled between the plasma processing chamber and the RF generator. A plasma processing system controller is coupled to the plasma processing chamber and the RF transmission path. The controller includes recipe logic for at least one plasma processing recipe including multiple plasma processing settings and an RF power compensation logic for adjusting at least one of the plasma processing settings.

18 Claims, 41 Drawing Sheets

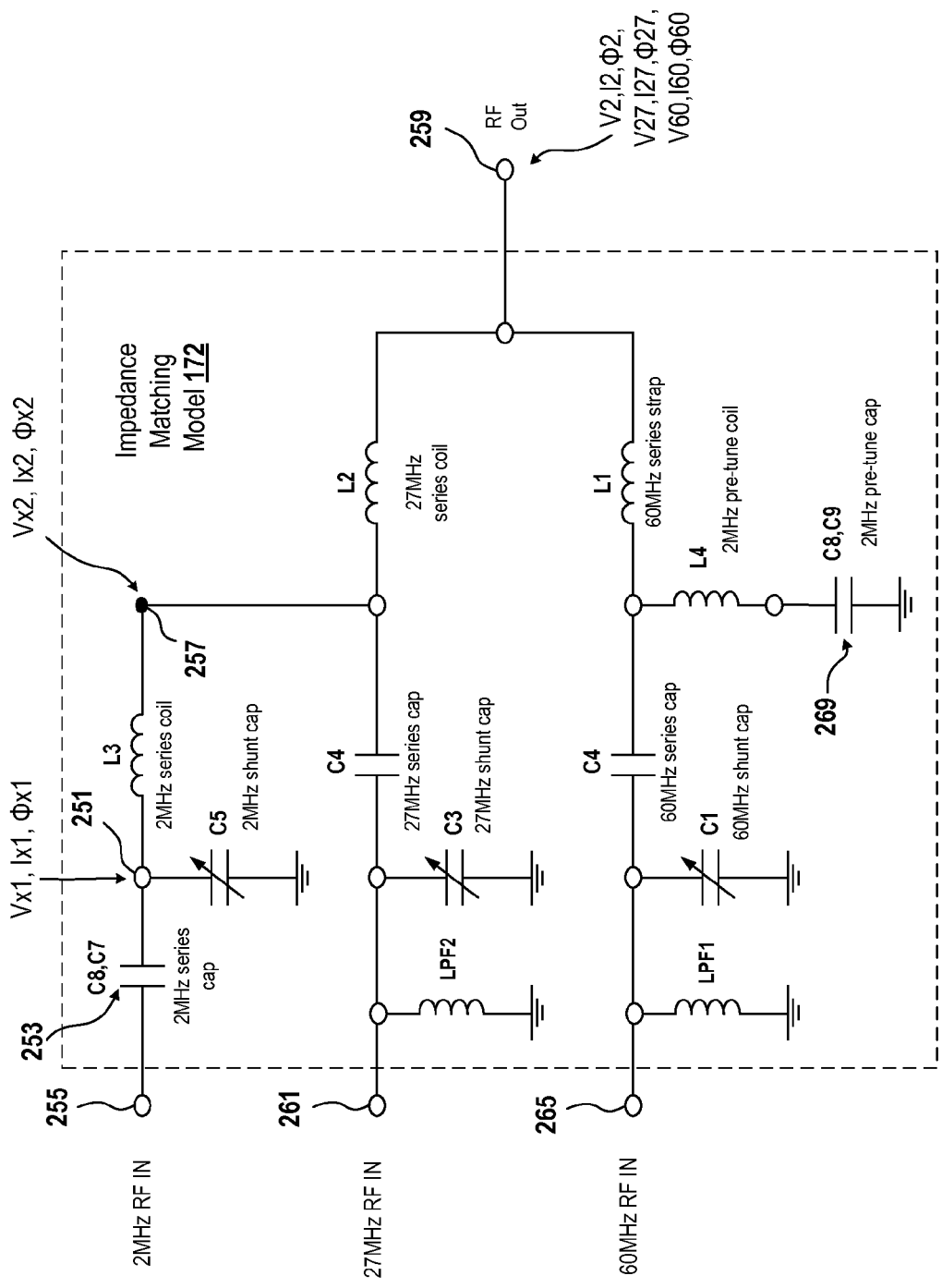

SYSTEM, METHOD AND APPARATUS FOR RF POWER COMPENSATION IN A PLASMA PROCESSING SYSTEM

FIELD

The present embodiments relate to using RF modeling of a RF transmission system to determine RF model of selected stages in the RF transmission system in a plasma processing system.

BACKGROUND

In a plasma-based system, plasma is generated within a plasma chamber to perform various operations, e.g., etching, cleaning, depositing, etc., on a wafer. The plasma is monitored and controlled to control performance of the various operations. For example, the plasma is monitored by monitoring a voltage of the plasma and is controlled by controlling an amount of radio frequency (RF) power supplied to the plasma chamber.

However, the use of voltage to monitor and control the performance of the operations may not provide satisfactory results. Moreover, the monitoring of voltage may be an expensive and time consuming operation.

It is in this context that embodiments described in the present disclosure arise.

SUMMARY

Embodiments of the disclosure provide apparatus, methods and computer programs for using modeling refine and adjust operations in a plasma system. It should be appreciated that the present embodiments can be implemented in numerous ways, e.g., a process, an apparatus, a system, a piece of hardware, or a method on a computer-readable medium. Several embodiments are described below.

One embodiment provides a plasma processing system including a plasma processing chamber and an RF transmission path. The plasma processing chamber including an electrostatic chuck. The RF transmission path including one or more RF generators, a match circuit coupled the RF generator and an RF feed coupling the match circuit to the electrostatic chuck. The system also includes an RF return path coupled between the plasma processing chamber and the RF generator. A plasma processing system controller is coupled to the plasma processing chamber and the RF transmission path. The controller includes recipe logic for at least one plasma processing recipe including multiple plasma processing settings and an RF power compensation logic for adjusting at least one of the plasma processing settings.

The recipe logic can include computer readable instructions for a calibration plasma process recipe. The plasma processing chamber can also includes a sensor configured to measure at least one of a voltage, and/or a current, and/or a frequency, and/or a phase of a signal, and/or a plasma process chamber temperature, and/or a plasma process chamber pressure, and/or a flow rate input or output from the plasma process chamber, and/or a mixture of process gases input to the plasma process chamber, and/or the etch byproducts produced in the plasma process chamber.

The plasma processing chamber can include a sensor configured to measure a plasma induced voltage on a wafer supported on the electrostatic chuck during an execution of a calibration plasma process defined by the calibration plasma process recipe. The RF power compensation logic can also include instructions for measuring at least one plasma parameter during an execution of a calibration plasma process. The RF power compensation logic can also include instructions for comparing the measured at least one plasma parameter to a corresponding at least one plasma parameter predicted by a complete RF transmission line model. The complete RF transmission line model includes RF models for the RF transmission path, the plasma and the RF return path. The at least one RF generator can include two or three RF generators and each one of the RF generators generate a different output signal frequency.

Another embodiment provides a method for adjusting a plasma process recipe. The method includes determining an RF compensation adjustment. Determining the RF compensation adjustment includes applying a calibration plasma process to at least one wafer in the plasma processing chamber. At least one plasma parameter is measured during the calibration plasma process. The measured at least one plasma parameter is compared to a corresponding at least one plasma parameter predicted by a complete RF transmission line model to determine an RF compensation adjustment. The complete RF transmission line model includes the RF transmission path, the plasma and the RF return path. The RF compensation adjustment is received in an RF power compensation logic and at least one of the plasma processing settings included in a plasma processing recipe are adjusted. The adjusted plasma processing setting is stored and a plasma process is applied to a process wafer. The applied plasma process includes the adjusted plasma processing setting.

Yet another embodiment provides a plasma processing system. The plasma processing system includes a plasma processing chamber including an electrostatic chuck. The plasma processing system also includes an RF transmission path. The RF transmission path includes one or more RF generators, a match circuit coupled to the RF generator and an RF feed coupling the match circuit to an RF input to an electrostatic chuck. An RF return path is coupled between the plasma processing chamber and the RF generator. A plasma processing system controller is coupled to the plasma processing chamber and the RF transmission path. The controller including a recipe logic including instructions for at least one plasma processing recipe including multiple plasma processing settings and an RF power compensation logic. The RF power compensation logic includes instructions for adjusting at least one plasma processing setting and instructions for measuring a plasma induced voltage on a wafer during the calibration plasma process and instructions for comparing the measured plasma induced voltage on the wafer to a corresponding plasma induced voltage on the wafer as predicted by a complete RF transmission line model. The complete RF transmission line model including RF models for the RF transmission path, the plasma and the RF return path.

Advantages of the disclosed embodiments include improved control of a plasma processing chamber such as controlling multiple plasma processing chambers to operate substantially identically. The disclosed embodiments also provide the advantage of improved production methods for producing the plasma processing chambers and the RF transmission systems thereof as the complete RF transmission model can be used to identify production variations in each plasma processing chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 3B is a circuit diagram of an impedance matching model, in accordance with an embodiment described in the present disclosure.

DETAILED DESCRIPTION

The following embodiments describe systems and methods for using a complete RF transmission line model to compensate for RF variations between different plasma systems. It will be apparent that the present embodiments may be practiced without some or all of these specific details. In other instances, well known process operations have not been described in detail in order not to unnecessarily obscure the present embodiments.

Figure 1:
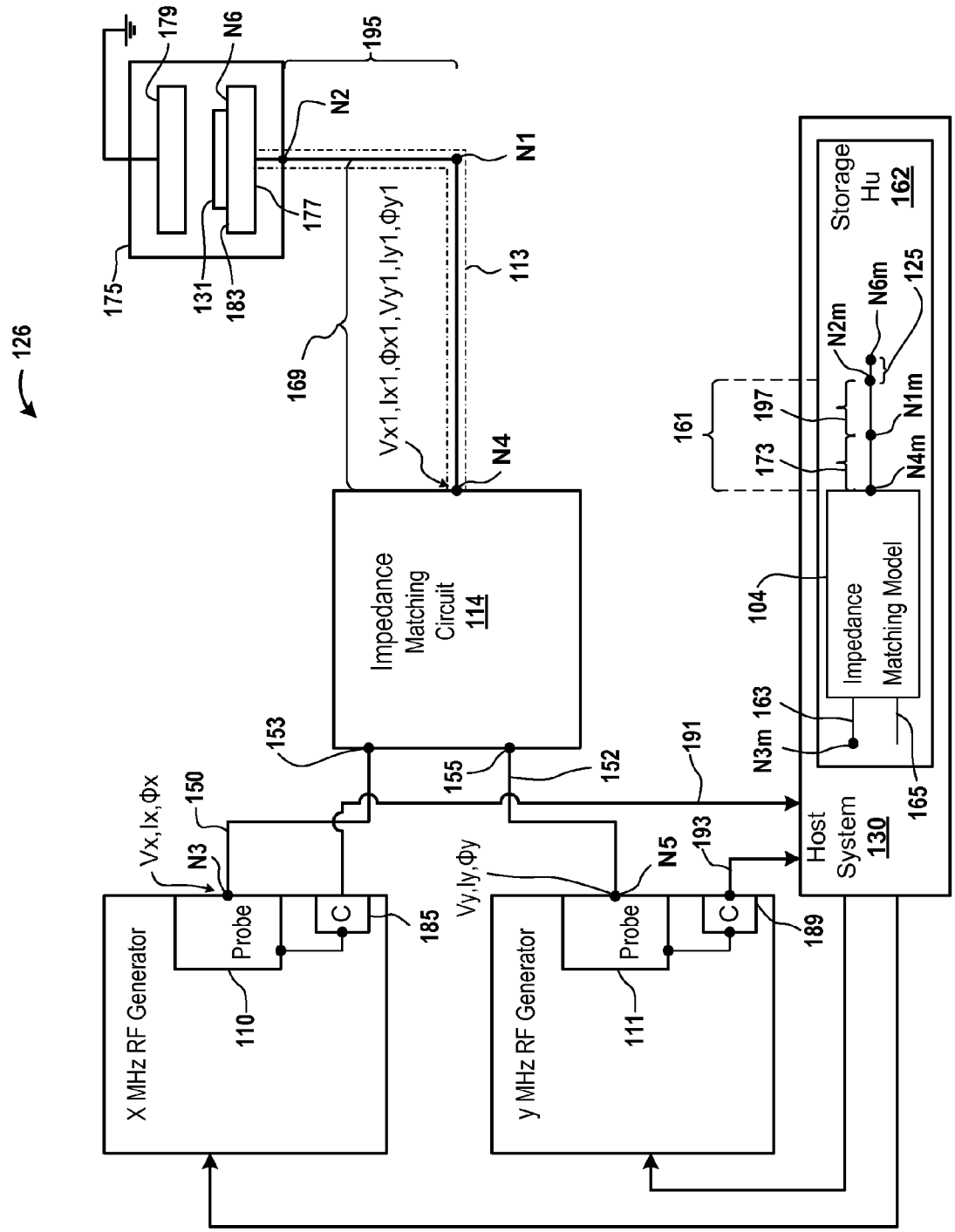
FIG. 1 is a block diagram of a system for determining a variable at an output of an impedance matching model, at an output of a portion of a radio frequency (RF) transmission model, and at an output of an electrostatic chuck (ESC) model, in accordance with an embodiment described in the present disclosure.

FIG. 1 is a block diagram of an embodiment of a system 126 for determining a variable at an output of an impedance matching model 104, at an output, e.g., a model node N1$m$, of a portion 173 of an RF transmission model 161, which is a model of an RF transmission line 113, and at an output, e.g., a model node N6$m$, of an electrostatic chuck (ESC) model 125. Examples of a variable include complex voltage, complex current, complex voltage and current, complex power, wafer bias, etc. The RF transmission line 113 has an output, e.g., a node N2. A voltage and current (VI) probe 110 measures a complex voltage and current Vx, Ix, and ϕx, e.g., a first complex voltage and current, at an output, e.g., a node N3, of an x MHz RF generator. It should be noted that Vx represents a voltage magnitude, Ix represents a current magnitude, and ϕx represents a phase between Vx and Ix. The impedance matching model 104 has an output, e.g., a model node N4$m$.

Moreover, a voltage and current probe 111 measures a complex voltage and current Vy, Iy, and ϕy at an output, e.g., a node N5, of a y MHz RF generator. It should be noted that Vy represents a voltage magnitude, Iy represents a current magnitude, and ϕy represents a phase between Vy and Iy.

In some embodiments, a node is an input of a device, an output of a device, or a point within the device. A device, as used herein, is described below.

Examples of x MHz include 2 MHz, 27 MHz, and 60 MHz. Examples of y MHz include 2 MHz, 27 MHz, and 60 MHz. The x MHz is different than y MHz. For example, when x MHz is 2 MHz, y MHz is 27 MHz or 60 MHz. When x MHz is 27 MHz, y MHz is 60 MHz.

An example of each voltage and current probe 110 and 111 includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 110 or 111 is calibrated according to NIST standard. In this illustration, the voltage and current probe 110 or 111 is coupled with an open circuit, a short circuit, or a known load to calibrate the voltage and current probe 110 or 111 to comply with the NIST standard. The voltage and current probe 110 or 111 may first be coupled with the open circuit, then with the short circuit, and then with the known load to calibrate the voltage and current probe 110 based on NIST standard. The voltage and current probe 110 or 111 may be coupled to the known load, the open circuit, and the short circuit in any order to calibrate the voltage and current probe 110 or 111 according to NIST standard. Examples of a known load include a 50 ohm load, a 100 ohm load, a 200 ohm load, a static load, a direct current (DC) load, a resistor, etc. As an illustration, each voltage and current probe 110 and 111 is calibrated according NIST-traceable standards.

The voltage and current probe 110 is coupled to the output, e.g., the node N3, of the x MHz RF generator. The output, e.g., the node N3, of the x MHz RF generator is coupled to an input 153 of an impedance matching circuit 114 via a cable 150. Moreover, the voltage and current probe 111 is coupled to the output, e.g., the node N5, of the y MHz RF generator. The output, e.g., the node N5, of the y MHz RF generator is coupled to another input 155 of the impedance matching circuit 114 via a cable 152.

An output, e.g., a node N4, of the impedance matching circuit 114 is coupled to an input of the RF transmission line 113. The RF transmission line 113 includes a portion 169 and another portion 195. An input of the portion 169 is an input of the RF transmission line 113. An output, e.g., a node N1, of the portion 169 is coupled to an input of the portion 195. An output, e.g., the node N2, of the portion 195 is coupled to the plasma chamber 175. The output of the portion 195 is the output of the RF transmission line 113. An example of the portion 169 includes an RF cylinder and an RF strap. The RF cylinder is coupled to the RF strap. An example of the portion 195 includes an RF rod and/or a support, e.g., a cylinder, etc., for supporting the plasma chamber 175.

The plasma chamber 175 includes an electrostatic chuck (ESC) 177, an upper electrode 179, and other parts (not shown), e.g., an upper dielectric ring surrounding the upper electrode 179, an upper electrode extension surrounding the upper dielectric ring, a lower dielectric ring surrounding a lower electrode of the ESC 177, a lower electrode extension surrounding the lower dielectric ring, an upper plasma exclusion zone (PEZ) ring, a lower PEZ ring, etc. The upper electrode 179 is located opposite to and facing the ESC 177. A work piece 131, e.g., a semiconductor wafer, etc., is supported on an upper surface 183 of the ESC 177. The upper surface 183 includes an output N6 of the ESC 177. The work piece 131 is placed on the output N6. Various processes, e.g., chemical vapor deposition, cleaning, deposition, sputtering, etching, ion implantation, resist stripping, etc., are performed on the work piece 131 during production. Integrated circuits, e.g., application specific integrated circuit (ASIC), programmable logic device (PLD), etc. are developed on the work piece 131 and the integrated circuits are used in a variety of electronic items, e.g., cell phones, tablets, smart phones, computers, laptops, networking equipment, etc. Each of the lower electrode and the upper electrode 179 is made of a metal, e.g., aluminum, alloy of aluminum, copper, etc.

In one embodiment, the upper electrode 179 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 179 is grounded. The ESC 177 is coupled to the x MHz RF generator and the y MHz RF generator via the impedance matching circuit 114.

When the process gas is supplied between the upper electrode 179 and the ESC 177 and when the x MHz RF generator and/or the y MHz RF generator supplies RF signals via the impedance matching circuit 114 and the RF transmission line 113 to the ESC 177, the process gas is ignited to generate plasma within the plasma chamber 175.

When the x MHz RF generator generates and provides an RF signal via the node N3, the impedance matching circuit 114, and the RF transmission line 113 to the ESC 177 and when the y MHz generator generates and provides an RF signal via the node N5, the impedance matching circuit 114, and the RF transmission line 113 to the ESC 177, the voltage and current probe 110 measures the complex voltage and current at the node N3 and the voltage and current probe 111 measures the complex voltage and current at the node N5.

The complex voltages and currents measured by the voltage and current probes 110 and 111 are provided via corresponding communication devices 185 and 189 from the corresponding voltage and current probes 110 and 111 to a storage hardware unit (HU) 162 of a host system 130 for storage. For example, the complex voltage and current measured by the voltage and current probe 110 is provided via the communication device 185 and a cable 191 to the host system 130 and the complex voltage and current measured by the voltage and current probe 111 is provided via the communication device 189 and a cable 193 to the host system 130. Examples of a communication device include an Ethernet device that converts data into Ethernet packets and converts Ethernet packets into data, an Ethernet for Control Automation Technology (EtherCAT) device, a serial interface device that transfers data in series, a parallel interface device that transfers data in parallel, a Universal Serial Bus (USB) interface device, etc.

Examples of the host system 130 include a computer, e.g., a desktop, a laptop, a tablet, etc. As an illustration, the host system 130 includes a processor and the storage HU 162. As used herein, a processor may be a central processing unit (CPU), a microprocessor, an application specific integrated circuit (ASIC), a programmable logic device (PLD), etc. Examples of the storage HU include a read-only memory (ROM), a random access memory (RAM), or a combination thereof. The storage HU may be a flash memory, a redundant array of storage disks (RAID), a hard disk, etc.

The impedance matching model 104 is stored within the storage HU 162. The impedance matching model 104 has similar characteristics, e.g., capacitances, inductances, complex power, complex voltage and currents, etc., as that of the impedance matching circuit 114. For example, the impedance matching model 104 has the same number of capacitors and/or inductors as that within the impedance matching circuit 114, and the capacitors and/or inductors are connected with each other in the same manner, e.g., serial, parallel, etc. as that within the impedance matching circuit 114. To provide an illustration, when the impedance matching circuit 114 includes a capacitor coupled in series with an inductor, the impedance matching model 104 also includes the capacitor coupled in series with the inductor.

As an example, the impedance matching circuit 114 includes one or more electrical components and the impedance matching model 104 includes a design, e.g., a computer-generated model, of the impedance matching circuit 114. The computer-generated model may be generated by a processor based upon input signals received from a user via an input hardware unit. The input signals include signals regarding which electrical components, e.g., capacitors, inductors, etc., to include in a model and a manner, e.g., series, parallel, etc., of coupling the electrical components with each other. As another example, the impedance circuit 114 includes hardware electrical components and hardware connections between the electrical components and the impedance matching model 104 include software representations of the hardware electrical components and of the hardware connections. As yet another example, the impedance matching model 104 is designed using a software program and the impedance matching circuit 114 is made on a printed circuit board. As used herein, electrical components may include resistors, capacitors, inductors, connections between the resistors, connections between the inductors, connections between the capacitors, and/or connections between a combination of the resistors, inductors, and capacitors.

Similarly, a cable model 163 and the cable 150 have similar characteristics, and a cable model 165 and the cable 152 has similar characteristics. As an example, an inductance of the cable model 163 is the same as an inductance of the cable 150. As another example, the cable model 163 is a computer-generated model of the cable 150 and the cable model 165 is a computer-generated model of the cable 152.

Similarly, an RF transmission model 161 and the RF transmission line 113 have similar characteristics. For example, the RF transmission model 161 has the same number of resistors, capacitors and/or inductors as that within the RF transmission line 113, and the resistors, capacitors and/or inductors are connected with each other in the same manner, e.g., serial, parallel, etc. as that within the RF transmission line 113. To further illustrate, when the RF transmission line 113 includes a capacitor coupled in parallel with an inductor, the RF transmission model 161 also includes the capacitor coupled in parallel with the inductor. As yet another example, the RF transmission line 113 includes one or more electrical components and the RF transmission model 161 includes a design, e.g., a computer-generated model, of the RF transmission line 113.

In some embodiments, the RF transmission model 161 is a computer-generated impedance transformation involving computation of characteristics, e.g., capacitances, resistances, inductances, a combination thereof, etc., of elements, e.g., capacitors, inductors, resistors, a combination thereof, etc., and determination of connections, e.g., series, parallel, etc., between the elements.

Based on the complex voltage and current received from the voltage and current probe 110 via the cable 191 and characteristics, e.g., capacitances, inductances, etc., of elements, e.g., inductors, capacitors, etc., within the impedance matching model 104, the processor of the host system 130 calculates a complex voltage and current V, I, and $\phi$, e.g., a second complex voltage and current, at the output, e.g., the model node N4$m$, of the impedance matching model 104. The complex voltage and current at the model node N4$m$ is stored in the storage HU 162 and/or another storage HU, e.g., a compact disc, a flash memory, etc., of the host system 130. The complex V, I, and $\phi$ includes a voltage magnitude V, a current magnitude I, and a phase p between the voltage and current.

The output of the impedance matching model 104 is coupled to an input of the RF transmission model 161, which is stored in the storage hardware unit 162. The impedance matching model 104 also has an input, e.g., a node N3$m$, which is used to receive the complex voltage and current measured at the node N3.

The RF transmission model 161 includes the portion 173, another portion 197, and an output N2$m$, which is coupled via the ESC model 125 to the model node N6$m$. The ESC model 125 is a model of the ESC 177. For example, the ESC model 125 has similar characteristics as that of the ESC 177. For example, the ESC model 125 has the same inductance, capacitance, resistance, or a combination thereof as that of the ESC 177.

An input of the portion 173 is the input of the RF transmission model 161. An output of the portion 173 is coupled to an input of the portion 197. The portion 172 has similar characteristics as that of the portion 169 and the portion 197 has similar characteristics as that of the portion 195.

Based on the complex voltage and current measured at the model node N4$m$, the processor of the host system 130 calculates a complex voltage and current V, I, and $\phi$, e.g., a third complex voltage and current, at the output, e.g., the model node N1$m$, of the portion 173 of the RF transmission model 161. The complex voltage and current determined at the model node N1$m$ is stored in the storage HU 162 and/or another storage HU, e.g., a compact disc, a flash memory, etc., of the host system 130.

In several embodiments, instead of or in addition to determining the third complex voltage and current, the processor of the host system 130 computes a complex voltage and current, e.g., an intermediate complex voltage and current V, I, and $\phi$, at a point, e.g., a node, etc., within the portion 173 based on the complex voltage and current at the output of the impedance matching model 104 and characteristics of elements between the input of the RF transmission model 161 and the point within the portion 173.

In various embodiments, instead of or in addition to determining the third complex voltage and current, the processor of the host system 130 computes a complex voltage and current, e.g., an intermediate complex voltage and current V, I, and $\phi$, at a point, e.g., a node, etc., within the portion 197 based on the complex voltage and current at the output of the impedance matching model 104 and characteristics of elements between the input of the RF transmission model 161 and the point within the portion 197.

It should be noted that in some embodiments, the complex voltage and current at the output of the impedance matching model 104 is calculated based on the complex voltage and current at the output of the x MHz RF generator, characteristics of elements the cable model 163, and characteristics of the impedance matching model 104.

It should further be noted that although two generators are shown coupled to the impedance matching circuit 114, in one embodiment, any number of RF generators, e.g., a single generator, three generators, etc., are coupled to the plasma chamber 175 via an impedance matching circuit. For example, a 2 MHz generator, a 27 MHz generator, and a 60 MHz generator may be coupled to the plasma chamber 175 via an impedance matching circuit. For example, although the above-described embodiments are described with respect to using complex voltage and current measured at the node N3, in various embodiments, the above-described embodiments may also use the complex voltage and current measured at the node N5.

Figure 2:
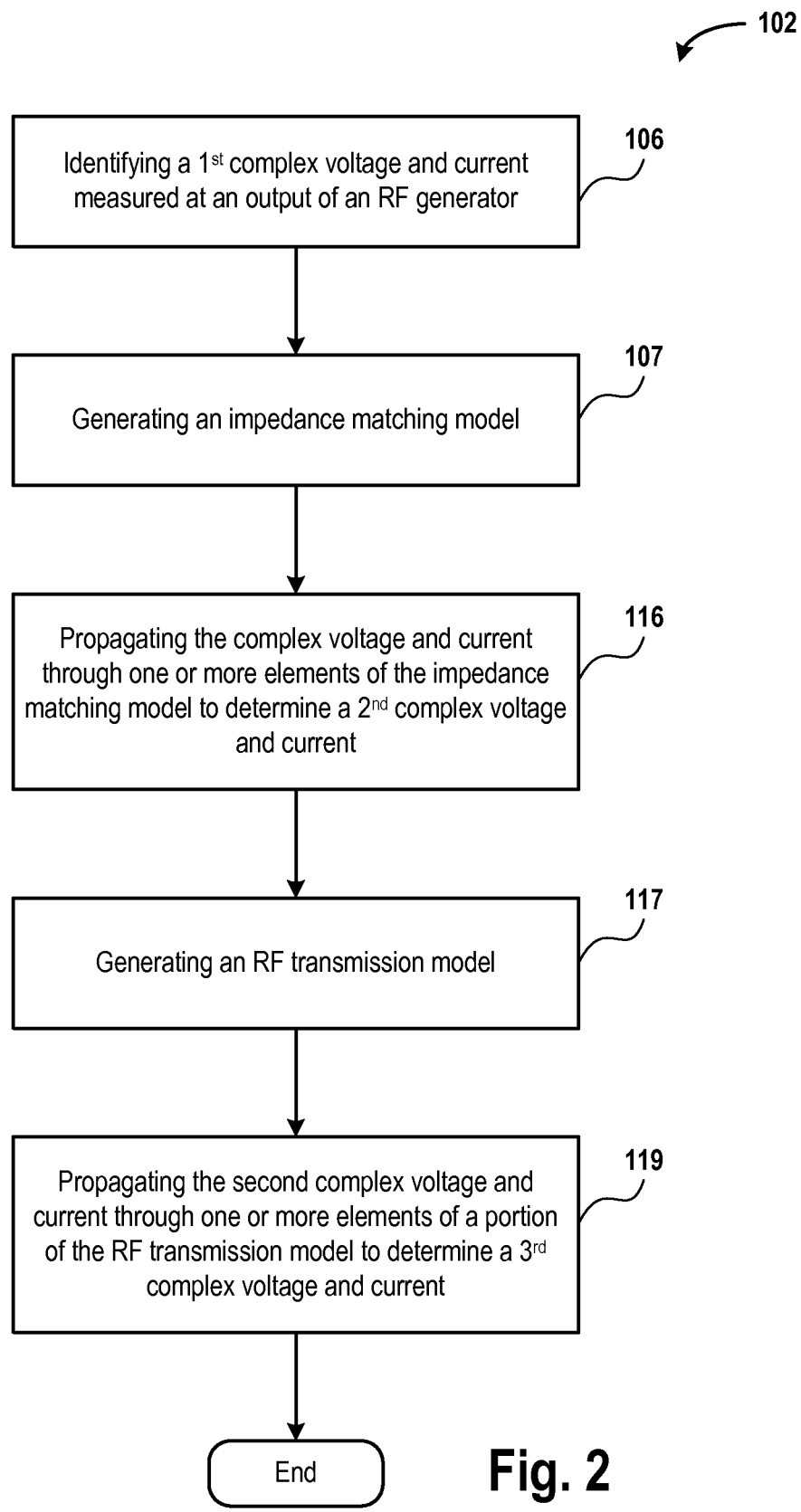
FIG. 2 is a flowchart of a method for determining a complex voltage and current at the output of the RF transmission model portion, in accordance with an embodiment described in the present disclosure.

FIG. 2 is a flowchart of an embodiment of a method 102 for determining the complex voltage and current at the output of the RF transmission model portion 173 (FIG. 1). The method 102 is executed by the processor of the host system 130 (FIG. 1). In an operation 106, the complex voltage and current, e.g., the first complex voltage and current, measured at the node N3 is identified from within the storage HU 162 (FIG. 1). For example, it is determined that the first complex voltage and current is received from the voltage and current probe 110 (FIG. 1). As another example, based on an identity, of the voltage and current probe 110, stored within the storage HU 162 (FIG. 1), it is determined that the first complex voltage and current is associated with the identity.

Furthermore, in an operation 107, the impedance matching model 104 (FIG. 1) is generated based on electrical components of the impedance matching circuit 114 (FIG. 1). For example, connections between electrical components of the impedance matching circuit 114 and characteristics of the electrical components are provided to the processor of the host system 130 by the user via an input hardware unit that is coupled with the host system 130. Upon receiving the connections and the characteristics, the processor generates elements that have the same characteristics as that of electrical components of the impedance matching circuit 114 and generates connections between the elements that have the same connections as that between the electrical components.

The input, e.g., the node N3$m$, of the impedance matching model 163 receives the first complex voltage and current.

For example, the processor of the host system 130 accesses, e.g., reads, etc., from the storage HU 162 the first complex voltage and current and provides the first complex voltage and current to the input of the impedance matching model 104 to process the first complex voltage and current.

In an operation 116, the first complex voltage and current is propagated through one or more elements of the impedance matching model 104 (FIG. 1) from the input, e.g., the node N3m (FIG. 1), of the impedance matching model 104 to the output, e.g., the node N4m (FIG. 1), of the impedance matching model 104 to determine the second complex voltage and current, which is at the output of the impedance matching model 104. For example, with reference to FIG. 3B, when the 2 MHz RF generator is on, e.g., operational, powered on, coupled to the devices, such as, for example, the impedance matching circuit 104, of the plasma system 126, etc., a complex voltage and current $V \times 1$, $I \times 1$, and $\phi \times 1$, e.g., an intermediate complex voltage and current, which includes the voltage magnitude $V \times 1$, the current magnitude $I \times 1$, and the phase $\phi \times 1$ between the complex voltage and current, at a node 251, e.g., an intermediate node, is determined based on a capacitance of a capacitor 253, based on a capacitance of a capacitor C5, and based on the first complex voltage and current that is received at an input 255. Moreover, a complex voltage and current $V \times 2$, $I \times 2$, and $\phi \times 2$ at a node 257 is determined based on the complex voltage and current $V \times 1$, $I \times 1$, and $\phi \times 1$, and based on an inductance of an inductor L3. The complex voltage and current $V \times 2$, $I \times 2$, and $\phi \times 2$ includes the voltage magnitude $V \times 2$, the current magnitude $I \times 2$, and the phase $\phi \times 2$ between the voltage and current. When the 27 MHz RF generator and the 60 MHz RF generator are off, e.g., nonoperational, powered off, decoupled from the impedance matching circuit 104, etc., a complex voltage and current V2, I2, and $\phi 2$ is determined to be the second complex voltage and current at an output 259, which is an example of the output, e.g., the model node N4m (FIG. 1), of the impedance matching model 104 (FIG. 1). The complex voltage and current V2, I2, and $\phi 2$ is determined based on the complex voltage and current $V \times 2$, $I \times 2$, and $\phi \times 2$ and an inductor of an inductor L2. The complex voltage and current V2, I2, and $\phi 2$ includes the voltage magnitude V2, the current magnitude I2, and the phase $\phi 2$ between the voltage and current.

Similarly, when 27 MHz RF generator is on and the 2 MHz and the 60 MHz RF generators are off, a complex voltage and current V27, I27, and $\phi 27$ at the output 259 is determined based on a complex voltage and current received at a node 261 and characteristics of an inductor LPF2, a capacitor C3, a capacitor C4, and an inductor L2. The complex voltage and current V27, I27, and $\phi 27$ includes the voltage magnitude V27, the current magnitude I27, and the phase $\phi 27$ between the voltage and current. The complex voltage and current received at the node 261 is the same as the complex voltage and current measured at the node N5 (FIG. 1). When both the 2 MHz and 27 MHz RF generators are on and the 60 MHz RF generator is off, the complex voltages and currents V2, I2, $\phi 2$, V27, I27, and $\phi 27$ are an example of the second complex voltage and current. Moreover, similarly, when the 60 MHz RF generator is on and the 2 and 27 MHz RF generators are off, a complex voltage and current V60, I60, and $\phi 60$ at the output 259 is determined based on a complex voltage and current received at a node 265 and characteristics of an inductor LPF1, a capacitor C1, a capacitor C2, an inductor L4, a capacitor 269, and an inductor L1. The complex voltage and current V60, I60, and $\phi 60$ includes the voltage magnitude V60, the current magnitude I60, and the phase $\phi 60$ between the voltage and current. When the 2 MHz, 27 MHz, and the 60 MHz RF generators are on, the complex voltages and currents V2, I2, $\phi 2$, V27, I27, $\phi 27$, V60, I60, and $\phi 60$ are an example of the second complex voltage and current.

In an operation 117, the RF transmission model 161 (FIG. 1) is generated based on the electrical components of the RF transmission line 113 (FIG. 1). For example, connections between electrical components of the RF transmission line 113 and characteristics of the electrical components are provided to the processor of the host system 130 by the user via an input device that is coupled with the host system 130. Upon receiving the connections and the characteristics, the processor generates elements that have the same characteristics as that of electrical components of the RF transmission line 113 and generates connections between the elements that are the same as that between the electrical components.

In an operation 119, the second complex voltage and current is propagated through one or more elements of the RF transmission model portion 173 from the input of the RF transmission model 113 to the output, e.g., the model node N1m (FIG. 1), of the RF transmission model portion 173 to determine the third complex voltage and current at the output of the RF transmission model portion 173. For example, with reference to FIG. 5B, when the 2 MHz RF generator is on and the 27 and 60 MHz RF generators are off, a complex voltage and current $V \times 4$, $I \times 4$, and $\phi \times 4$, e.g., an intermediate complex voltage and current, at a node 293, e.g., an intermediate node, is determined based on an inductance of an inductor Ltunnel, based on a capacitance of a capacitor Ctunnel, and based on the complex voltage and current V2, I2, and $\phi 2$ (FIG. 3B), which is an example of the second complex voltage and current. It should be noted that Ltunnel is an inductance of a computer-generated model of an RF tunnel and Ctunnel is a capacitance of the RF tunnel model. Moreover, a complex voltage and current V21, I21, and $\phi 21$ at an output 297 of a tunnel and strap model 210 is determined based on the complex voltage and current $V \times 4$, $I \times 4$, and $\phi \times 4$, and based on an inductance of an inductor Lstrap. The output 297 is an example of the output, e.g., the model node N1m (FIG. 1), of the portion 173 (FIG. 1). It should be noted that Lstrap is an inductance of a computer-generated model of the RF strap. When the 2 MHz RF generator is on and the 27 and 60 MHz RF generators are off, the complex voltage and current V21, I21, and $\phi 21$ is determined to be the third complex voltage and current at the output 297.

Similarly, when the 27 MHz RF generator is on and the 2 and 60 MHz RF generators are off, a complex voltage and current V271, I271, and $\phi 271$ at the output 297 is determined based on the complex voltage and current V27, I27, $\phi 27$ (FIG. 3B) at the output 259 and characteristics of the inductor Ltunnel, the capacitor Ctunnel, and the inductor Lstrap. When both the 2 MHz and 27 MHz RF generators are on and the 60 MHz RF generator is off, the complex voltages and currents V21, I21, $\phi 21$, V271, I271, and $\phi 271$ are an example of the third complex voltage and current.

Moreover, similarly, when the 60 MHz RF generator is powered on and the 2 and 27 MHz RF generators are powered off, a complex voltage and current V601, I601, and $\phi 601$ at the output 297 is determined based on the complex voltage and current V60, I60, and $\phi 60$ (FIG. 3B) received at a node 259 and characteristics of the inductor Ltunnel, the capacitor Ctunnel, and the inductor Lstrap. When the 2 MHz, 27 MHz, and the 60 MHz RF generators are on, the complex voltages and currents V21, I21, $\phi 21$, V271, I271, φ271, V601, I601, and φ601 are an example of the third complex voltage and current. The method 102 ends after the operation 119.

Figure 3A:
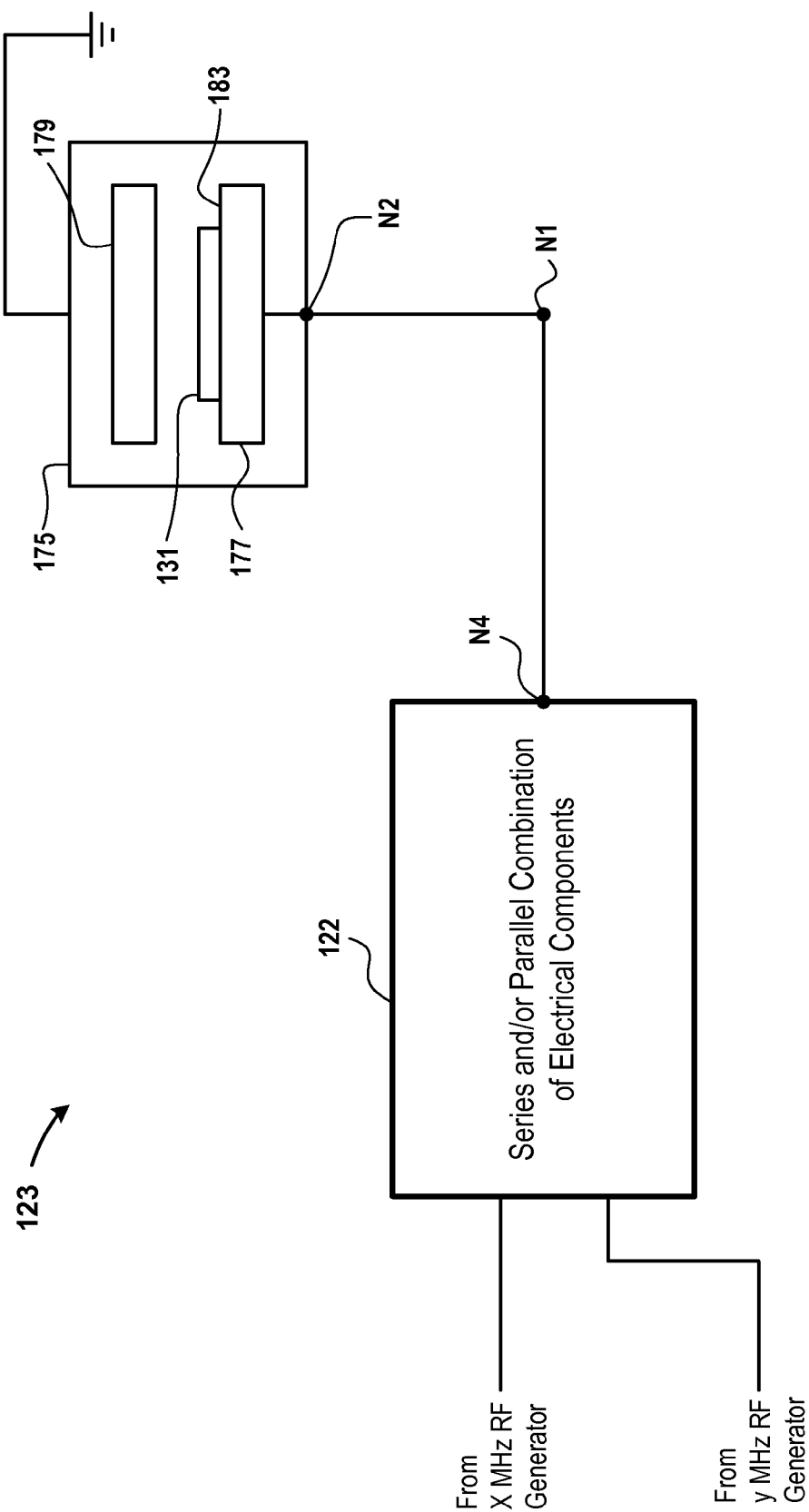
FIG. 3A is a block diagram of a system used to illustrate an impedance matching circuit, in accordance with an embodiment described in the present disclosure.

FIG. 3A is a block diagram of an embodiment of a system 123 used to illustrate an impedance matching circuit 122. The impedance matching circuit 122 is an example of the impedance matching circuit 114 (FIG. 1). The impedance matching circuit 122 includes series connections between electrical components and/or parallel connections between electrical components.

FIG. 3B is a circuit diagram of an embodiment of an impedance matching model 172. The impedance matching model 172 is an example of the impedance matching model 104 (FIG. 1). As shown, the impedance matching model 172 includes capacitors having capacitances C1 thru C9, inductors having inductances LPF1, LPF2, and L1 thru L4. It should be noted that the manner in which the inductors and/or capacitors are coupled with each other in FIG. 3B is an example. For example, the inductors and/or capacitors shown in FIG. 3B can be coupled in a series and/or parallel manner with each other. Also, in some embodiments, the impedance matching model 172 includes a different number of capacitors and/or a different number of inductors than that shown in FIG. 3B.

Figure 4:
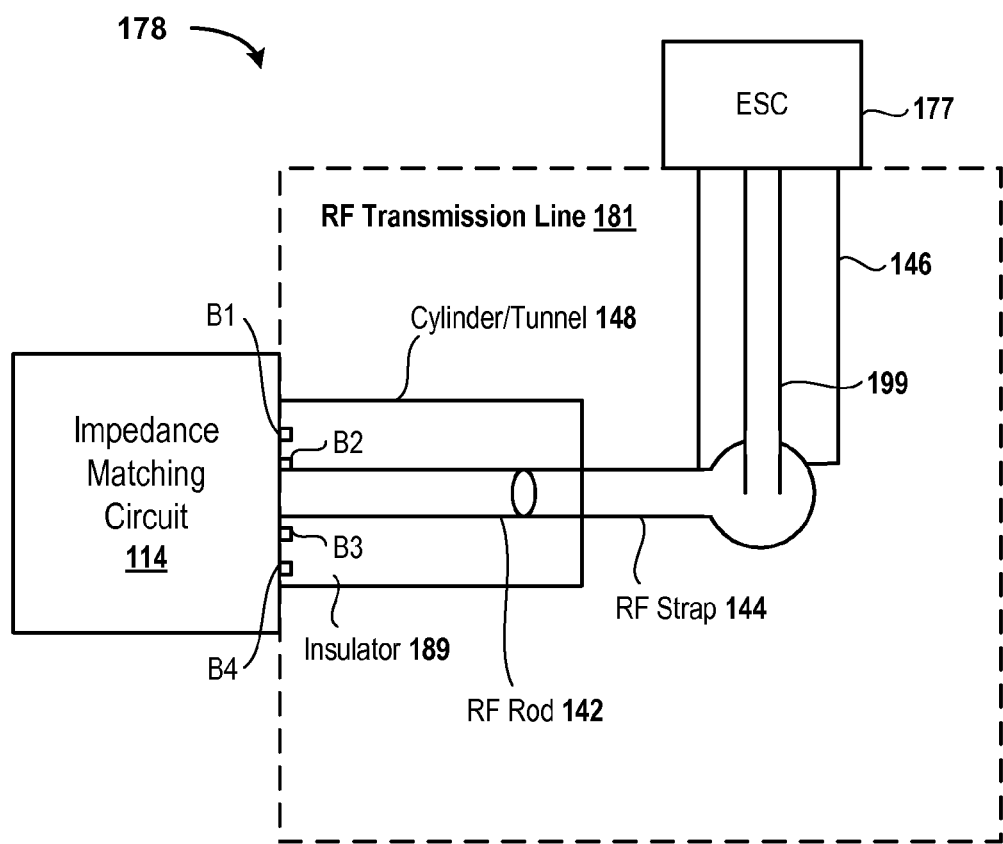
FIG. 4 is a diagram of a system used to illustrate an RF transmission line, in accordance with an embodiment described in the present disclosure.

FIG. 4 is a diagram of an embodiment of a system 178 used to illustrate an RF transmission line 181, which is an example of the RF transmission line 113 (FIG. 1). The RF transmission line 181 includes a cylinder 148, e.g., a tunnel. Within a hollow of the cylinder 148 lies an insulator 189 and an RF rod 142. A combination of the cylinder 148 and the RF rod 142 is an example of the portion 169 (FIG. 1) of the RF transmission line 113 (FIG. 1). The RF transmission line 181 is bolted via bolts B1, B2, B3, and B4 with the impedance matching circuit 114. In one embodiment, the RF transmission line 181 is bolted via any number of bolts with the impedance matching circuit 114. In some embodiments, instead of or in addition to bolts, any other form of attachment, e.g., glue, screws, etc., is used to attach the RF transmission line 181 to the impedance matching circuit 114.

The RF transmission rod 142 is coupled with the output of the impedance matching circuit 114. Also, an RF strap 144, also known as RF spoon, is coupled with the RF rod 142 and with an RF rod 199, a portion of which is located within a support 146, e.g., a cylinder. The support 146 that includes the RF rod 199 is an example of the portion 195 (FIG. 1). In an embodiment, a combination of the cylinder 148, the RF rod 142, the RF strap 144, the support 146 and the RF rod 199 forms the RF transmission line 181, which is an example of the RF transmission line 113 (FIG. 1). The support 146 provides support to the plasma chamber. The support 146 is attached to the ESC 177 of the plasma chamber. An RF signal is supplied from the x MHz generator via the cable 150, the impedance matching circuit 114, the RF rod 142, the RF strap 144, and the RF rod 199 to the ESC 177.

In one embodiment, the ESC 177 includes a heating element and an electrode on top of the heating element. In an embodiment, the ESC 177 includes a heating element and the lower electrode. In one embodiment, the ESC 177 includes the lower electrode and a heating element, e.g., coil wire, etc., embedded within holes formed within the lower electrode. In some embodiments, the electrode is made of a metal, e.g., aluminum, copper, etc. It should be noted that the RF transmission line 181 supplies an RF signal to the lower electrode of the ESC 177.

Figure 5A:
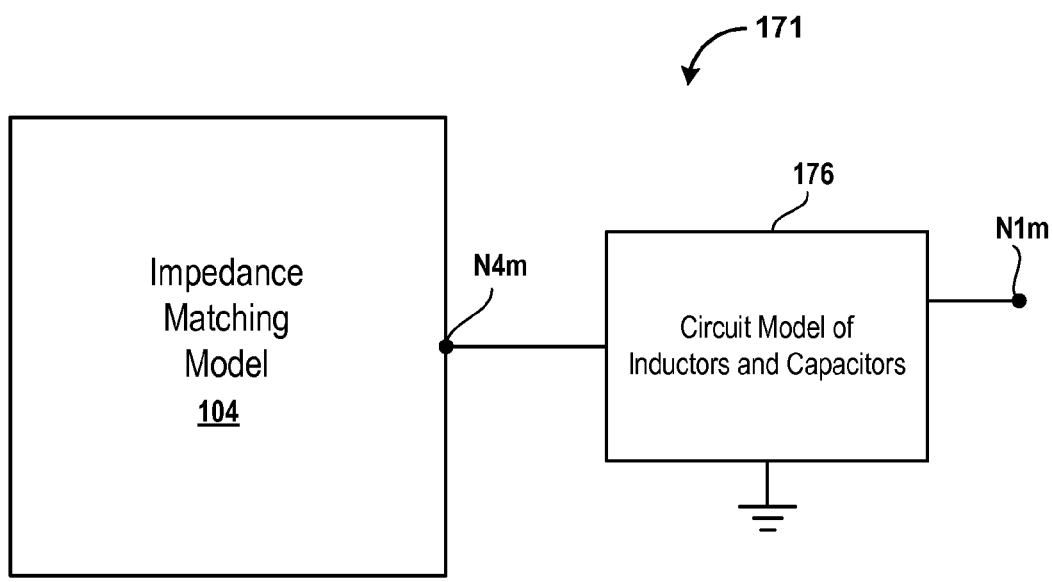
FIG. 5A is a block diagram of a system used to illustrate a circuit model of the RF transmission line, in accordance with an embodiment described in the present disclosure.

FIG. 5A is a block diagram of an embodiment of a system 171 used to illustrate a circuit model 176 of the RF transmission line 113 (FIG. 1). For example, the circuit model 176 includes inductors and/or capacitors, connections between the inductors, connections between the capacitors, and/or connections between the inductors and the capacitors. Examples of connections include series and/or parallel connections. The circuit model 176 is an example of the RF transmission model 161 (FIG. 1).

Figure 5B:
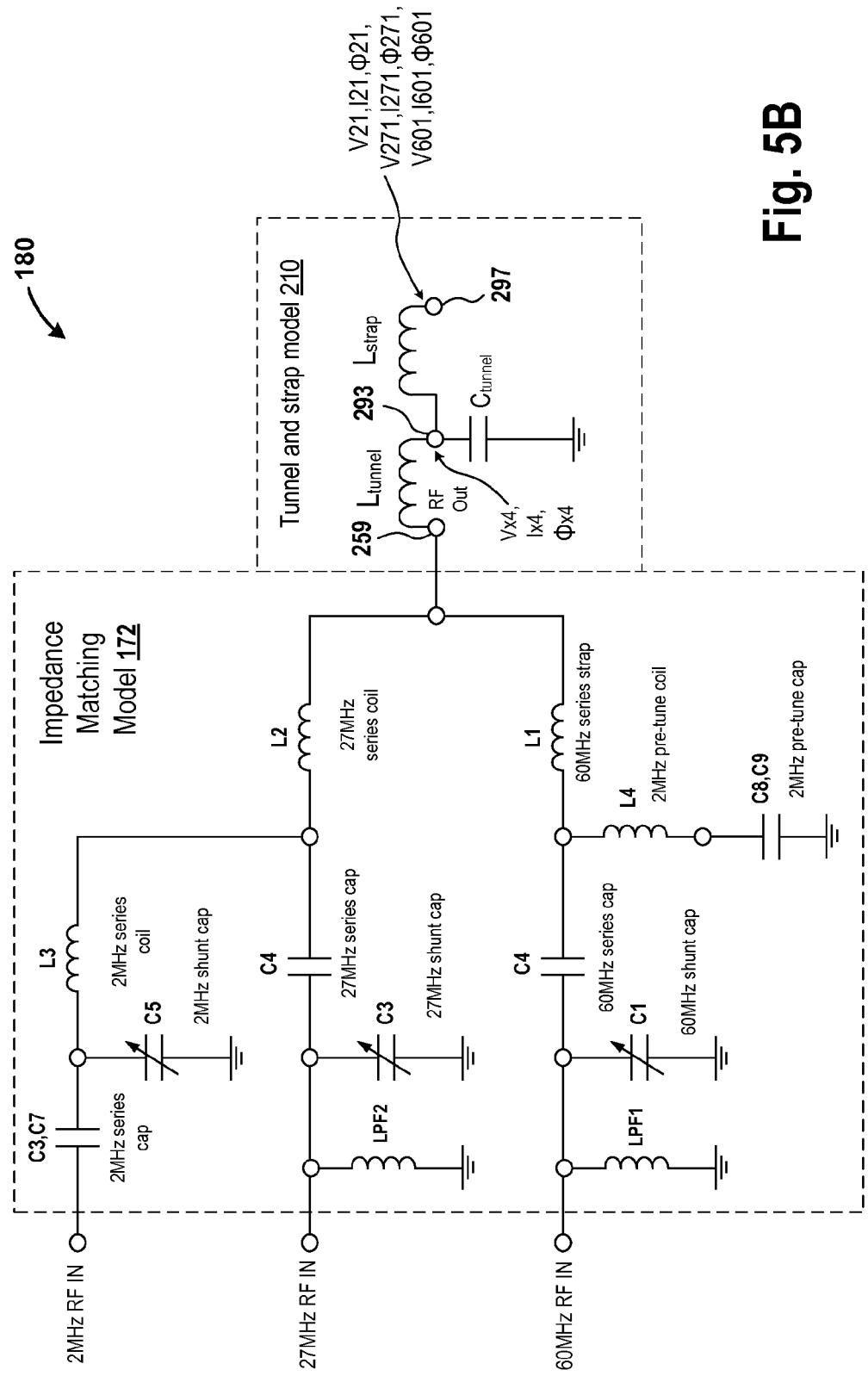
FIG. 5B is a diagram of an electrical circuit used to illustrate a tunnel and strap model of the RF transmission model, in accordance with an embodiment described in the present disclosure.

FIG. 5B is a diagram of an embodiment of an electrical circuit 180 used to illustrate the tunnel and strap model 210, which is an example of the portion 173 (FIG. 1) of the RF transmission model 161 (FIG. 1). The electrical circuit 180 includes the impedance matching model 172 and the tunnel and strap model 210. The tunnel and strap model 210 includes inductors Ltunnel and Lstrap and a capacitor Ctunnel. It should be noted that the inductor Ltunnel represents an inductance of the cylinder 148 (FIG. 4) and the RF rod 142 and the capacitor Ctunnel represents a capacitance of the cylinder 148 and the RF rod 142. Moreover, the inductor Lstrap represents an inductance of the RF strap 144 (FIG. 4).

In an embodiment, the tunnel and strap model 210 includes any number of inductors and/or any number of capacitors. In this embodiment, the tunnel and strap model 210 includes any manner, e.g., serial, parallel, etc. of coupling a capacitor to another capacitor, coupling a capacitor to an inductor, and/or coupling an inductor to another inductor.

Figure 5C:
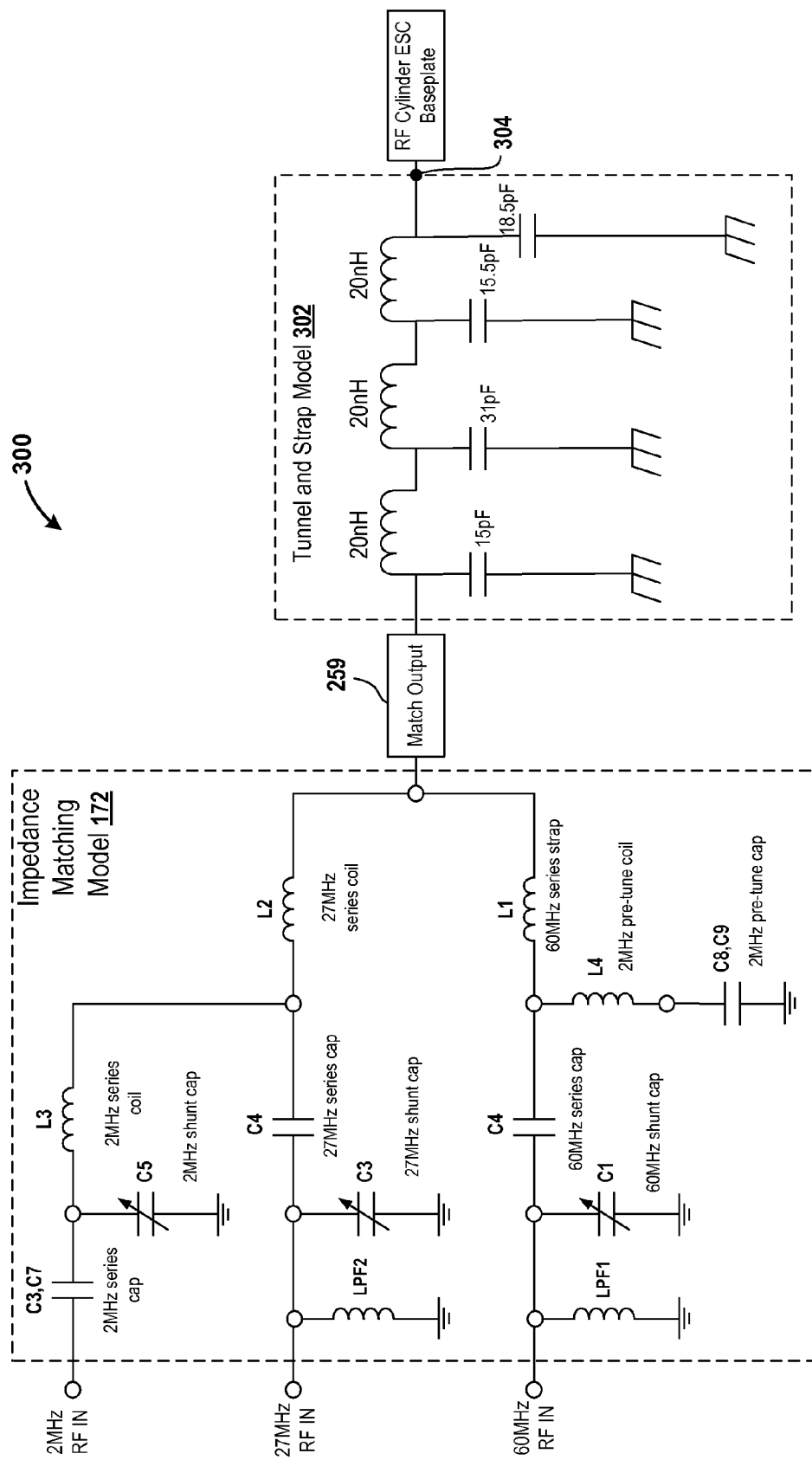
FIG. 5C is a diagram of an electrical circuit used to illustrate a tunnel and strap model, in accordance with an embodiment described in the present disclosure.

FIG. 5C is a diagram of an embodiment of an electrical circuit 300 used to illustrate a tunnel and strap model 302, which is an example of the portion 173 (FIG. 1) of the RF transmission model 161 (FIG. 1). The tunnel and strap model 302 is coupled via the output 259 to the impedance matching model 172. The tunnel and strap model 302 includes inductors having inductances 20 nanoHenry (nH) and capacitors having capacitances of 15 picoFarads (pF), 31 pF, 15.5 pF, and 18.5 pF. The tunnel and strap model 302 is coupled via a node 304 to an RF cylinder, which is coupled to the ESC 177 (FIG. 1). The RF cylinder is an example of the portion 195 (FIG. 1).

It should be noted that in some embodiments, the inductors and capacitors of the tunnel and strap model 302 have other values. For example, the 20 nH inductors have an inductance ranging between 15 and 20 nH or between 20 and 25 nH. As another example, two or more of the inductors of the tunnel and strap model 302 have difference inductances. As yet another example, the 15 pF capacitor has a capacitance ranging between 8 pF and 25 pF, the 31 pF capacitor has a capacitance ranging between 15 pF and 45 pF, the 15.5 pF capacitor has a capacitance ranging between 9 pF and 20 pF, and the 18.5 pF capacitor has a capacitance ranging between 10 pF and 27 pF.

In various embodiments, any number of inductors are included in the tunnel and strap model 302 and any number of capacitors are included in the tunnel and strap model 302.

Figure 6:
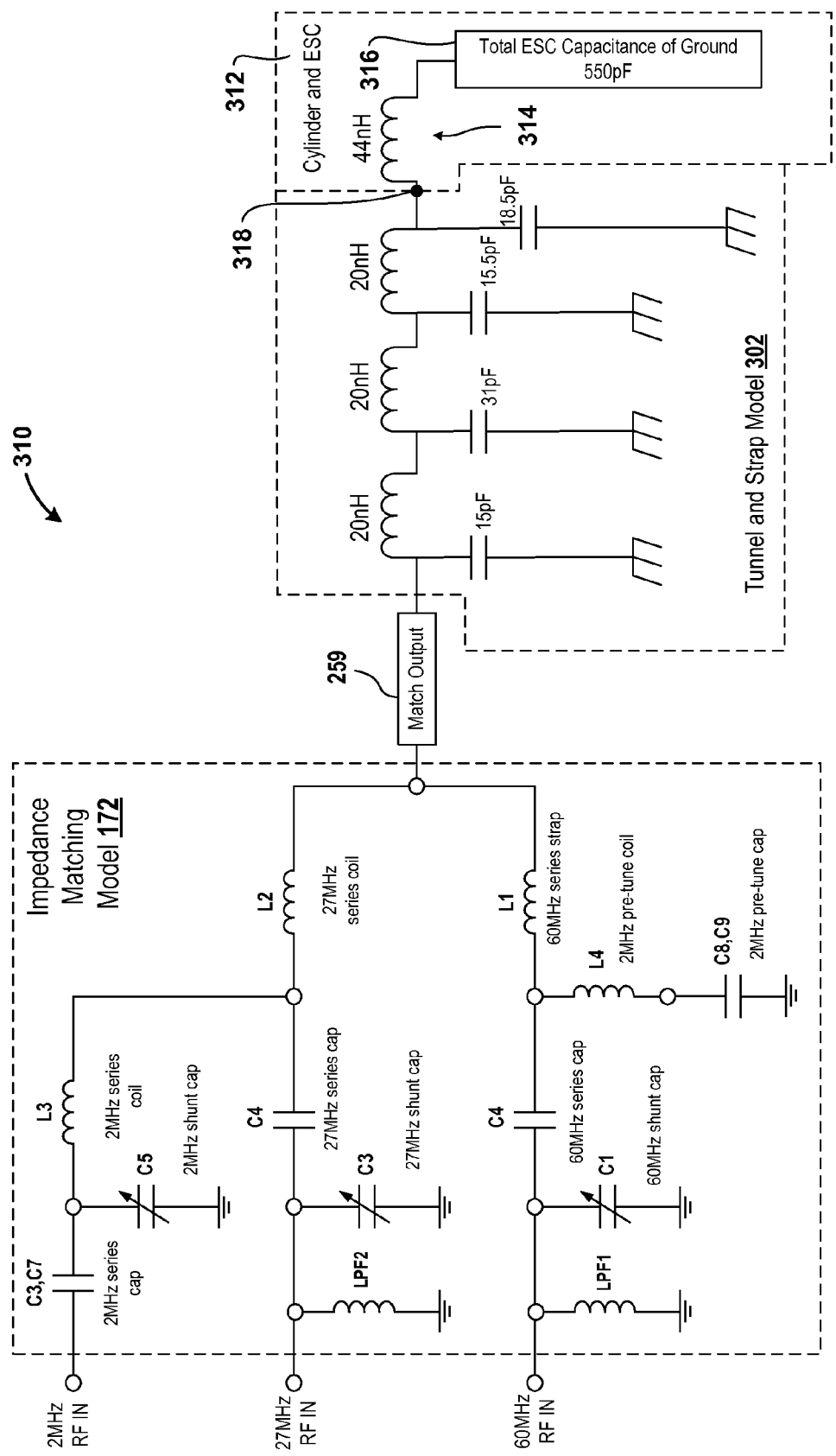
FIG. 6 is a diagram of an electrical circuit used to illustrate a cylinder and ESC model, in accordance with an embodiment described in the present disclosure.

FIG. 6 is a diagram of an embodiment of an electrical circuit 310 used to illustrate a cylinder and ESC model 312, which is a combination of an inductor 313 and a capacitor 316. The cylinder and ESC model 312 includes a cylinder model and an ESC model, which is an example of the ESC model 125 (FIG. 1). The cylinder model is an example of the portion 197 (FIG. 1) of the RF transmission model 161 (FIG. 1). The cylinder and ESC model 312 has similar characteristics as that of a combination of the portion 195 and the ESC 177 (FIG. 1). For example, the cylinder and ESC model 312 has the same resistance as that of a combination of the portion 195 and the ESC 177. As another example, the cylinder and ESC model 312 has the same inductance as that of a combination of the portion 195 and the ESC 177. As yet another example, the cylinder and ESC model 312 has the same capacitance as that of a combination of the portion 195 and the ESC 177. As yet another example, the cylinder and ESC model 312 has the same inductance, resistance, capacitance, or a combination thereof, as that of a combination of the portion 195 and the ESC 177.

The cylinder and ESC model 312 is coupled via a node 318 to the tunnel and strap model 302. The node 318 is an example of the model node N1$m$ (FIG. 1).

It should be noted that in some embodiments, an inductor having an inductance other than the 44 milliHenry (mH) is used in the cylinder and ESC model 312. For example, an inductor having an inductance ranging from 35 mH to 43.9 mH or from 45.1 mH too 55 mH is used. In various embodiments, a capacitor having a capacitance other than 550 pF is used. For example, instead of the 550 pF capacitor, a capacitor having a capacitance ranging between 250 and 550 pF or between 550 and 600 pF is used.

The processor of the host system 130 (FIG. 1) calculates a combined impedance, e.g., total impedance, etc., of a combination of the model 172, the tunnel and strap model 302, and the cylinder and ESC model 312. The combined impedance and complex voltage and current determined at the model node 318 are used as inputs by the processor of the host system 130 to calculate a complex voltage and impedance at the node N6$m$. It should be noted that an output of the cylinder and ESC model 312 is the model node N6$m$.

Figure 7:
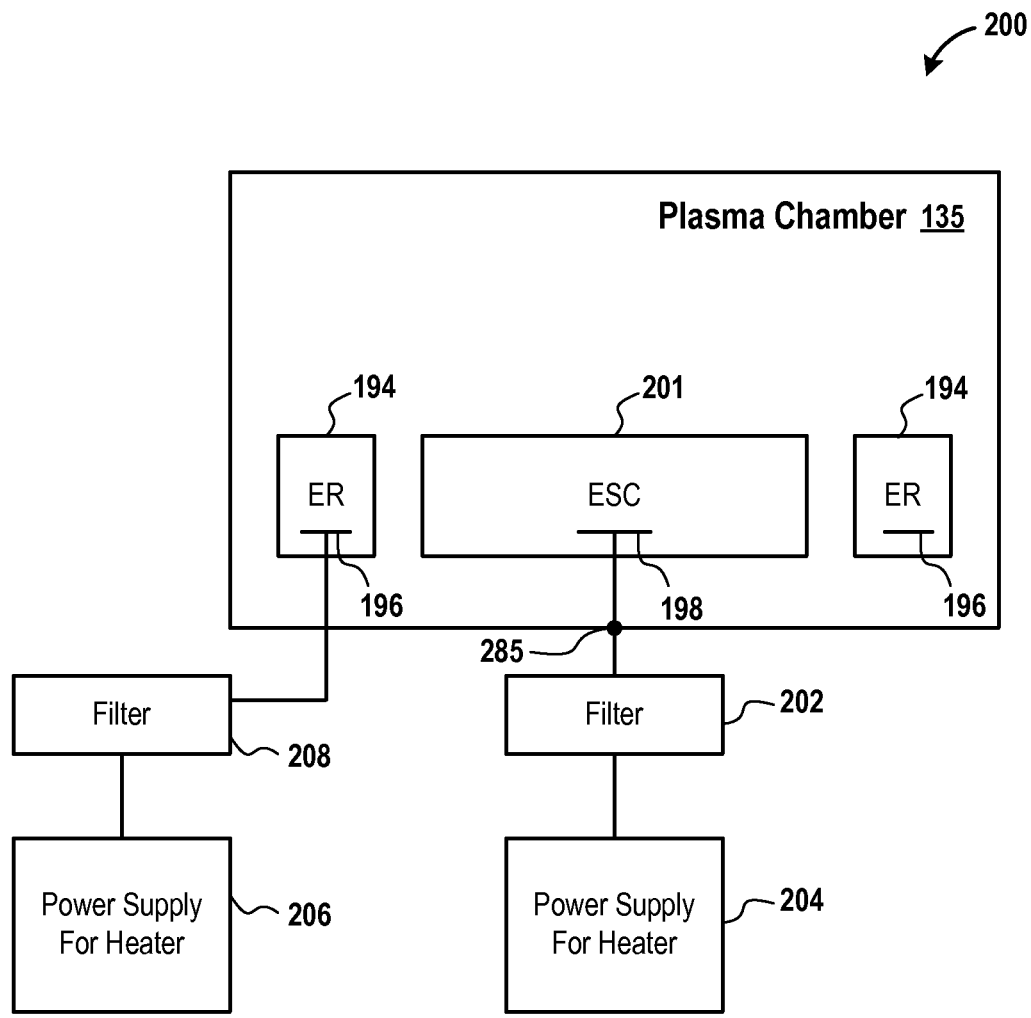
FIG. 7 is a block diagram of a plasma system that includes filters used to determine the variable, in accordance with an embodiment described in the present disclosure.

FIG. 7 is a block diagram of an embodiment of a system 200 that is used to determine a variable. The system 200 includes a plasma chamber 135, which further includes an ESC 201 and has an input 285. The plasma chamber 135 is an example of the plasma chamber 175 (FIG. 1) and the ESC 201 is an example of the ESC 177 (FIG. 1). The ESC 201 includes a heating element 198. Also, the ESC 201 is surrounded by an edge ring (ER) 194. The ER 194 includes a heating element 196. In an embodiment, the ER 194 facilitates a uniform etch rate and reduced etch rate drift near an edge of the workpiece 131 that is supported by the ESC 201.

A power supply 206 provides power to the heating element 196 via a filter 208 to heat the heating element 196 and a power supply 204 provides power to the heating element 198 via a filter 202 to heat the heating element 198. In an embodiment, a single power supply provides power to both the heating elements 196 and 198. The filter 208 filters out predetermined frequencies of a power signal that is received from the power supply 206 and the filter 202 filters out predetermined frequencies of a power signal that is received from the power supply 204.

The heating element 198 is heated by the power signal received from the power supply 204 to maintain an electrode of the ESC 198 at a desirable temperature to further maintain an environment within the plasma chamber 135 at a desirable temperature. Moreover, the heating element 196 is heated by the power signal received from the power supply 206 to maintain the ER 194 at a desirable temperature to further maintain an environment within the plasma chamber 135 at a desirable temperature.

It should be noted that in an embodiment, the ER 194 and the ESC 201 include any number of heating elements and any type of heating elements. For example, the ESC 201 includes an inductive heating element or a metal plate. In one embodiment, each of the ESC 201 and the ER 194 includes one or more cooling elements, e.g., one or more tubes that allow passage of cold water, etc., to maintain the plasma chamber 135 at a desirable temperature.

It should further be noted that in one embodiment, the system 200 includes any number of filters. For example, the power supplies 204 and 206 are coupled to the ESC 201 and the ER 194 via a single filter.

Figure 8A:
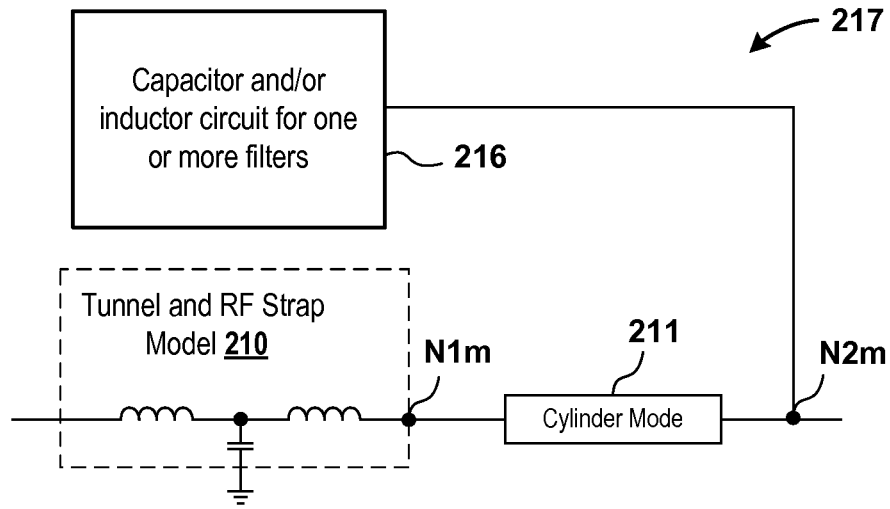
FIG. 8A is a diagram of a system used to illustrate a model of the filters to improve an accuracy of the variable, in accordance with an embodiment described in the present disclosure.

FIG. 8A is a diagram of an embodiment of a system 217 used to illustrate a model of the filters 202 and 208 (FIG. 7) to improve an accuracy of the variable. The system 217 includes the tunnel and strap model 210 that is coupled via a cylinder model 211 to a model 216, which includes capacitors and/or inductors and connections therebetween of the filters 202 and 208. The model 216 is stored within the storage HU 162 (FIG. 1) and/or the other storage HU. The capacitors and/or inductors of the model 216 are coupled with each other in a manner, e.g., a parallel manner, a serial manner, a combination thereof, etc. The model 216 represents capacitances and/or inductances of the filters 202 and 208.

Moreover, the system 217 includes the cylinder model 211, which is a computer-generated model of the RF rod 199 (FIG. 4) and the support 146 (FIG. 4). The cylinder model 211 has similar characteristics as that of electrical components of the RF rod 199 and the support 146. The cylinder model 211 includes one or more capacitors, one or more inductors, connections between the inductors, connections between the capacitors, and/or connections between a combination of the capacitors and inductors.

The processor of the host system 130 (FIG. 1) calculates a combined impedance, e.g., total impedance, etc., of the model 216, the tunnel and strap model 210, and the cylinder model 211. The combined impedance provides a complex voltage and impedance at the node N2$m$. With the inclusion of the model 216 and the tunnel and strap model 214 in determining the variable at the node N2$m$, accuracy of the variable is improved. It should be noted that an output of the model 216 is the model node N2$m$.

Figure 8B:
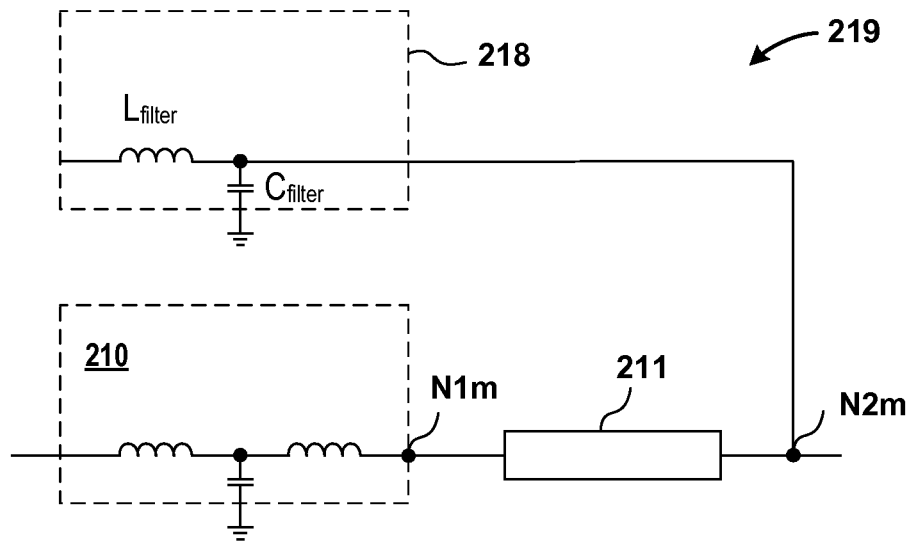
FIG. 8B is a diagram of a system used to illustrate a model of the filters, in accordance with an embodiment described in the present disclosure.

FIG. 8B is a diagram of an embodiment of a system 219 used to illustrate a model of the filters 202 and 208 (FIG. 7) to improve an accuracy of the variable. The system 219 includes the tunnel and strap model 210 and a model 218, which is coupled in parallel to the tunnel and strap model 210. The model 218 is an example of the model 216 (FIG. 8A). The model 218 includes an inductor Lfilter, which represents a combined inductance of the filters 202 and 208. The model 218 further includes a capacitor Cfilter, which represents directed combined capacitance of the filters 202 and 208.

Figure 9:
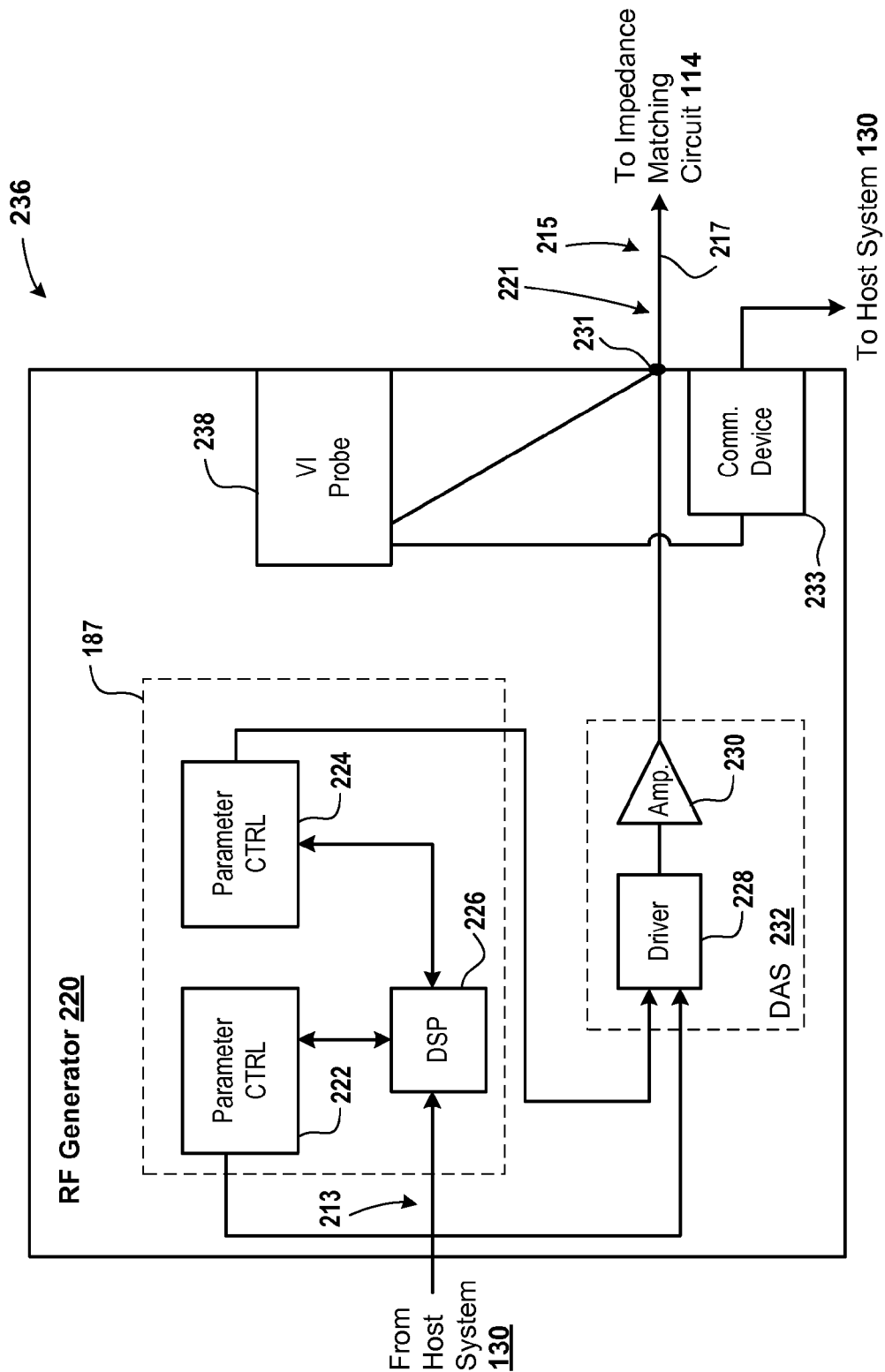
FIG. 9 is a block diagram of a system for using a current and voltage probe to measure the variable at an output of an RF generator of the system of FIG. 1, in accordance with one embodiment described in the present disclosure.

FIG. 9 is a block diagram of an embodiment of a system 236 for using a voltage and current probe 238 to measure a variable at an output 231 of an RF generator 220. The output 231 is an example of the node N3 (FIG. 1) or of the node N5 (FIG. 1). The RF generator 220 is an example of the x MHz generator or the y MHz generator (FIG. 1). The host system 130 generates and provides a digital pulsing signal 213 having two or more states to a digital signal processor (DSP) 226. In one embodiment, the digital pulsing signal 213 is a transistor-transistor logic (TTL) signal. Examples of the states include an on state and an off state, a state having a digital value of 1 and a state having a digital value of 0, a high state and a low state, etc.

In another embodiment, instead of the host system 130, a clock oscillator, e.g., a crystal oscillator, etc., is used to generate an analog clock signal, which is converted by an analog-to-digital converter into a digital signal similar to the digital pulsing signal 213.

The digital pulsing signal 213 is sent to the DSP 226. The DSP 226 receives the digital pulsing signal 213 and identifies the states of the digital pulsing signal 213. For example, the DSP 226 determines that the digital pulsing signal 213 has a first magnitude, e.g., the value of 1, the high state magnitude, etc., during a first set of time periods and has a second magnitude, e.g., the value of 0, the low state magnitude, etc., during a second set of time periods. The DSP 226 determines that the digital pulsing signal 213 has a state 51 during the first set of time periods and has a state S0 during the second set of time periods. Examples of the state S0 include the low state, the state having the value of 0, and the off state. Examples of the state 51 include the high state, the state having the value of 1, and the on state. As yet another example, the DSP 226 compares a magnitude of the digital pulsing signal 213 with a pre-stored value to determine that the magnitude of the digital pulsing signal 213 is greater than the pre-stored value during the first set of time periods and that the magnitude during the state S0 of the digital pulsing signal 213 is not greater than the pre-stored value during the second set of time periods. In the embodiment in which the clock oscillator is used, the DSP 226 receives an analog clock signal from the clock oscillator, converts the analog signal into a digital form, and then identifies the two states S0 and S1.

When a state is identified as S1, the DSP 226 provides a power value P1 and/or a frequency value F1 to a parameter control 222. Moreover, when the state is identified as S0, the DSP 226 provides a power value P0 and/or a frequency value F0 to a parameter control 224. An example of a parameter control that is used to tune a frequency includes an auto frequency tuner (AFT).

It should be noted that the parameter control 222, the parameter control 224, and the DSP 226 are portions of a control system 187. For example, the parameter control 222 and the parameter control 224 are logic blocks, e.g., tuning loops, etc., which are portions of a computer program that is executed by the DSP 226. In some embodiments, the computer program is embodied within a non-transitory computer-readable medium, e.g., a storage HU.

In an embodiment, a controller, e.g., hardware controller, ASIC, PLD, etc., is used instead of a parameter control. For example, a hardware controller is used instead of the parameter control 222 and another hardware controller is used instead of the parameter control 224.

Upon receiving the power value P1 and/or the frequency value F1, the parameter control 222 provides the power value P1 and/or the frequency value F1 to a driver 228 of a drive and amplifier system (DAS) 232. Examples of a driver includes a power driver, a current driver, a voltage driver, a transistor, etc. The driver 228 generates an RF signal having the power value P1 and/or the frequency value F1 and provides the RF signal to an amplifier 230 of the DAS 232.

In one embodiment, the driver 228 generates an RF signal having a drive power value that is a function of the power value P1 and/or having a drive frequency value that is a function of the frequency value F1. For example, the drive power value is within a few watts, e.g. 1 thru 5 watts, etc., of the power value P1 and the drive frequency value is within a few Hz, e.g. 1 thru 5 Hz, etc., of the frequency value F1.

The amplifier 230 amplifies the RF signal having the power value P1 and/or the frequency value F1 and generates an RF signal 215 that corresponds to the RF signal received from the driver 228. For example, the RF signal 215 has a higher amount of power than that of the power value P1. As another example, the RF signal 215 has the same amount of power as that of the power value P1. The RF signal 215 is transferred via a cable 217 and the impedance matching circuit 114 to the ESC 177 (FIG. 1).

The cable 217 is an example of the cable 150 or the cable 152 (FIG. 1). For example, when the RF generator 220 is an example of the x MHz RF generator (FIG. 1), the cable 217 is an example of the cable 150 and when the RF generator 220 is an example of the y MHz RF generator (FIG. 1), the cable 217 is an example of the cable 152.

When the power value P1 and/or the frequency value F1 are provided to the DAS 232 by the parameter control 222 and the RF signal 215 is generated, the voltage and current probe 238 measures values of the variable at the output 231 that is coupled to the cable 217. The voltage and current probe 238 is an example of the voltage and current probe 110 or the voltage and current probe 111 (FIG. 1). The voltage and current probe 238 sends the values of the variable via a communication device 233 to the host system 130 for the host system 130 to execute the method 102 (FIG. 3) and methods 340, 351, and 363 (FIGS. 13, 15, and 17) described herein. The communication device 233 is an example of the communication device 185 or 189 (FIG. 1). The communication device 233 applies a protocol, e.g., Ethernet, EtherCAT, USB, serial, parallel, packetization, depacketization, etc., to transfer data from the voltage and current probe 238 to the host system 130. In various embodiments, the host system 130 includes a communication device that applies the protocol applied by the communication device 233. For example, when the communication 233 applies packetization, the communication device of the host system 130 applies depacketization. As another example, when the communication device 233 applies a serial transfer protocol, the communication device of the host system 130 applies a serial transfer protocol.

Similarly, upon receiving the power value P0 and/or the frequency value F0, the parameter control 224 provides the power value P0 and/or the frequency value F0 to the driver 228. The driver 228 creates an RF signal having the power value P0 and/or the frequency value F0 and provides the RF signal to the amplifier 230.

In one embodiment, the driver 228 generates an RF signal having a drive power value that is a function of the power value P0 and/or having a drive frequency value that is a function of the frequency value F0. For example, the drive power value is within a few, e.g. 1 thru 5, watts of the power value P0 and the drive frequency value is within a few, e.g. 1 thru 5, Hz of the frequency value F0.

The amplifier 230 amplifies the RF signal having the power value P0 and/or the frequency value F0 and generates an RF signal 221 that corresponds to the RF signal received from the driver 228. For example, the RF signal 221 has a higher amount of power than that of the power value P0. As another example, the RF signal 221 has the same amount of power as that of the power value P0. The RF signal 221 is transferred via the cable 217 and the impedance matching circuit 114 to the known load 112 (FIG. 2).

Figure 17:
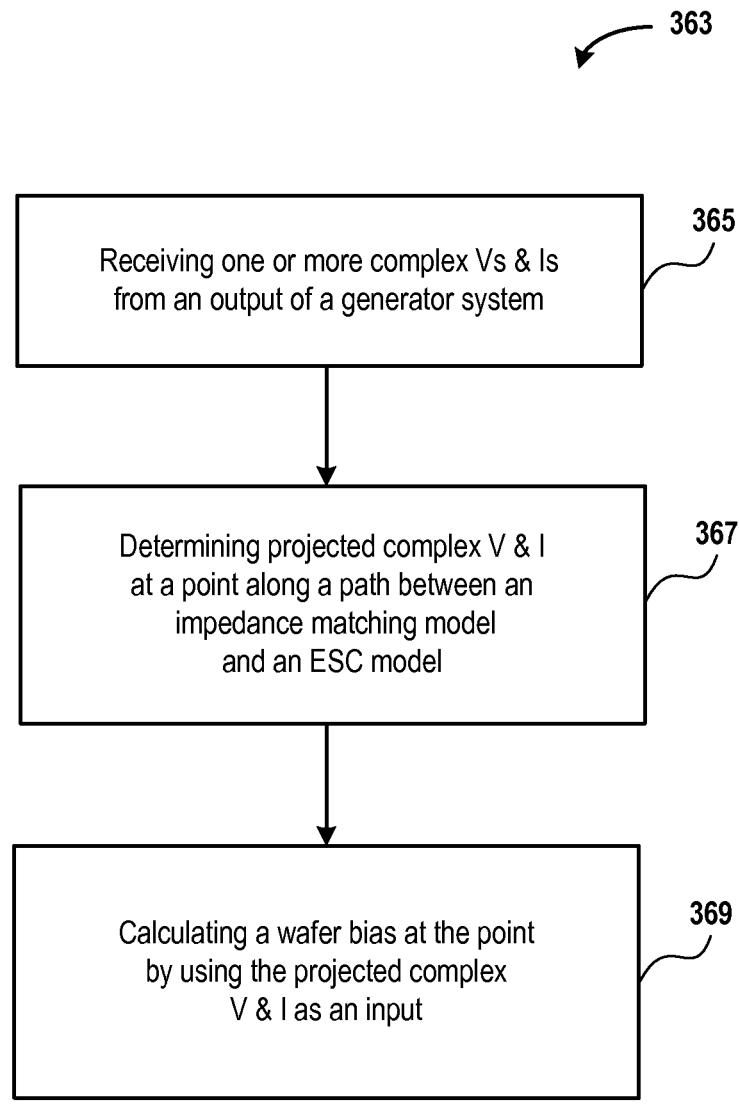
FIG. 17 is a flowchart of a method for determining a wafer bias at a model node of the system of FIG. 1, in accordance with an embodiment described in the present disclosure.

When the power value P0 and/or the frequency value F0 are provided to the DAS 232 by the parameter control 222 and the RF signal 121 is generated, the voltage and current probe 238 measures values of the variable at the output 231. The voltage and current probe 238 sends the values of the variable to the host system 130 for the host system 130 to execute the method 102 (FIG. 2), the method 340 (FIG. 13), the method 351 (FIG. 15), or the method 363 (FIG. 17).

It should be noted that in one embodiment, the voltage and current probe 238 is decoupled from the DSP 226. In some embodiments, the voltage and current probe 238 is coupled to the DSP 226. It should further be noted that the RF signal 215 generated during the state 51 and the RF signal 221 generated during the state S0 are portions of a combined RF signal. For example, the RF signal 215 is a portion of the combined RF signal that has a higher amount of power than the RF signal 221, which is another portion of the combined RF signal.

Figure 10:
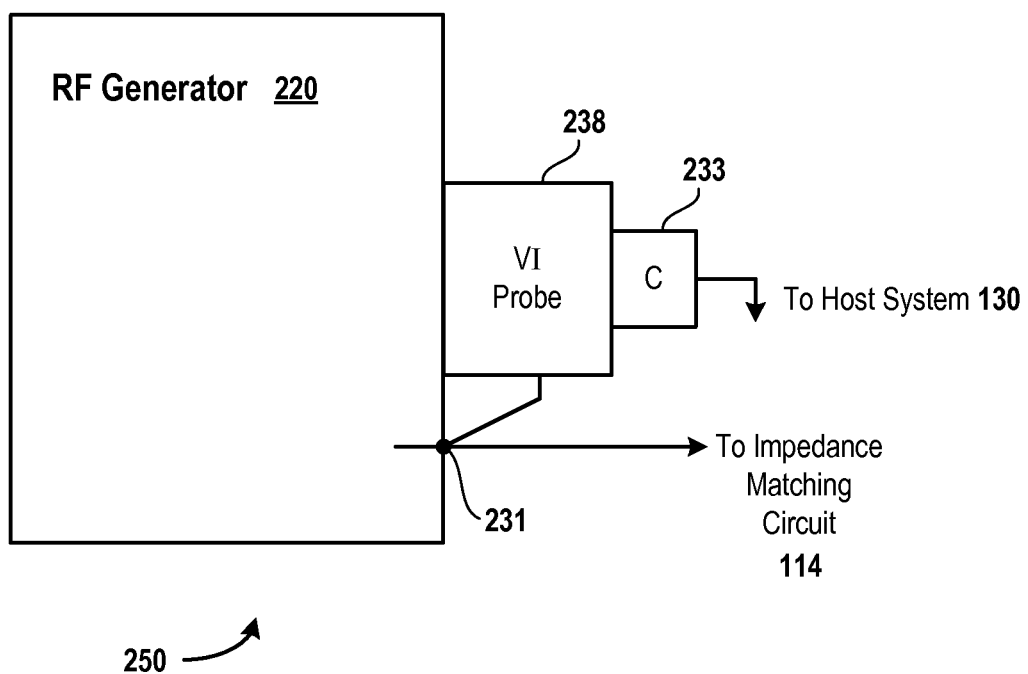
FIG. 10 is a block diagram of a system in which the voltage and current probe and a communication device are located outside the RF generator, in accordance with an embodiment described in the present disclosure.

FIG. 10 is a block diagram of an embodiment of a system 250 in which the voltage and current probe 238 and the communication device 233 are located outside the RF generator 220. In FIG. 1, the voltage and current probe 110 is located within the x MHz RF generator to measure the variable at the output of the x MHz RF generator. The voltage and current probe 238 is located outside the RF generator 220 to measure the variable at the output 231 of the RF generator 220. The voltage and current probe 238 is associated, e.g., coupled, to the output 231 of the RF generator 220.

Figure 11:
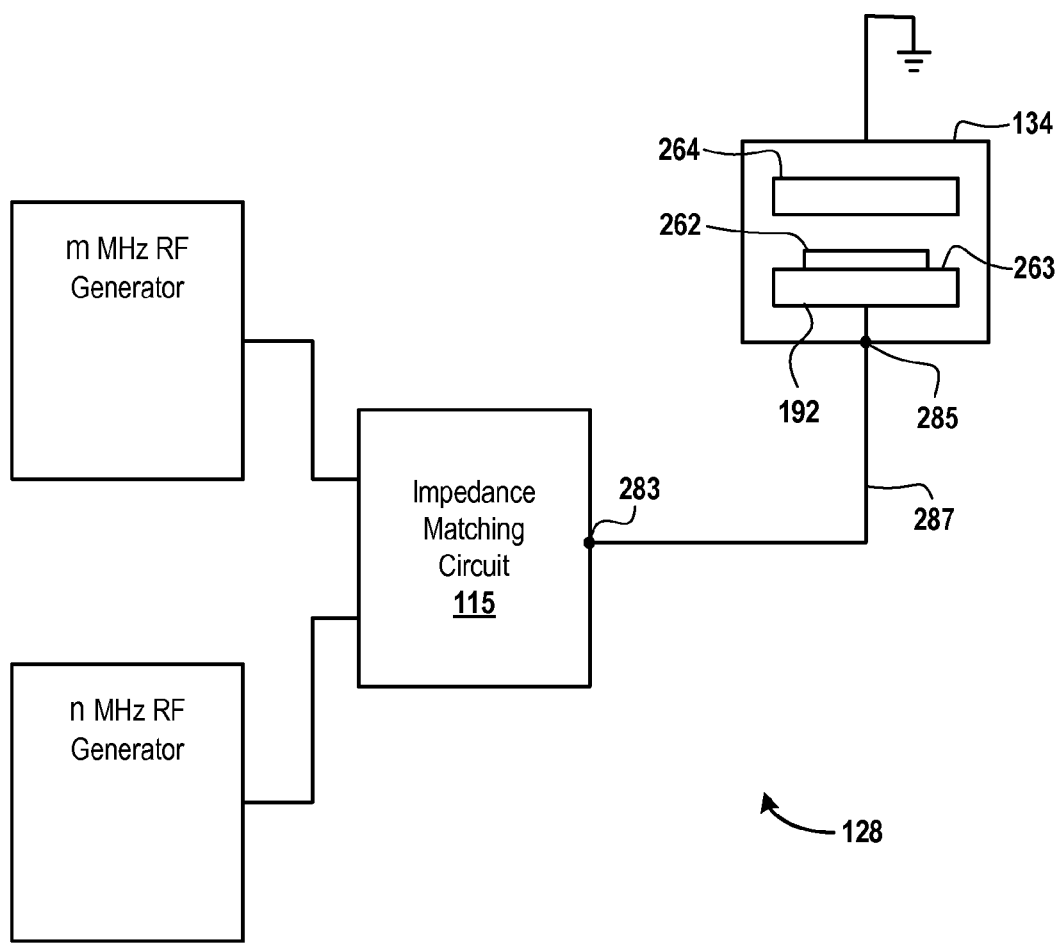
FIG. 11 is a block diagram of a system in which values of the variable determined using the system of FIG. 1 are used, in accordance with an embodiment described in the present disclosure.

FIG. 11 is a block diagram of an embodiment of a system 128 in which the values of the variable determined using the system 126 of FIG. 1 are used. The system 128 includes an m MHz RF generator, an n MHz RF generator, an impedance matching circuit 115, an RF transmission line 287, and a plasma chamber 134. The plasma chamber 134 may be similar to the plasma chamber 175.

It should be noted that in an embodiment, the x MHz RF generator of FIG. 2 is similar to the m MHz RF generator and the y MHz RF generator of FIG. 2 is similar to the n MHz RF generator. As an example, x MHz is equal to m MHz and y MHz is equal to n MHz. As another example, the x MHz generator and the m MHz generators have similar frequencies and the y MHz generator and the n MHz generator have similar frequencies. An example of similar frequencies is when the x MHz is within a window, e.g., within kHz or Hz, of the m MHz frequency. In some embodiments, the x MHz RF generator of FIG. 2 is not similar to the m MHz RF generator and the y MHz RF generator of FIG. 2 is not similar to the n MHz RF generator.

It is further noted that in various embodiments, a different type of sensor is used in each of the m MHz and n MHz RF generators than that used in each of the x MHz and y MHz RF generators. For example, a sensor that does not comply with the NIST standard is used in the m MHz RF generator. As another example, a voltage sensor that measures only voltage is used in the m MHz RF generator.

It should further be noted that in an embodiment, the impedance matching circuit 115 is similar to the impedance matching circuit 114 (FIG. 1). For example, an impedance of the impedance matching circuit 114 is the same as an impedance of the impedance matching circuit 115. As another example, an impedance of the impedance matching circuit 115 is within a window, e.g., within 10-20%, of the impedance of the impedance matching circuit 114. In some embodiments, the impedance matching circuit 115 is not similar to the impedance matching circuit 114.

The impedance matching circuit 115 includes electrical components, e.g., inductors, capacitors, etc., to match an impedance of a power source coupled to the impedance matching circuit 115 with an impedance of a load coupled to the circuit 115. For example, the impedance matching circuit 114 matches an impedance of a source coupled to the impedance matching circuit 114, e.g., a combination of the m MHz RF generator, the n MHz RF generator, and cables coupling the m and n MHz RF generators to the impedance matching circuit 114, etc., with an impedance of a load, e.g., a combination of the plasma chamber 134 and the RF transmission line 287, etc.

It should be noted that in an embodiment, the RF transmission line 287 is similar to the RF transmission line 113 (FIG. 1). For example, an impedance of the RF transmission line 287 is the same as an impedance of the RF transmission line 113. As another example, an impedance of the RF transmission line 287 is within a window, e.g., within 10-20%, of the impedance of the RF transmission line 113. In various embodiments, the RF transmission line 287 is not similar to the RF transmission line 113.

The plasma chamber 134 includes an ESC 192, an upper electrode 264, and other parts (not shown), e.g., an upper dielectric ring surrounding the upper electrode 264, an upper electrode extension surrounding the upper dielectric ring, a lower dielectric ring surrounding a lower electrode of the ESC 192, a lower electrode extension surrounding the lower dielectric ring, an upper plasma exclusion zone (PEZ) ring, a lower PEZ ring, etc. The upper electrode 264 is located opposite to and facing the ESC 192. A work piece 262, e.g., a semiconductor wafer, etc., is supported on an upper surface 263 of the ESC 192. Each of the upper electrode 264 and the lower electrode of the ESC 192 is made of a metal, e.g., aluminum, alloy of aluminum, copper, etc.

In one embodiment, the upper electrode 264 includes a hole that is coupled to a central gas feed (not shown). The central gas feed receives one or more process gases from a gas supply (not shown). The upper electrode 264 is grounded. The ESC 192 is coupled to the m MHz RF generator and the n MHz RF generator via the impedance matching circuit 115.

When the process gas is supplied between the upper electrode 264 and the ESC 192 and when the m MHz RF generator and/or the n MHz RF generator supplies power via the impedance matching circuit 115 to the ESC 192, the process gas is ignited to generate plasma within the plasma chamber 134.

It should be noted that the system 128 lacks a probe, e.g., a metrology tool, a voltage and current probe, a voltage probe, etc., to measure the variable at an output 283 of the impedance matching circuit 115, at a point on the RF transmission line 287, or at the ESC 192. The values of the variable at the model nodes N1m, N2m, N4m, and N6m are used to determine whether the system 128 is functioning as desired.

In various embodiments, the system 128 lacks a wafer bias sensor, e.g., an in-situ direct current (DC) probe pick-up pin, and related hardware that is used to measure wafer bias at the ESC 192. The nonuse of the wafer bias sensor and the related hardware saves cost.

It should also be noted that in an embodiment, the system 128 includes any number of RF generators coupled to an impedance matching circuit.

Figure 12A:
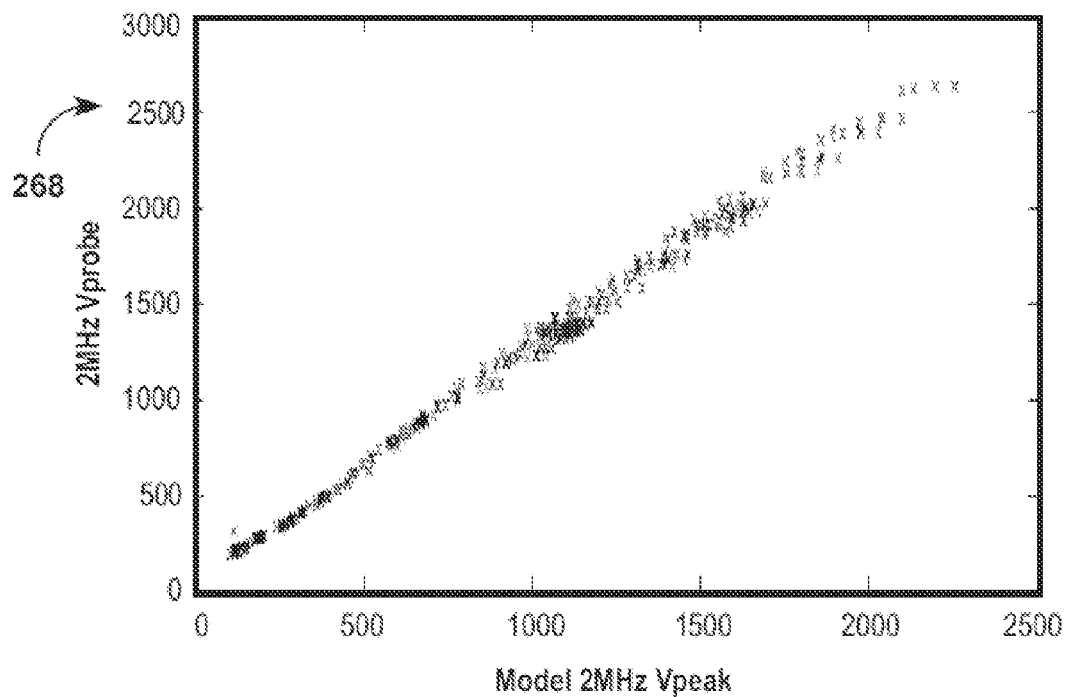
FIG. 12A is a diagram of a graph that illustrates a correlation between a variable that is measured at a node within the system of FIG. 1 by using a probe and a variable that is determined using the method of FIG. 2 when an x MHz RF generator is on, in accordance with an embodiment described in the present disclosure.
Figure 12A:
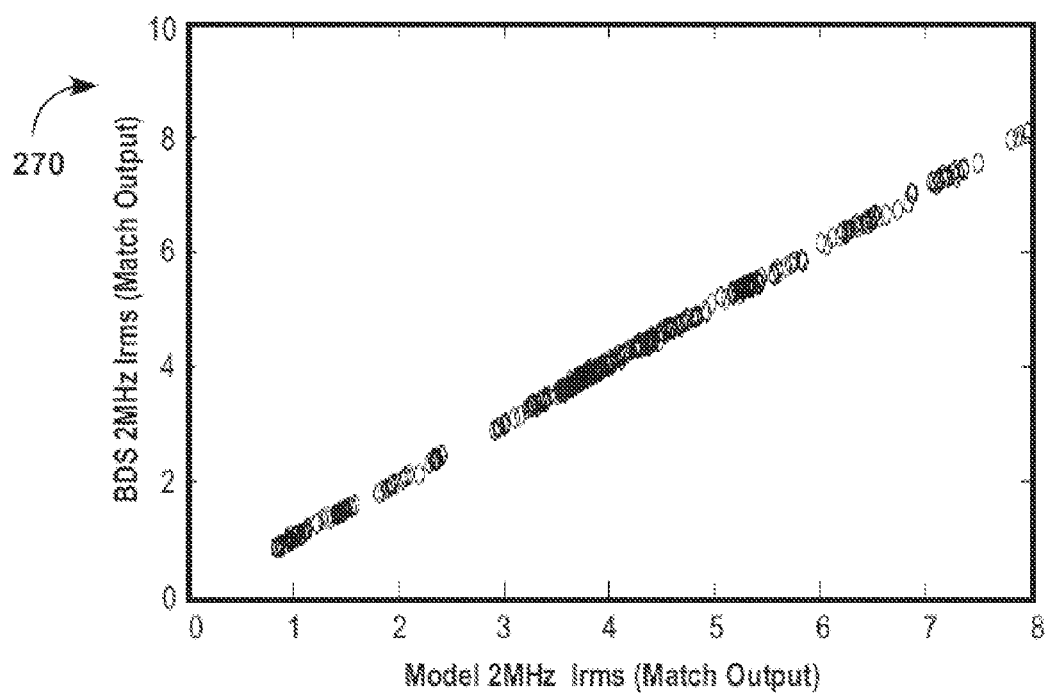
Figure 12B:
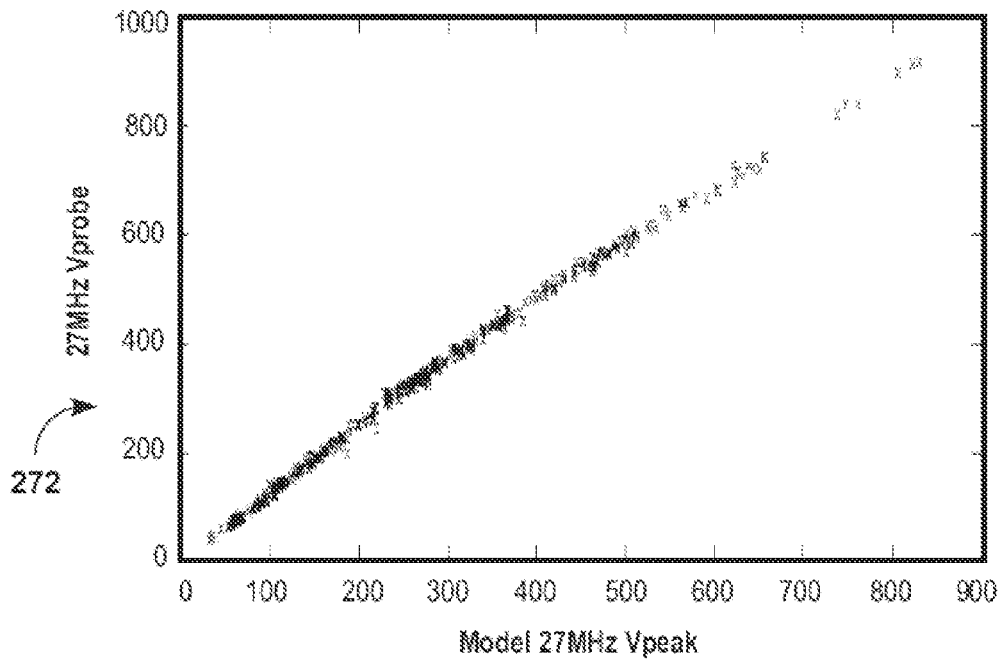
FIG. 12B is a diagram of a graph that illustrates a correlation between a variable that is measured at a node within the system of FIG. 1 by using a probe and a variable that is determined using the method of FIG. 2 when a y MHz RF generator is on, in accordance with an embodiment described in the present disclosure.
Figure 12B:
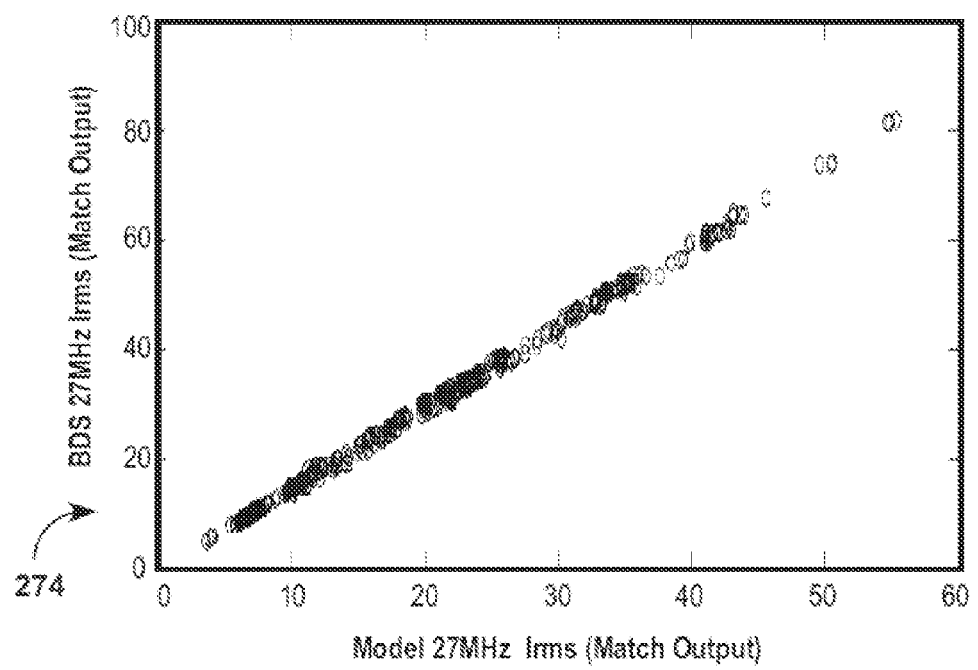
Figure 12C:
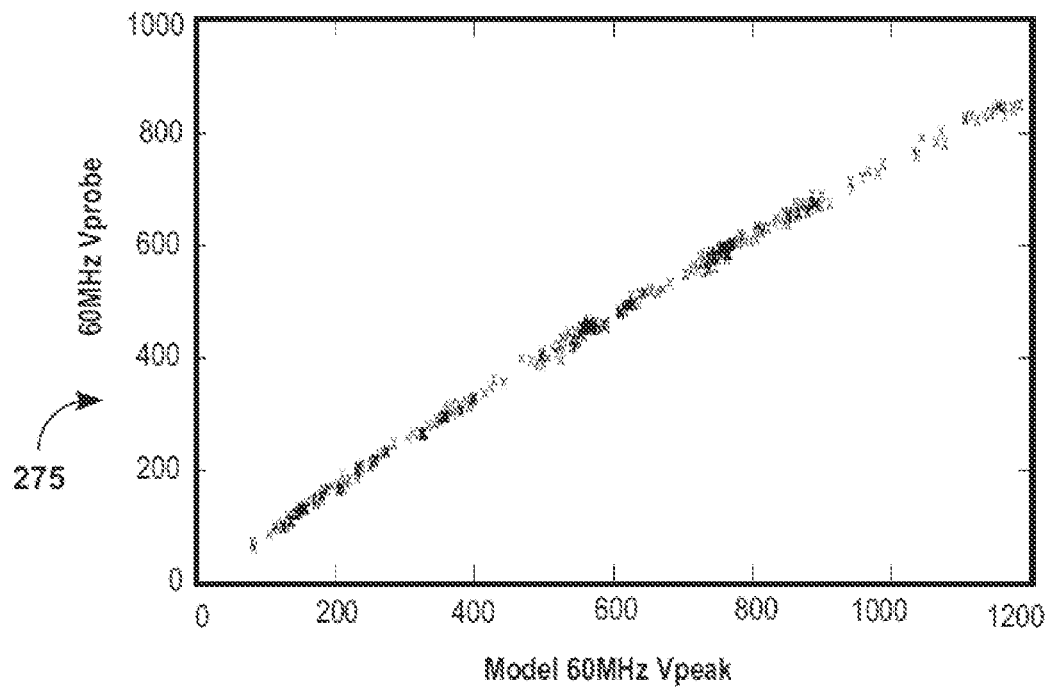
FIG. 12C is a diagram of a graph that illustrates a correlation between a variable that is measured at a node within the system of FIG. 1 by using a probe and a variable that is determined using the method of FIG. 2 when a z MHz RF generator is on, in accordance with one embodiment described in the present disclosure.
Figure 12C:
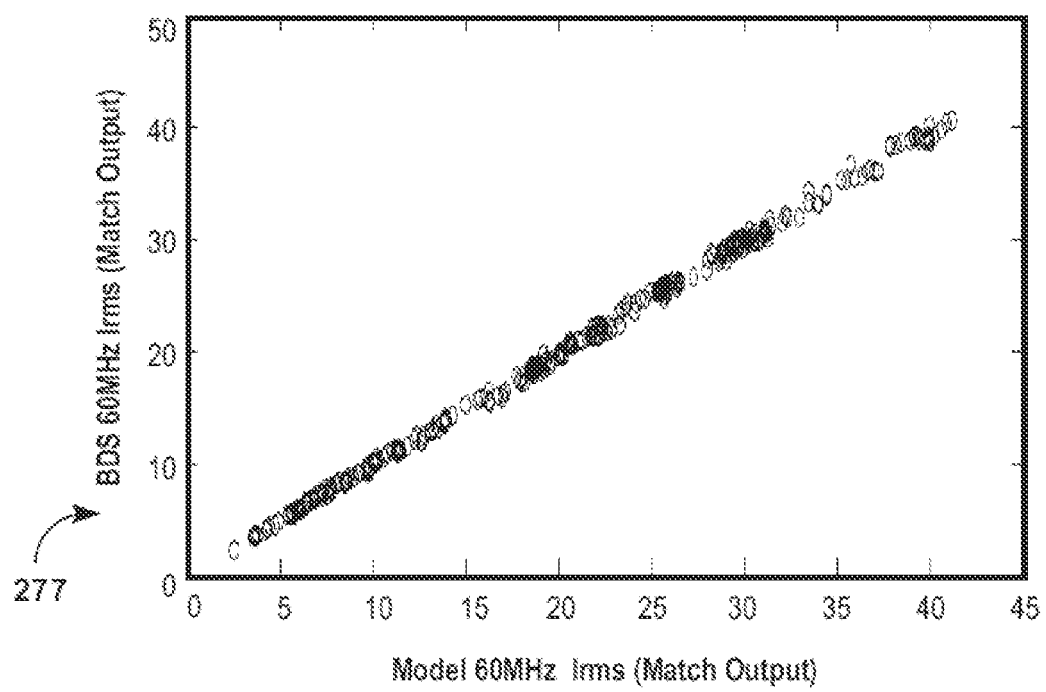

FIGS. 12A, 12B, and 12C are diagrams of embodiments of graphs 268, 272, and 275 that illustrate a correlation between voltage, e.g., root mean square (RMS) voltage, peak voltage, etc., that is measured at the output, e.g., the node N4, of the impedance matching circuit 114 (FIG. 1) within the system 126 (FIG. 1) by using a voltage probe and a voltage, e.g., peak voltage, etc., at a corresponding model node output, e.g., the node N4m, determined using the method 102 (FIG. 2). Moreover, FIGS. 12A, 12C, and 12E are diagrams of embodiments of graphs 270, 274, and 277 that illustrate a correlation between current, e.g., root mean square (RMS) current, etc., that is measured the output, e.g., the node N4, of the system 126 (FIG. 1) by using a current probe and a current, e.g., RMS current, etc., at a corresponding output, e.g., the node N4m, determined using the method 102 (FIG. 2).

The voltage determined using the method 102 is plotted on an x-axis in each graph 268, 272, and 275 and the voltage measured with the voltage probe is plotted on a y-axis in each graph 268, 272, and 275. Similarly, the current determined using the method 102 is plotted on an x-axis in each graph 270, 227, and 277 and the current measured with the current probe is plotted on a y-axis in each graph 270, 274, and 277.

The voltages are plotted in the graph 268 when the x MHz RF generator is on and the y MHz RF generator and a z MHz RF generator, e.g., 60 MHz RF generator, are off. Moreover, the voltages are plotted in the graph 272 when the y MHz RF generator is on and the x and z MHz RF generators are off. Also, the voltages are plotted in the graph 275 when the z MHz RF generator is on and the x and y MHz RF generators are off.

Similarly, currents are plotted in the graph 270 when the x MHz RF generator is on and the y MHz RF generator and a z MHz RF generator are off. Also, the currents are plotted in the graph 274 when the y MHz RF generator is on and the x and z MHz RF generators are off. Also, the currents are plotted in the graph 277 when the z MHz RF generator is on and the x and y MHz RF generators are off.

It can be seen in each graph 268, 272, and 275 that an approximately linear correlation exists between the voltage plotted on the y-axis of the graph and the voltage plotted on the x-axis of the graph. Similarly, it can be seen in each graph 270, 274, and 277 that an approximately linear correlation exists between the current plotted on the y-axis and the current plotted on the x-axis.

Figure 13:
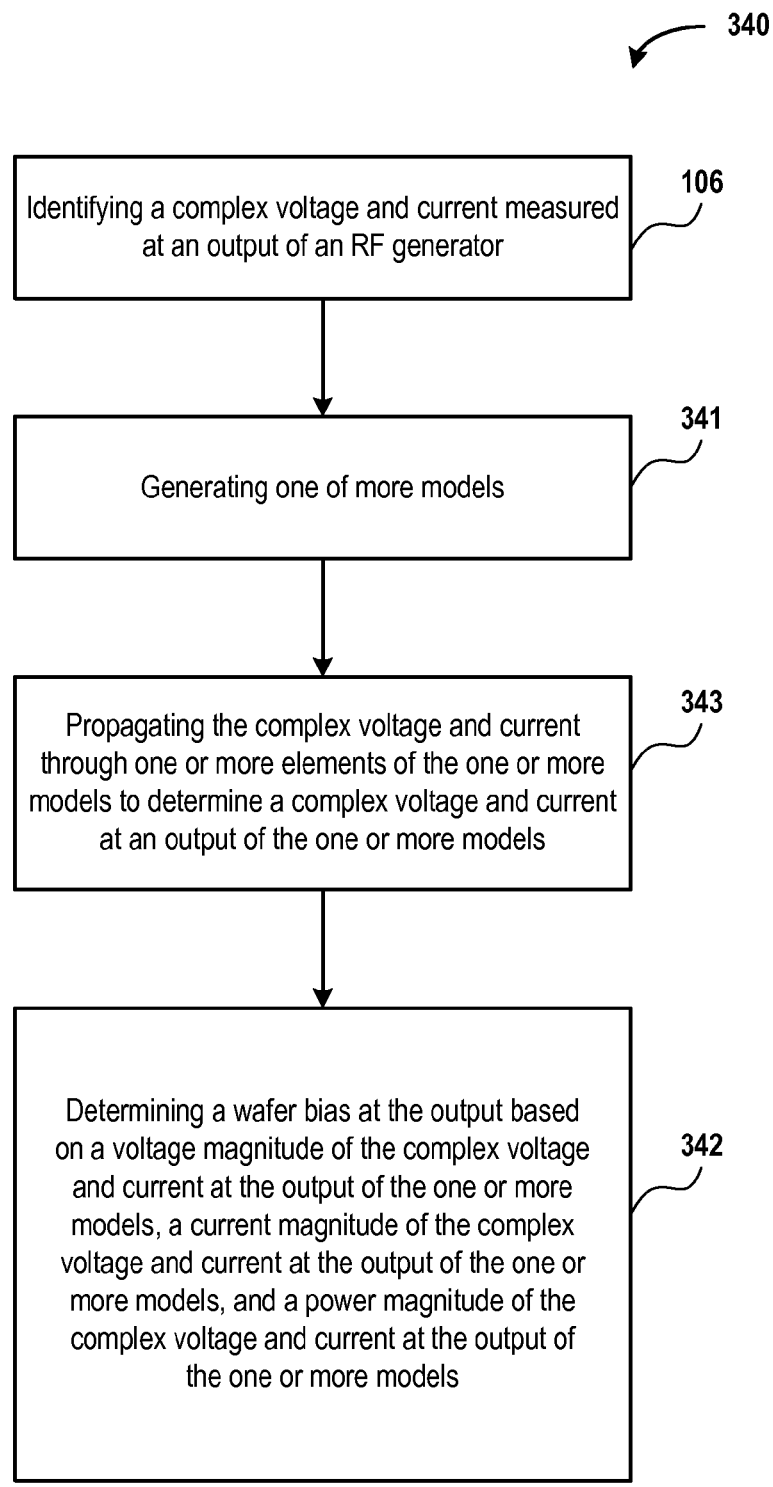
FIG. 13 is a flowchart of a method for determining wafer bias at a model node of the impedance matching model, the RF transmission model, or the ESC model, in accordance with an embodiment described in the present disclosure.

FIG. 13 is a flowchart of an embodiment of the method 340 for determining wafer bias at a model node, e.g., the model node N4$m$, the model node N1$m$, the model node N2$m$, the model node N6$m$, etc., of the plasma system 126 (FIG. 1). It should be noted that in some embodiments, wafer bias is a direct current (DC) voltage that is created by plasma generated within the plasma chamber 175 (FIG. 1). In these embodiments, the wafer bias is present on a surface, e.g., the upper surface 183, of the ESC 177 (FIG. 1) and/or on a surface, e.g., an upper surface, of the work piece 131 (FIG. 1).

It should further be noted that the model nodes N1$m$ and N2$m$ are on the RF transmission model 161 (FIG. 1) and the model node N6$m$ is on the ESC model 125 (FIG. 1). The method 340 is executed by the processor of the host system 130 (FIG. 1). In the method 340, the operation 106 is performed.

Moreover, in an operation 341, one or more models, e.g. the impedance matching model 104, the RF transmission model 161, the ESC model 125 (FIG. 1), a combination thereof, etc., of corresponding one or more devices, e.g., the impedance matching circuit 114, the RF transmission line 113, the ESC 177, a combination thereof, etc., are generated. For example, the ESC model 125 is generated with similar characteristics to that of the ESC 177 (FIG. 1).

In an operation 343, the complex voltage and current identified in the operation 106 is propagated through one or more elements of the one or more models to determine a complex voltage and current at an output of the one or more models. For example, the second complex voltage and current is determined from the first complex voltage and current. As another example, the second complex voltage and current is determined from the first complex voltage and current and the third complex voltage and current is determined from the second complex voltage and current. As yet another example, the second complex voltage and current is determined from the first complex voltage and current, the third complex voltage and current is determined from the second complex voltage and current, and the third complex voltage and current is propagated through the portion 197 of the RF transmission model 161 (FIG. 1) to determine a fourth complex voltage and current at the model node N2$m$. In this example, the fourth complex voltage and current is determined by propagating the third complex voltage and current through impedances of elements of the portion 197. As yet another example, the RF transmission model 161 provides an algebraic transfer function that is executed by the processor of the host system 130 to translate the complex voltage and current measured at one or more outputs of one or more RF generators to an electrical node, e.g., the model node N1$m$, the model node N2$m$, etc., along the RF transmission model 161.

As another example of the operation 343, the second complex voltage and current is determined from the first complex voltage and current, the third complex voltage and current is determined from the second complex voltage and current, the fourth complex voltage and current is determined from the third complex voltage and current, and the fourth complex voltage and current is propagated through the ESC model 125 to determine a fifth complex voltage and current at the model node N6$m$. In this example, the fifth complex voltage and current is determined by propagating the fourth complex voltage and current through impedances of elements, e.g., capacitors, inductors, etc., of the ESC model 125.

In an operation 342, a wafer bias is determined at the output of the one or more models based on a voltage magnitude of the complex voltage and current at the output, a current magnitude of the complex voltage and current at the output, and a power magnitude of the complex voltage and current at the output. For example, wafer bias is determined based on a voltage magnitude of the second complex voltage and current, a current magnitude of the second complex voltage and current, and a power magnitude of the second complex voltage and current. To further illustrate, when the x MHz RF generator is on and the y MHz and z MHz RF generators are off, the processor of the host system 130 (FIG. 1) determines wafer bias at the model node N4$m$ (FIG. 1) as a sum of a first product, a second product, a third product, and a constant. In this illustration, the first product is a product of a first coefficient and the voltage magnitude of the second complex voltage and current, the second product is a product of a second coefficient and the current magnitude of the second complex voltage and current, and the third product is a product of a square root of a third coefficient and a square root of a power magnitude of the second complex voltage and current.

As an example, a power magnitude is a power magnitude of delivered power, which is determined by the processor of the host system 130 as a difference between forward power and reflected power. Forward power is power supplied by one or more RF generators of the system 126 (FIG. 1) to the plasma chamber 175 (FIG. 1). Reflected power is power reflected back from the plasma chamber 175 towards one or more RF generators of the system 126 (FIG. 1). As an example, a power magnitude of a complex voltage and current is a determined by the processor of the host system 130 as a product of a current magnitude of the complex voltage and current and a voltage magnitude of the complex voltage and current. Moreover, each of a coefficient and a constant used to determine a wafer bias is a positive or a negative number. As another example of determination of the wafer bias, when the x MHz RF generator is on and the y and z MHz RF generators are off, the wafer bias at a model node is represented as ax*Vx+bx*Ix+cx*sqrt (Px)+dx, where "ax" is the first coefficient, "bx" is the second coefficient, "dx" is the constant, "Vx" is a voltage magnitude of a complex voltage and current at the model node "Ix" is a current magnitude of the complex voltage and current at the model node, and "Px" is a power magnitude of the complex voltage and current at the model node. It should be noted that "sqrt" is a square root operation, which is performed by the processor of the host system 130. In some embodiments, the power magnitude Px is a product of the current magnitude Ix and the voltage magnitude Vx.

In various embodiments, a coefficient used to determine a wafer bias is determined by the processor of the host system 130 (FIG. 1) based on a projection method. In the projection method, a wafer bias sensor, e.g., a wafer bias pin, etc., measures wafer bias on a surface, e.g., the upper surface 183 (FIG. 1), etc., of the ESC 177 for a first time. Moreover, in the projection method, a voltage magnitude, a current magnitude, and a power magnitude are determined at a model node within the plasma system 126 based on complex voltage and current measured at an output of an RF generator. For example, the complex voltage and current measured at the node N3 (FIG. 1) for the first time is propagated by the processor of the host system 130 to a model node, e.g., the model node N4m, the model node N1m, the model node N2m, or the model node N6m (FIG. 1), etc., to determine complex voltage and current at the model node for the first time. Voltage magnitude and current magnitude are extracted by the processor of the host system 130 from the complex voltage and current at the model node for the first time. Also, power magnitude is calculated by the processor of the host system 130 as a product of the current magnitude and the voltage magnitude for the first time.

Similarly, in the example, complex voltage and current is measured at the node N3 for one or more additional times and the measured complex voltage and current is propagated to determine complex voltage and current at the model node, e.g., the model node N4m, the model node N1m, the model node N2m, the model node N6m, etc., for the one or more additional times. Also, for the one or more additional times, voltage magnitude, current magnitude, and power magnitude are extracted from the complex voltage and current determined for the one or more additional times. A mathematical function, e.g., partial least squares, linear regression, etc., is applied by the processor of the host system 130 to the voltage magnitude, the current magnitude, the power magnitude, and the measured wafer bias obtained for the first time and for the one or more additional times to determine the coefficients ax, bx, cx and the constant dx.

As another example of the operation 342, when the y MHz RF generator is on and the x and z MHz RF generators are off, a wafer bias is determined as ay*Vy+by*Iy+cy*sqrt (Py)+dy, where "ay" is a coefficient, "by" is a coefficient, "dy" is a constant, "Vy" is a voltage magnitude of the second complex voltage and current, "Iy" is a current magnitude of the second complex voltage and current, and "Px" is a power magnitude of the second complex voltage and current. The power magnitude Py is a product of the current magnitude Iy and the voltage magnitude Vy. As yet another example of the operation 342, when the z MHz RF generator is on and the x and y MHz RF generators are off, a wafer bias is determined as az*Vz+bz*Iz+cz*sqrt (Pz)+dz, where "az" is a coefficient, "bz" is a coefficient, "dz" is a constant, "Vz" is a voltage magnitude of the second complex voltage and current, "Iz" is a current magnitude of the second complex voltage and current, and "Pz" is a power magnitude of the second complex voltage and current. The power magnitude Pz is a product of the current magnitude Iz and the voltage magnitude Vz.

As another example of the operation 342, when the x and y MHz RF generators are on and the z MHz RF generator is off, the wafer bias is determined as a sum of a first product, a second product, a third product, a fourth product, a fifth product, a sixth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, and the sixth product is a product of a sixth coefficient and a square root of the power magnitude Py. When the x and y MHz RF generators are on and the z MHz RF generator is off, the wafer bias is represented as axy*Vx+bxy*Ix+cxy*sqrt (Px)+dxy*Vy+exy*Iy+fxy*sqrt (Py)+gxy, where "axy", "bxy", "cxy", "dxy", "exy", "fxy", "dxy", "exy", and "fxy" are coefficients, and "gxy" is a constant.

As another example of the operation 342, when the y and z MHz RF generators are on and the x MHz RF generator is off, a wafer bias is determined as ayz*Vy+byz*Iy+cyz*sqrt (Py)+dyz*Vz+eyz*Iz+fyz*sqrt (Pz)+gyz, where "ayz", "byz", "cyz", "dyz", "eyz", and "fyz" are coefficients, and "gyz" is a constant. As yet another example of the operation 342, when the x and z MHz RF generators are on and the y MHz RF generator is off, a wafer bias is determined as axz*Vx+bxz*Ix+cxz*sqrt (Px)+dxz*Vz+exz*Iz+fxz*sqrt (Pz)+gxz, where "axz", "bxz", "cxz", "dxz", "exz", and "fxz" are coefficients, and gxz is a constant.

As another example of the operation 342, when the x, y, and z MHz RF generators are on, the wafer bias is determined as a sum of a first product, a second product, a third product, a fourth product, a fifth product, a sixth product, a seventh product, an eighth product, a ninth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, the sixth product is a product of a sixth coefficient and a square root of the power magnitude Py, the seventh product is a product of a seventh coefficient and the voltage magnitude Vz, the eighth product is a product of an eighth coefficient and the current magnitude Iz, and the ninth product is a product of a ninth coefficient and a square root of a power magnitude Pz. When the x, y, and z MHz RF generators are on, the wafer bias is represented as axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz, where "axyz", "bxyz", "cxyz", "dxyz", "exyz", "fxyz", "gxyz", "hxyz", and "ixyz" are coefficients, and "jxyz" is a constant.

As another example of determination of wafer bias at the output of the one or more models, wafer bias at the model node N1m is determined by the processor of the host system 130 based on voltage and current magnitudes determined at the model node N1m. To further illustrate, the second complex voltage and current is propagated along the portion 173 (FIG. 1) to determine complex voltage and current at the model node N1m. The complex voltage and current is determined at the model node N1m from the second complex voltage and current in a manner similar to that of determining the second complex voltage and current from the first complex voltage and current. For example, the second complex voltage and current is propagated along the portion 173 based on characteristics of elements of the portion 173 to determine a complex voltage and current at the model node N1*m*.

Based on the complex voltage and current determined at the model node N1*m*, wafer bias is determined at the model node N1*m* by the processor of the host system 130. For example, wafer bias is determined at the model node N1*m* from the complex voltage and current at the model node N1*m* in a manner similar to that of determining the wafer bias at the model node N4*m* from the second complex voltage and current. To illustrate, when the x MHz RF generator is on and the y MHz and z MHz RF generators are off, the processor of the host system 130 (FIG. 1) determines wafer bias at the model node N1*m* as a sum of a first product, a second product, a third product, and a constant. In this example, the first product is a product of a first coefficient and the voltage magnitude of the complex voltage and current at the model node N1*m*, the second product is a product of a second coefficient and the current magnitude of the complex voltage and current at the model node N1*m*, and the third product is a product of a square root of a third coefficient and a square root of a power magnitude of the complex voltage and current at the model node N1*m*. When the x MHz RF generator is on and the y and z MHz RF generators are off, the wafer bias at the model node N1*m* is represented as ax*Vx+bx*Ix+cx*sqrt (Px)+dx, where ax is the first coefficient, bx is the second coefficient, cx is the third coefficient, dx is the constant, Vx is the voltage magnitude at the model node N1*m*, Ix is the current magnitude at the model node N1*m*, and Px is the power magnitude at the model node N1*m*.

Similarly, based on the complex voltage and current at the model node N1*m* and based on which of the x, y, and z MHz RF generators are on, the wafer bias ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined.

As yet another example of determination of wafer bias at the output of the one or more models, wafer bias at the model node N2*m* is determined by the processor of the host system 130 based on voltage and current magnitudes determined at the model node N2*m* in a manner similar to that of determining wafer bias at the model node N1*m* based on voltage and current magnitudes determined at the model node N1*m*. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N2*m*.

As another example of determination of wafer bias at the output of the one or more models, wafer bias at the model node N6*m* is determined by the processor of the host system 130 based on voltage and current magnitudes determined at the model node N6*m* in a manner similar to that of determining wafer bias at the model node N2*m* based on voltage and current magnitudes determined at the model node N2*m*. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N6*m*.

It should be noted that in some embodiments, wafer bias is stored within the storage HU 162 (FIG. 1).

Figure 14:
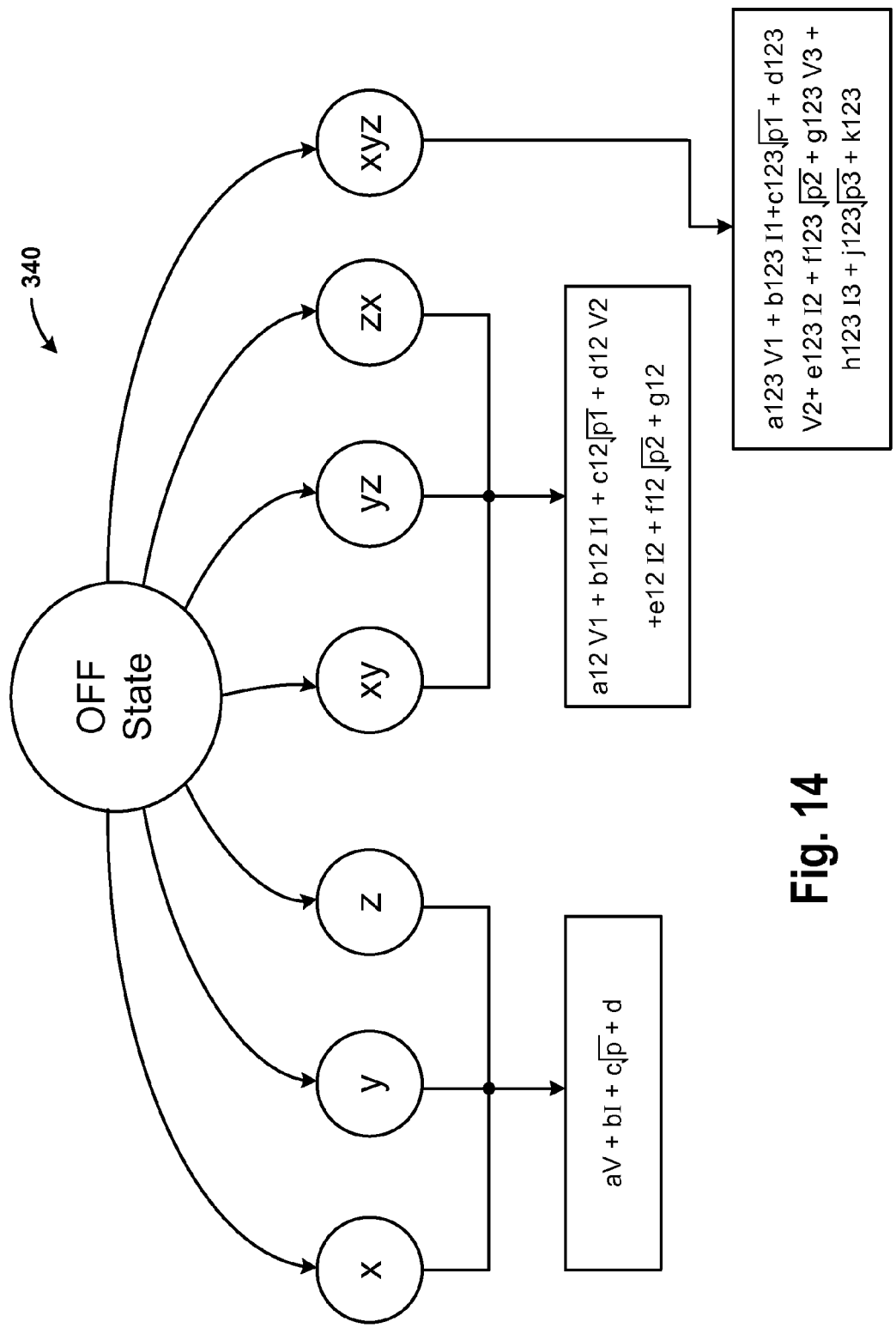
FIG. 14 is a state diagram illustrating a wafer bias generator used to generate a wafer bias, in accordance with an embodiment described in the present disclosure.

FIG. 14 is a state diagram illustrating an embodiment of a wafer bias generator 340, which is implemented within the host system 130 (FIG. 1). When all of the x, y, and z MHz RF generators are off, wafer bias is zero or minimal at a model node, e.g., the model node N4*m*, N1*m*, N2*m*, N6*m* (FIG. 1), etc. When the x, y, or z MHz RF generator is on and the remaining of the x, y, and z MHz RF generators are off, the wafer bias generator 340 determines a wafer bias at a model node, e.g., the model node N4*m*, N1*m*, N2*m*, N6*m*, etc., as a sum of a first product a*V, a second product b*I, a third product c*sqrt(P), and a constant d, where V is a voltage magnitude of a complex voltage and current at the model node, I is a current magnitude of the complex voltage and current, P is a power magnitude of the complex voltage and current, a is a coefficient, b is a coefficient, c is a coefficient, and d is a constant. In various embodiments, a power magnitude at a model node is a product of a current magnitude at the model node and a voltage magnitude at the model node. In some embodiments, the power magnitude is a magnitude of delivered power.

When two of the x, y, and z MHz RF generators are on and the remaining of the x, y, and z MHz RF generators are off, the wafer bias generator 340 determines a wafer bias at a model node, e.g., the model node N4*m*, N1*m*, N2*m*, N6*m*, etc., as a sum of a first product a12*V1, a second product b12*I1, a third product c12*sqrt(P1), a fourth product d12*V2, a fifth product e12*I2, a sixth product f12*sqrt (P2), and a constant g12, where "V1" is a voltage magnitude of a complex voltage and current at the model node determined by propagating a voltage measured at an output of a first one of the RF generators that is on, "I1" is a current magnitude of the complex voltage and current determined by propagating a current measured at the output of the first RF generator that is on, "P1" is a power magnitude of the complex voltage and current determined as a product of V1 and I1, "V2" is a voltage magnitude of the complex voltage and current at the model node determined by propagating a voltage measured at an output of a second one of the RF generators that is on, "I2" is a current magnitude of the complex voltage and current determined by propagating the current measured at an output of the second RF generator that is on, "P2" is a power magnitude determined as a product of V2 and I2, each of "a12", "b12", "c12", "d12", "e12" and "f12" is a coefficient, and "g12" is a constant.

When all of the x, y, and z MHz RF generators are on, the wafer bias generator 340 determines a wafer bias at a model node, e.g., the model node N4*m*, N1*m*, N2*m*, N6*m*, etc., as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where "V1" is a voltage magnitude of a complex voltage and current at the model node determined by propagating a voltage measured at an output of a first one of the RF generators, "I1" is a current magnitude of the complex voltage and current determined by propagating a current measured at the output of the first RF generator, "P1" is a power magnitude of the complex voltage and current determined as a product of V1 and I1, "V2" is a voltage magnitude of the complex voltage and current at the model node determined by propagating a voltage measured at an output of a second one of the RF generators, "I2" is a current magnitude of the complex voltage and current determined by propagating a current measured at the output of the second RF generator, "P2" is a power magnitude of the complex voltage and current determined as a product of V2 and I2, "V3" is a voltage magnitude of the complex voltage and current at the model node determined by propagating a voltage measured at an output of a third one of the RF generators, "I3" is a current magnitude of the complex voltage and current determined by propagating a current at the output of the third RF generator, "P3" is a power magnitude of the complex voltage and current determined as a product of V3 and 13, each of "a123", "b123", "c123", "d123", "e123", "f123", "g123", "h123", and "i123" is a coefficient, and "j123" is a constant.

Figure 15:
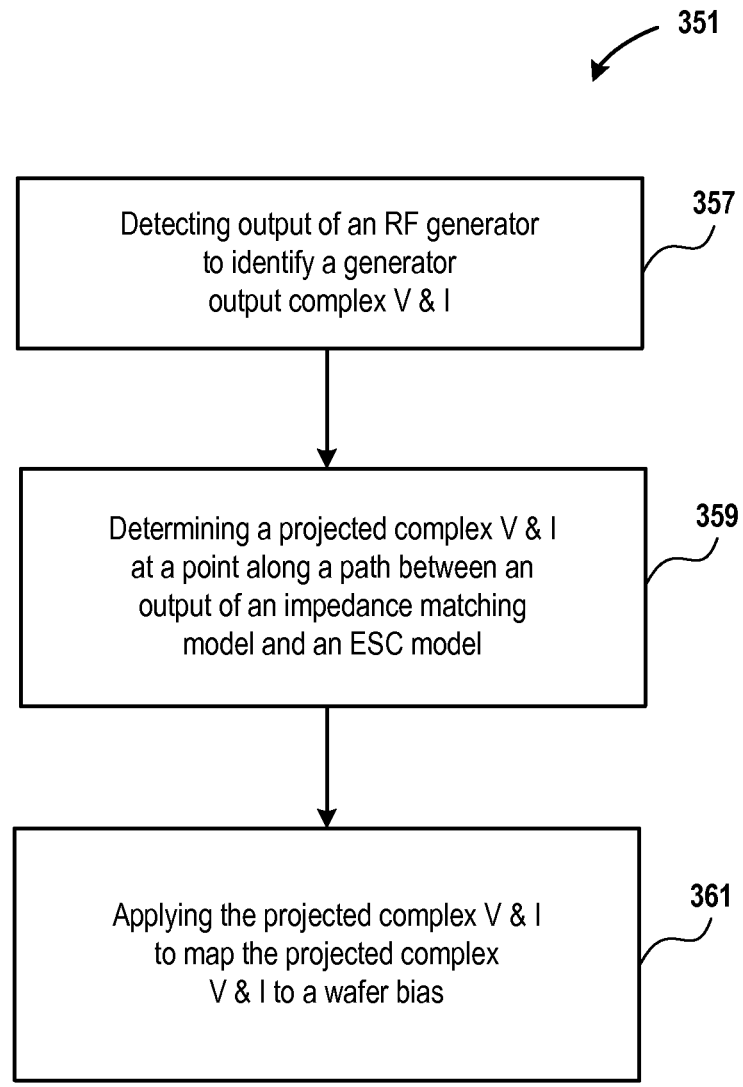
FIG. 15 is a flowchart of a method for determining a wafer bias at a point along a path between the impedance matching model and the ESC model, in accordance with an embodiment described in the present disclosure.
Figure 16:
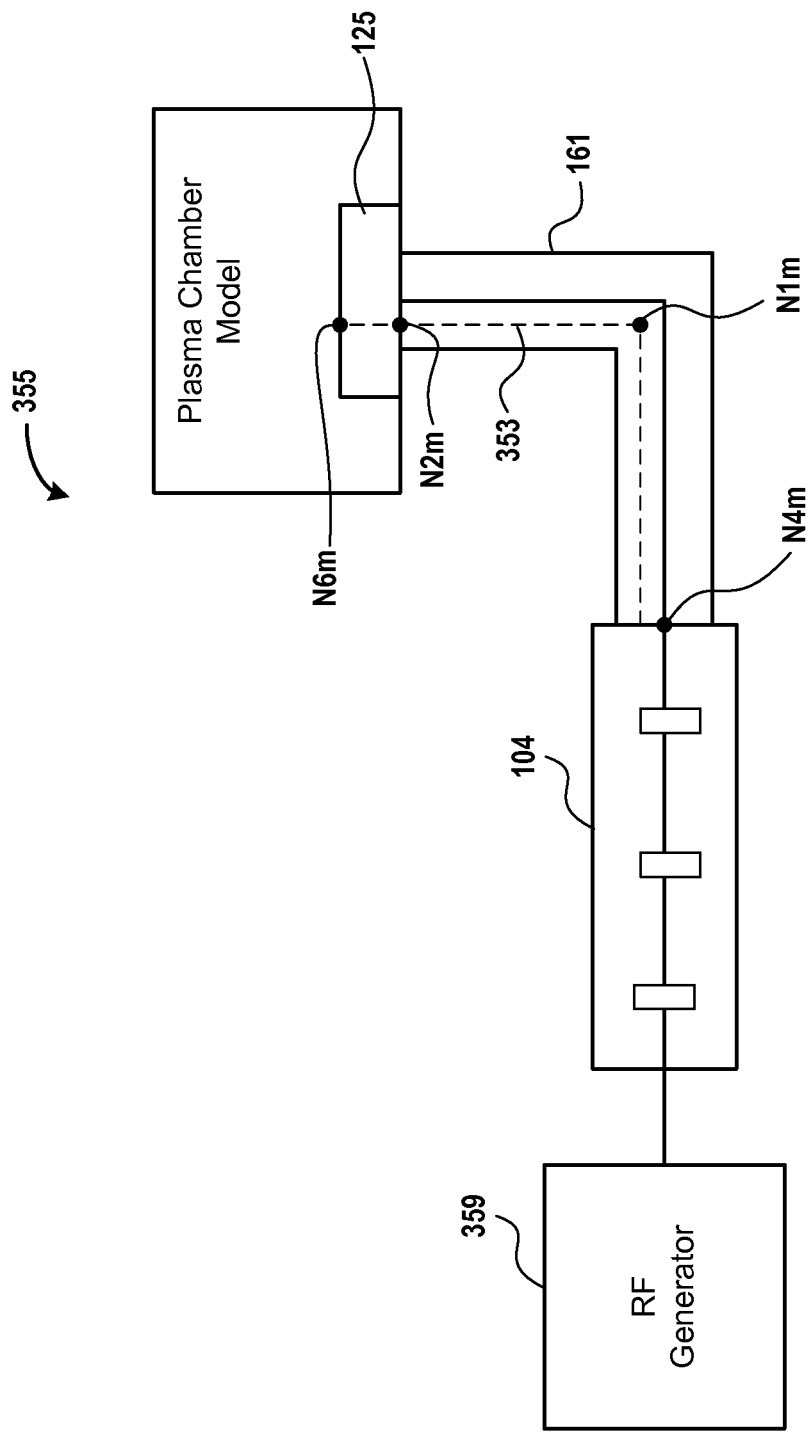
FIG. 16 is a block diagram of a system for determining a wafer bias at a node of a model, in accordance with an embodiment described in the present disclosure.

FIG. 15 is a flowchart of an embodiment of the method 351 for determining a wafer bias at a point along a path 353 (FIG. 16) between the model node N4m (FIG. 16) and the ESC model 125 (FIG. 16). FIG. 15 is described with reference to FIG. 16, which is a block diagram of an embodiment of a system 355 for determining a wafer bias at an output of a model.

In an operation 357, output of the x, y, or z MHz RF generator is detected to identify a generator output complex voltage and current. For example, the voltage and current probe 110 (FIG. 1) measures complex voltage and current at the node N3 (FIG. 1). In this example, the complex voltage and current is received from the voltage and current probe 110 via the communication device 185 (FIG. 1) by the host system 130 (FIG. 1) for storage within the storage HU 162 (FIG. 1). Also, in the example, the processor of the host system 130 identifies the complex voltage and current from the storage HU 162.

In an operation 359, the processor of the host system 130 uses the generator output complex voltage and current to determine a projected complex voltage and current at a point along the path 353 between the model node N4m and the model node N6m. The path 161 extends from the model node N4m to the model node N6m. For example, the fifth complex voltage and current is determined from the complex voltage and current measured at the output of the x MHz RF generator, the y MHz RF generator, or the z MHz RF generator. As another example, the complex voltage and current measured at the node N3 or the node N5 is propagated via the impedance matching model 104 to determine a complex voltage and current at the model node N4m (FIG. 1). In the example, the complex voltage and current at the model node N4m is propagated via one or more elements of the RF transmission model 161 (FIG. 16) and/or via one or more elements of the ESC model 125 (FIG. 16) to determine complex voltage and current at a point on the path 353.

In an operation 361, the processor of the host system 130 applies the projected complex voltage and current determined at the point on the path 353 as an input to a function to map the projected complex voltage and current to a wafer bias value at the node N6m of the ESC model 125 (FIG. 15). For example, when the x, y, or z MHz RF generator is on, a wafer bias at the model node N6m is determined as a sum of a first product a*V, a second product b*I, a third product c*sqrt(P), and a constant d, where V is a voltage magnitude of the projected complex voltage and current at the model node N6m, I is a current magnitude of the projected complex voltage and current at the model node N6m, P is a power magnitude of the projected complex voltage and current at the model node N6m, a, b, and c are coefficients, and d is a constant.

As another example, when two of the x, y, and z MHz RF generators are on and the remaining of the x, y, and z MHz RF generators are off, a wafer bias at the model node N6m is determined as a sum of a first product a12*V1, a second product b12*I1, a third product c12*sqrt(P1), a fourth product d12*V2, a fifth product e12*I2, a sixth product f12*sqrt(P2), and a constant g12, where V1 is a voltage magnitude at the model node N6m as a result of a first one of the two RF generators being on, I1 is a current magnitude at the model node N6m as a result of the first RF generator being on, P1 is a power magnitude at the model node N6m as a result of the first RF generator being on, V2 is a voltage magnitude at the model node N6m as a result of a second one of the two RF generators being on, I2 is a current magnitude at the model node N6m as a result of the second RF generator being on, and P2 is a power magnitude at the model node N6m as a result of the second RF generator being on, a12, b12, c12, d12, e12, and f12 are coefficients, and g12 is a constant.

As yet another example, when all of the x, y, and z MHz RF generators are on, a wafer bias at the model node N6m is determined as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where V1, I1, P1, V2, I2, and P2 are described above in the preceding example, V3 is a voltage magnitude at the model node N6m as a result of a third one of the RF generators being on, I3 is a current magnitude at the model node N6m as a result of the third RF generator being on, and P3 is a power magnitude at the model node N6m as a result of the third RF generator being on, a123, b123, c123, d123, e123, f123, g123, h123, and i123 are coefficients and j 123 is a constant.

As another example, a function used to determine a wafer bias is a sum of characterized values and a constant. The characterized values include magnitudes, e.g., the magnitudes V, I, P, V1, I1, P1, V2, I2, P2, V3, I3, P3, etc. The characterized values also include coefficients, e.g., the coefficients, a, b, c, a12, b12, c12, d12, e12, f12, a123, b123, c123, d123, e123, f123, g123, h123, i123, etc. Examples of the constant include the constant d, the constant g12, the constant j123, etc.

It should be noted that the coefficients of the characterized values and the constant of the characterized values incorporate empirical modeling data. For example, wafer bias is measured for multiple times at the ESC 177 (FIG. 1) using a wafer bias sensor. Moreover, in the example, for the number of times the wafer bias is measured, complex voltages and currents at the point along the path 353 (FIG. 16) are determined by propagating the complex voltage and current from one or more of the nodes, e.g., the nodes N3, N5, etc., of one or more of the RF generators, e.g., the x MHz RF generator, the y MHz RF generator, the z MHz RF generator, etc., via one or more of the models, e.g., the impedance matching model 104, the model portion 173, the RF transmission model 161, the ESC model 125 (FIG. 1), to reach to the point on the path 353 (FIG. 16). Moreover, in this example, a statistical method, e.g., partial least squares, regression, etc., is applied by the processor of the host system 130 to the measured wafer bias and to voltage magnitudes, current magnitudes, and power magnitudes extracted from the complex voltages and currents at the point to determine the coefficients of the characterized values and the constant of the characterized values.

In various embodiments, a function used to determine a wafer bias is characterized by a summation of values that represent physical attributes of the path 353. The physical attributes of the path 353 are derived values from test data, e.g., empirical modeling data, etc. Examples of physical attributes of the path 353 include capacitances, inductances, a combination thereof, etc., of elements on the path 353. As described above, the capacitances and/or inductances of elements along the path 353 affect voltages and currents empirically determined using the projection method at the point on the path 353 and in turn, affect the coefficients of the characterized values and the constant of the characterized values.

In some embodiments, a function used to determine a wafer bias is a polynomial.

FIG. 17 is a flowchart of an embodiment of the method 363 for determining a wafer bias at a model node of the system 126 (FIG. 1). FIG. 17 is described with reference to FIGS. 1 and 16. The method 363 is executed by the processor of the host system 130 (FIG. 1). In an operation 365, one or more complex voltages and currents are received by the host system 130 from one or more communication devices of a generator system, which includes one or more of the x MHz RF generator, the y MHz RF generator, and the z MHz RF generator. For example, complex voltage and current measured at the node N3 is received from the communication device 185 (FIG. 1). As another example, complex voltage and current measured at the node N5 is received from the communication device 189 (FIG. 1). As yet another example, complex voltage and current measured at the node N3 and complex voltage and current measured at the node N5 are received. It should be noted that an output of the generator system includes one or more of the nodes N3, N5, and an output node of the z MHz RF generator.

In an operation 367, based on the one or more complex voltages and currents at the output of the generator system, a projected complex voltage and current is determined at a point along, e.g., on, etc., the path 353 (FIG. 16) between the impedance matching model 104 and the ESC model 125 (FIG. 16). For example, the complex voltage and current at the output of the generator system is projected via the impedance matching model 104 (FIG. 16) to determine a complex voltage and current at the model node N4m. As another example, the complex voltage and current at the output of the generator system is projected via the impedance matching model 104 and the portion 173 (FIG. 1) of the RF transmission model 161 to determine a complex voltage and current at the model node N1m (FIG. 1). As yet another example, the complex voltage and current at the output of the generator system is projected via the impedance matching model 104 and the RF transmission model 161 to determine a complex voltage and current at the model node N2m (FIG. 1). As another example, the complex voltage and current at the output of the generator system is projected via the impedance matching model 104, the RF transmission model 161, and the ESC model 125 to determine a complex voltage and current at the model node N6m (FIG. 1).

In an operation 369, a wafer bias is calculated at the point along the path 353 by using the projected complex V&I as an input to a function. For example, when the x, y, or z MHz RF generator is on and the remaining of the x, y, and z MHz RF generators are off, a wafer bias at the point is determined from a function, which is as a sum of a first product a*V, a second product b*I, a third product c*sqrt(P), and a constant d, where, V is a voltage magnitude of the projected complex voltage and current at the point, I is a current magnitude of the projected complex voltage and current at the point, P is a power magnitude of the projected complex voltage and current at the point, a, b, and c are coefficients, and d is a constant.

As another example, when two of the x, y, and z MHz RF generators are on and the remaining of the x, y, and z MHz RF generators are off, a wafer bias at the point is determined as a sum of a first product a12*V1, a second product b12*I1, a third product c12*sqrt(P1), a fourth product d12*V2, a fifth product e12*I2, a sixth product f12*sqrt(P2), and a constant g12, where V1 is a voltage magnitude at the point as a result of a first one of the two RF generators being on, I1 is a current magnitude at the point as a result of the first RF generator being on, P1 is a power magnitude at the point as a result of the first RF generator being on, V2 is a voltage magnitude at the point as a result of a second one of the two RF generators being on, I2 is a current magnitude at the point as a result of the second RF generator being on, and P2 is a power magnitude at the point as a result of the second RF generator being on, a12, b12, c12, d12, e12, and f12 are coefficients, and g12 is a constant.

As yet another example, when all of the x, y, and z MHz RF generators are on, a wafer bias at the point is determined as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where V1, I1, P1, V2, I2, and P2 are described above in the preceding example, V3 is a voltage magnitude at the point as a result of a third one of the RF generators being on, I3 is a current magnitude at the point as a result of the third RF generator being on, and P3 is a power magnitude at the point as a result of the third RF generator being on, a123, b123, c123, d123, e123, f123, g123, h123, and i123 are coefficients, and j123 is a constant.

Figure 18:
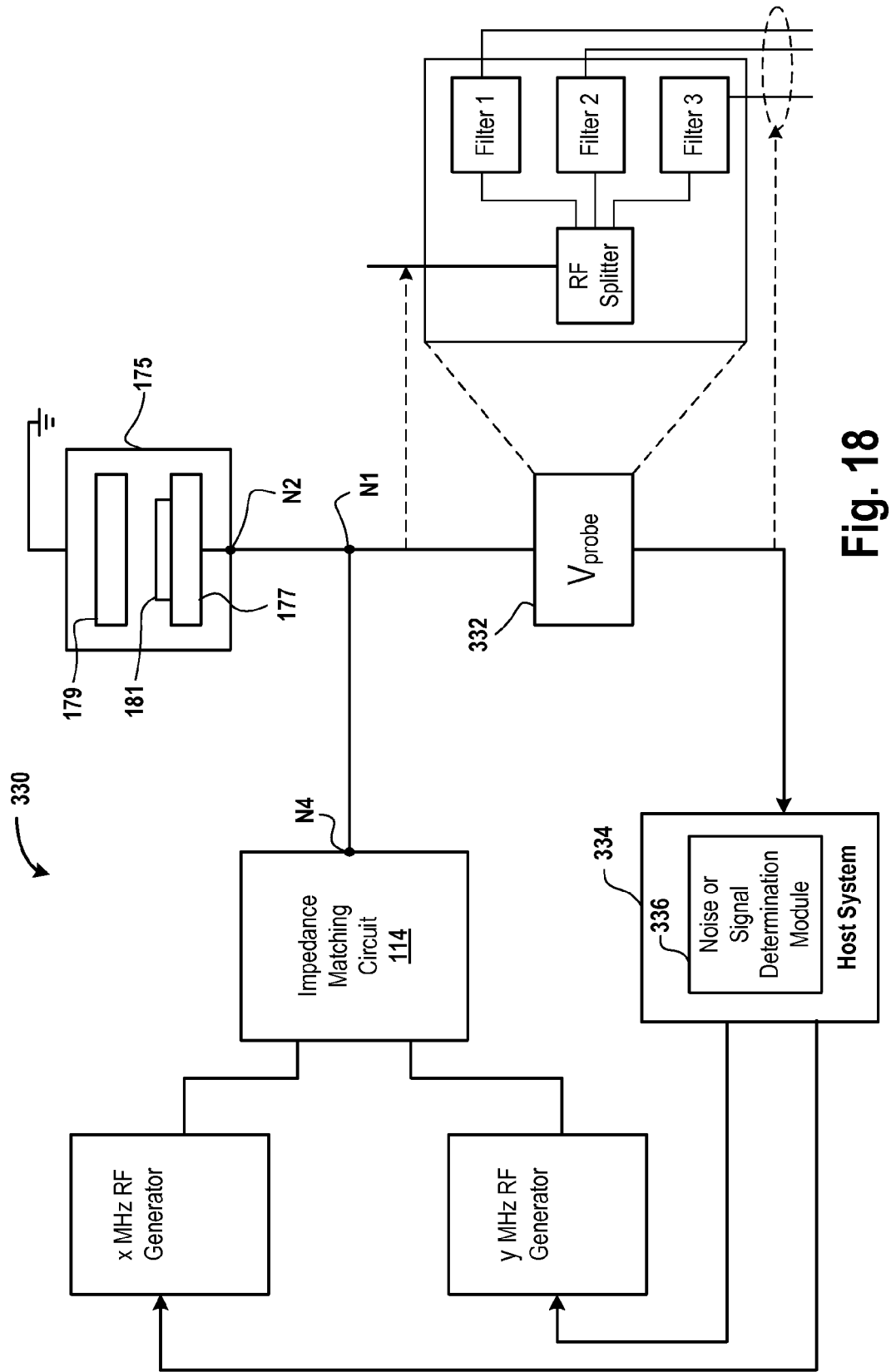
FIG. 18 is a block diagram of a system that is used to illustrate advantages of determining wafer bias by using the method of FIG. 13, FIG. 15, or FIG. 17 instead of by using a voltage probe, in accordance with an embodiment described in the present disclosure.

FIG. 18 is a block diagram of an embodiment of a system 330 that is used to illustrate advantages of determining wafer bias by using the method 340 (FIG. 13), the method 351 (FIG. 15), or the method 363 (FIG. 17) instead of by using a voltage probe 332, e.g., a voltage sensor, etc.

The voltage probe 332 is coupled to the node N1 to determine a voltage at the node N1. In some embodiments, the voltage probe 332 is coupled to another node, e.g., node N2, N4, etc., to determine voltage at the other node. The voltage probe 332 includes multiple circuits, e.g., an RF splitter circuit, a filter circuit 1, a filter circuit 2, a filter circuit 3, etc.

Also, the x and y MHz RF generators are coupled to a host system 334 that includes a noise or signal determination module 336. It should be noted that a module may be a processor, an ASIC, a PLD, a software executed by a processor, or a combination thereof.

The voltage probe 332 measures a voltage magnitude, which is used by the host system 334 to determine a wafer bias. The module 336 determines whether the voltage magnitude measured by the voltage probe 332 is a signal or noise. Upon determining that the voltage magnitude measured by the voltage probe 332 is a signal, the host system 334 determines wafer bias.

The system 126 (FIG. 1) is cost effective compared to the system 330 and saves time and effort compared to the system 330. The system 330 includes the voltage probe 332, which does not need to be included in the system 126. There is no need to couple a voltage probe at the node N4, N1, or N2 of the system 126 to determine wafer bias. In the system 126, wafer bias is determined based on the impedance matching model 104, RF transmission model 161, and/or the ESC model 125 (FIG. 1). Moreover, the system 330 includes the module 336, which also does not need to be included in the system 126. There is no need to spend time and effort to determine whether a complex voltage and current is a signal or noise. No such determination needs to be made by the host system 130 (FIG. 1).

Figure 19A:
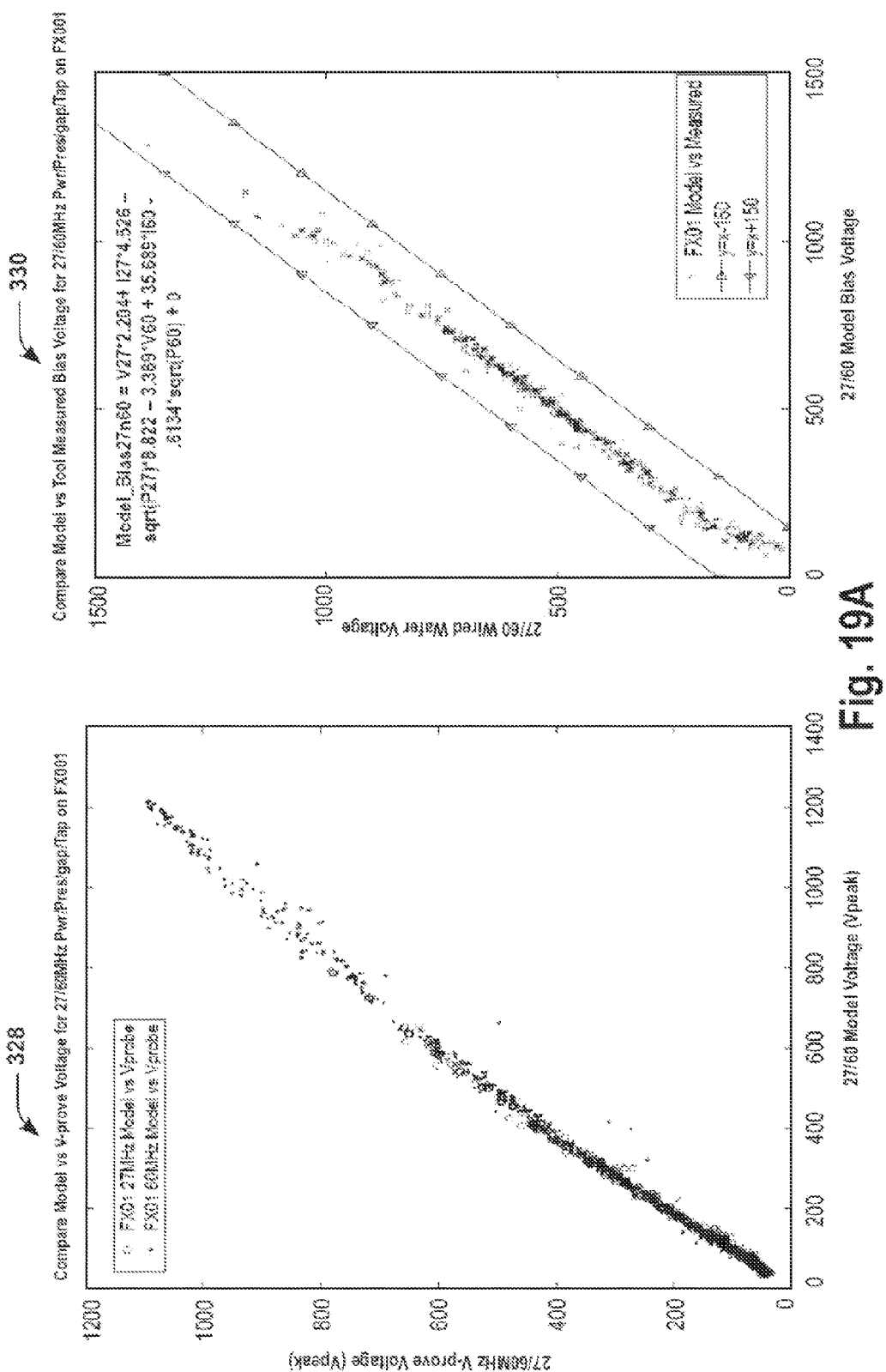
FIG. 19A show embodiments of graphs to illustrate a correlation between a variable that is measured at a node of the plasma system of FIG. 1 by using a voltage probe and a variable at a corresponding model node output determined using the method of FIG. 2, 13, 15, or 17 when the y and z MHz RF generators are on, in accordance with an embodiment described in the present disclosure.
Figure 19B:
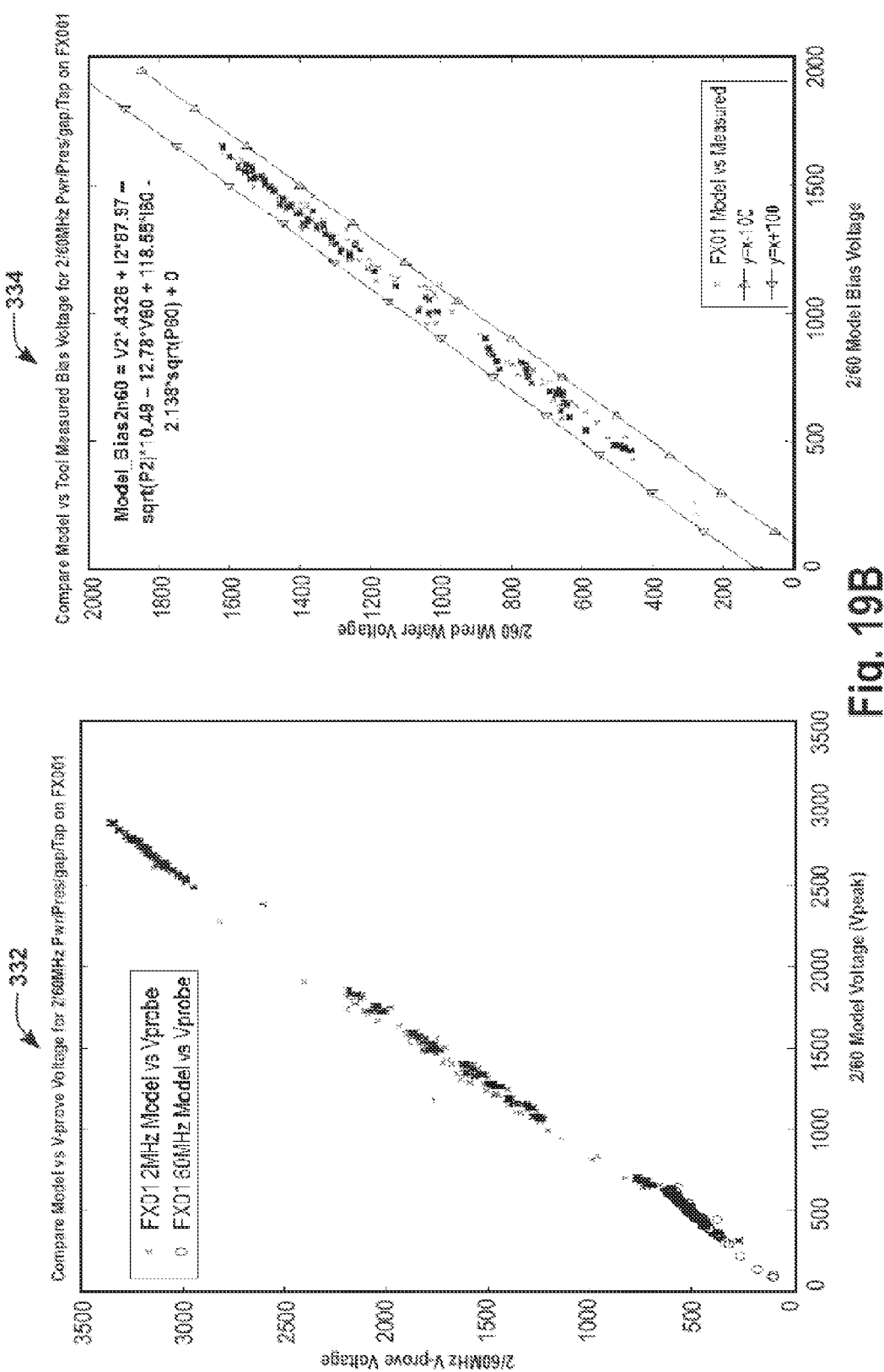
FIG. 19B show embodiments of graphs to illustrate a correlation between a variable that is measured at a node of the plasma system of FIG. 1 by using a voltage probe and a variable at a corresponding model node output determined using the method of FIG. 2, 13, 15, or 17 when the x and z MHz RF generators are on, in accordance with an embodiment described in the present disclosure.
Figure 19C:
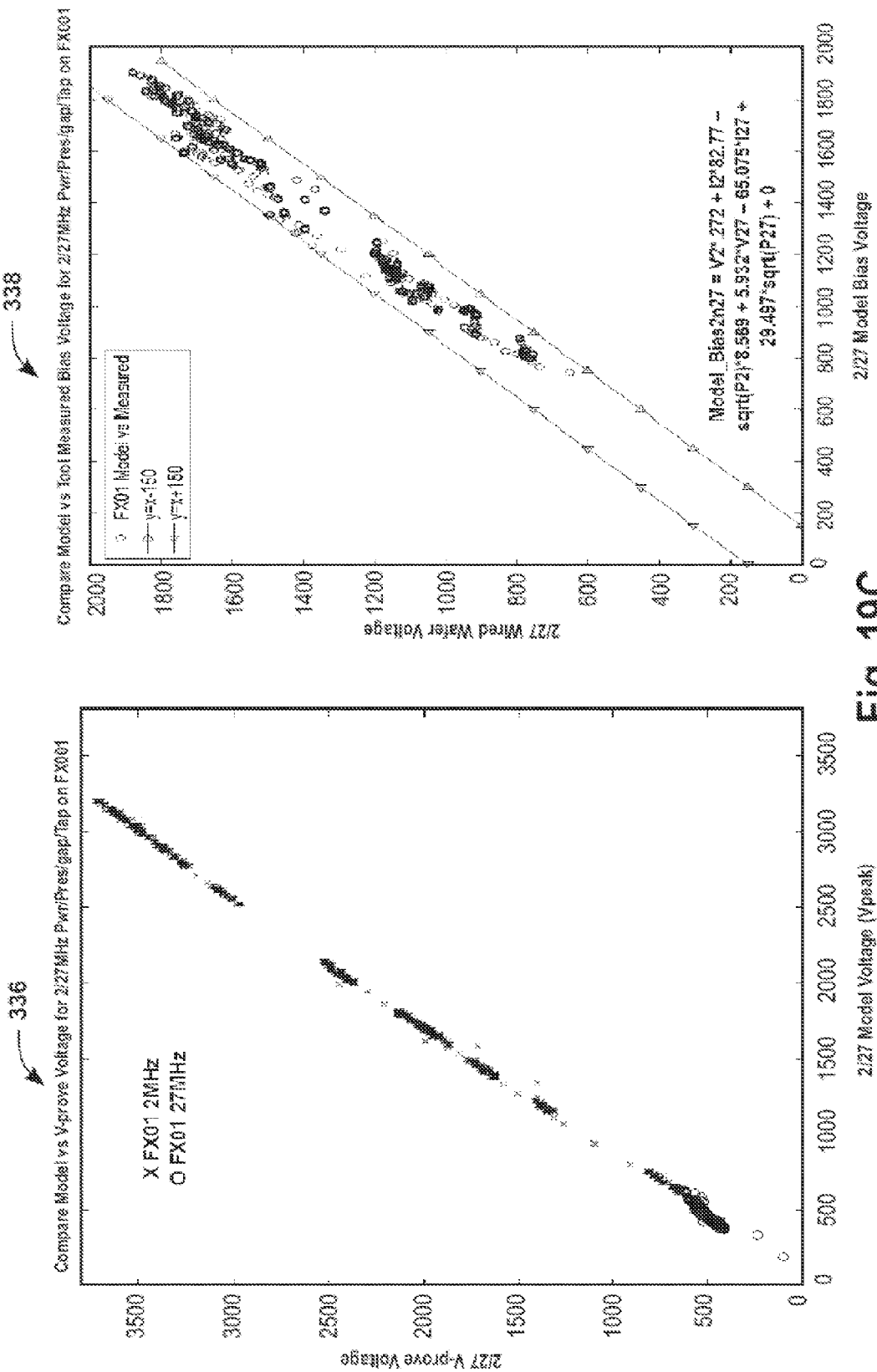
FIG. 19C show embodiments of graphs to illustrate a correlation between a variable that is measured at a node of the plasma system of FIG. 1 by using a voltage probe and a variable at a corresponding model node output determined using the method of FIG. 2, 13, 15, or 17 when the x and y MHz RF generators are on, in accordance with an embodiment described in the present disclosure.

FIGS. 19A, 19B, and 19C show embodiments of graphs 328, 332, and 336 to illustrate a correlation, e.g., a linear correlation, etc., between voltage, e.g., peak voltage, etc., that is measured at the output, e.g., the node N1, of the portion 195 (FIG. 1) by using a voltage probe and a voltage, e.g., peak voltage, etc., at a corresponding model node output, e.g., the node N1m, determined using the method 102 (FIG. 2). In each graph 328, 332, and 336, the measured voltage is plotted on a y-axis and the voltage determined using the method 102 is plotted on an x-axis.

Moreover, FIGS. 19A, 19B, and 19C show embodiments of graphs 330, 334, and 338 to illustrate a correlation, e.g., a linear correlation, etc., between wafer bias that is measured at the output N6 (FIG. 1) by using a wafer bias probe and wafer bias at a corresponding model node output, e.g., the node N6m, determined using the method 340 (FIG. 13), the method 351 (FIG. 15), or the method 363 (FIG. 17). In each graph 330, 334, and 338, the wafer bias determined using the wafer bias probe is plotted on a y-axis and the wafer bias determined using the method 340, the method 351, or the method 363 is plotted on an x-axis.

The voltages and wafer bias are plotted in the graphs 328 and 330 when the y MHz and z MHz RF generators are on and the x MHz RF generator is off. Moreover, the voltages and wafer bias are plotted in the graphs 332 and 334 when the x MHz and z MHz RF generators are on and the y MHz RF generator is off. Also, the voltages are plotted in the graphs 336 and 338 when the x MHz and y MHz RF generators are on and the z MHz RF generator is off.

Figure 20A:
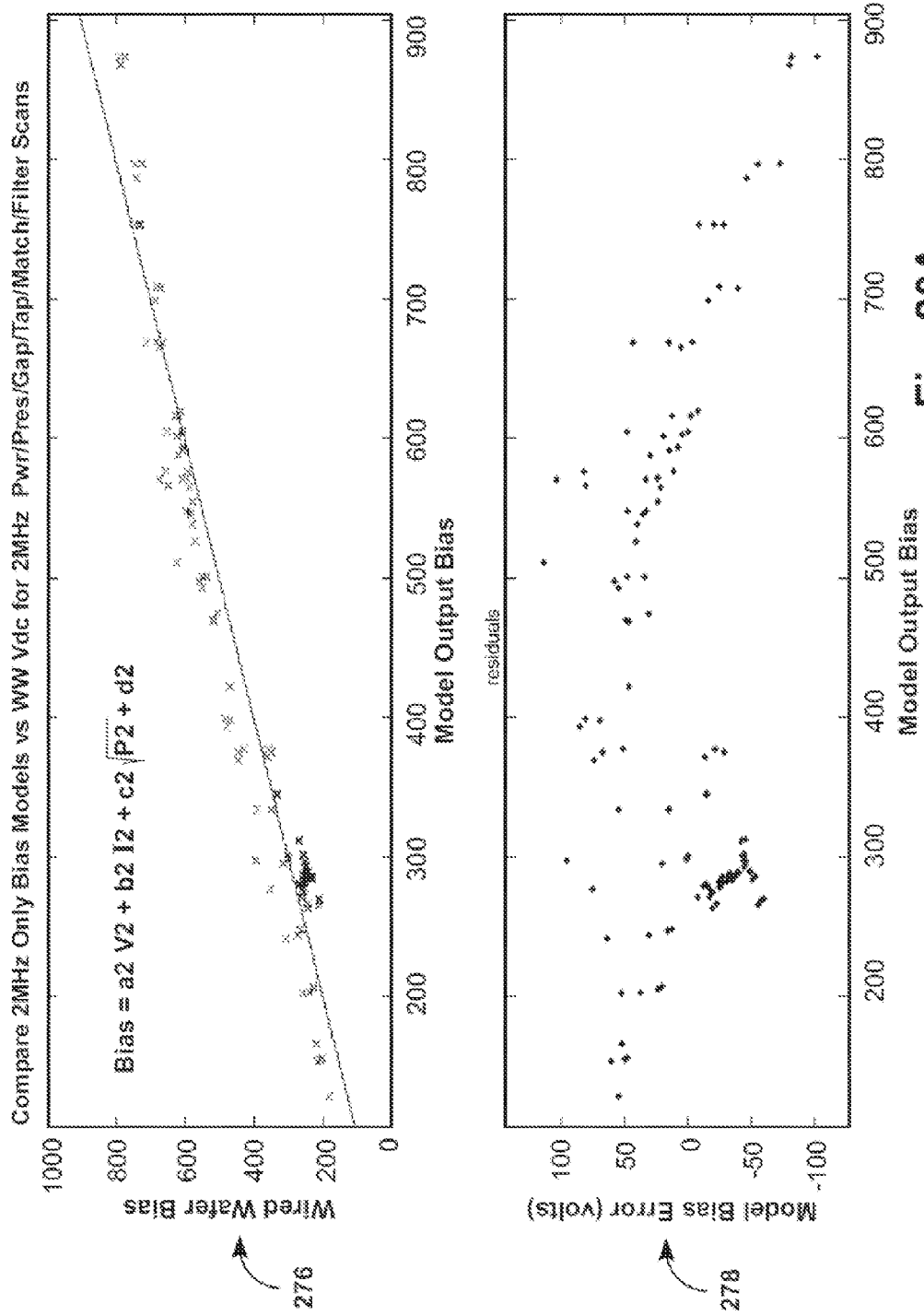
FIG. 20A is a diagram of graphs used to illustrate a correlation between a wired wafer bias measured using a sensor tool, a model wafer bias that is determined using the method of FIG. 13, 15, or 17 and an error in the model bias when the x MHz RF generator is on, in accordance with an embodiment described in the present disclosure.

FIG. 20A is a diagram of an embodiment of graphs 276 and 278 to illustrate that there is a correlation between a wired wafer bias measured using a sensor tool, e.g., a metrology tool, a probe, a sensor, a wafer bias probe, etc., a model wafer bias that is determined using the method 340 (FIG. 13), the method 351 (FIG. 15), or the method 363 (FIG. 17), and an error in the model bias. The wired wafer bias that is plotted in the graph 276 is measured at a point, e.g., a node on the RF transmission line 113, a node on the upper surface 183 (FIG. 1) of the ESC 177, etc. and the model bias that is plotted in the graph 276 is determined at the corresponding model point, e.g., the model node N4m, the model node N1m, the model node N2m, the model node N6m, etc. (FIG. 1), on the path 353 (FIG. 16). The wired wafer bias is plotted along a y-axis in the graph 276 and the model bias is plotted along an x-axis in the graph 276.

The wired wafer bias and the model bias are plotted in the graph 276 when the x MHz RF generator is on, and the y and z MHz RF generators are off. Moreover, the model bias of graph 276 is determined using an equation $a2*V2+b2*I2+c2*\sqrt{P2}+d2$, where "*" represents multiplication, "sqrt" represents a square root, "V2" represents voltage at the point along the path 353 (FIG. 16), I2 represents current at the point, P2 represents power at the point, "a2" is a coefficient, "b2" is a coefficient, "c2" is a coefficient, and "d2" is a constant value.

The graph 278 plots an error, which is an error in the model bias at the point, on a y-axis and plots the model bias at the point on an x-axis. The model error is an error, e.g., a variance, a standard deviation, etc., in the model bias. The model error and the model bias are plotted in the graph 278 when the x MHz RF generator is on and the y and z MHz RF generators are off.

Figure 20B:
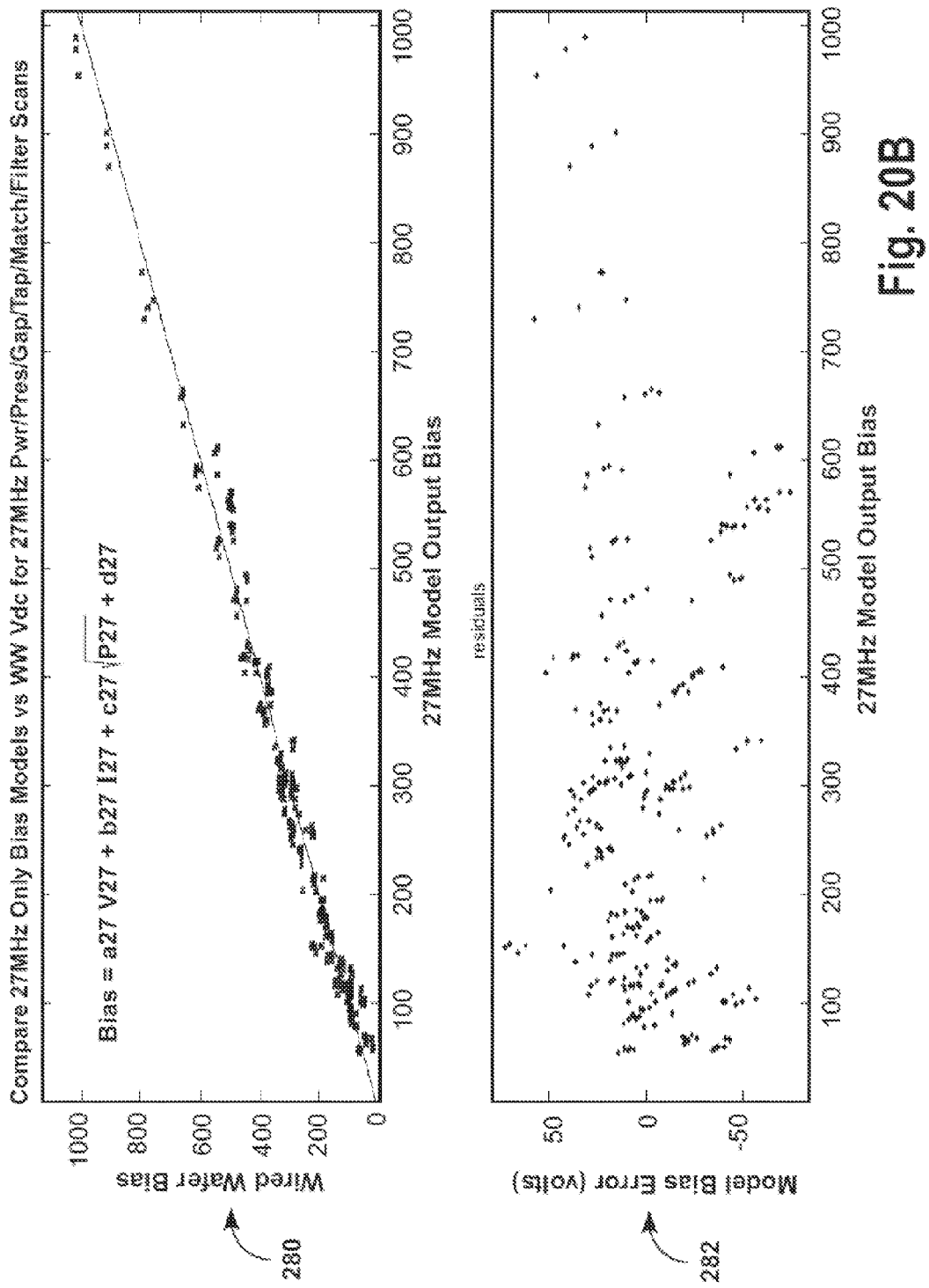
FIG. 20B is a diagram of graphs used to illustrate a correlation between a wired wafer bias measured using a sensor tool, a model bias that is determined using the method of FIG. 13, 15, or 17 and an error in the model bias when the y MHz RF generator is on, in accordance with one embodiment described in the present disclosure.

FIG. 20B is a diagram of an embodiment of graphs 280 and 282 to illustrate that there is a correlation between a wired wafer bias, a model bias that is determined using the method 340 (FIG. 13), the method 351 (FIG. 15) or method 363 (FIG. 17), and an error in the model bias. The graphs 280 and 282 are plotted in a manner similar to the graphs 276 and 278 (FIG. 17A) except that the graphs 280 and 282 are plotted when the y MHz RF generator is on and the x and z MHz RF generators are off. Moreover, the model bias of the graphs 280 and 282 is determined using an equation $a27*V27+b27*I27+c27*\sqrt{P27}+d27$, where "V27" represents a voltage magnitude at the point along the path 353 (FIG. 16), "I27" represents a current magnitude at the point, "P27" represents a power magnitude at the point, "a27" is a coefficient, "b27" is a coefficient, "c27" is a coefficient, and "d27" is a constant value.

Figure 20C:
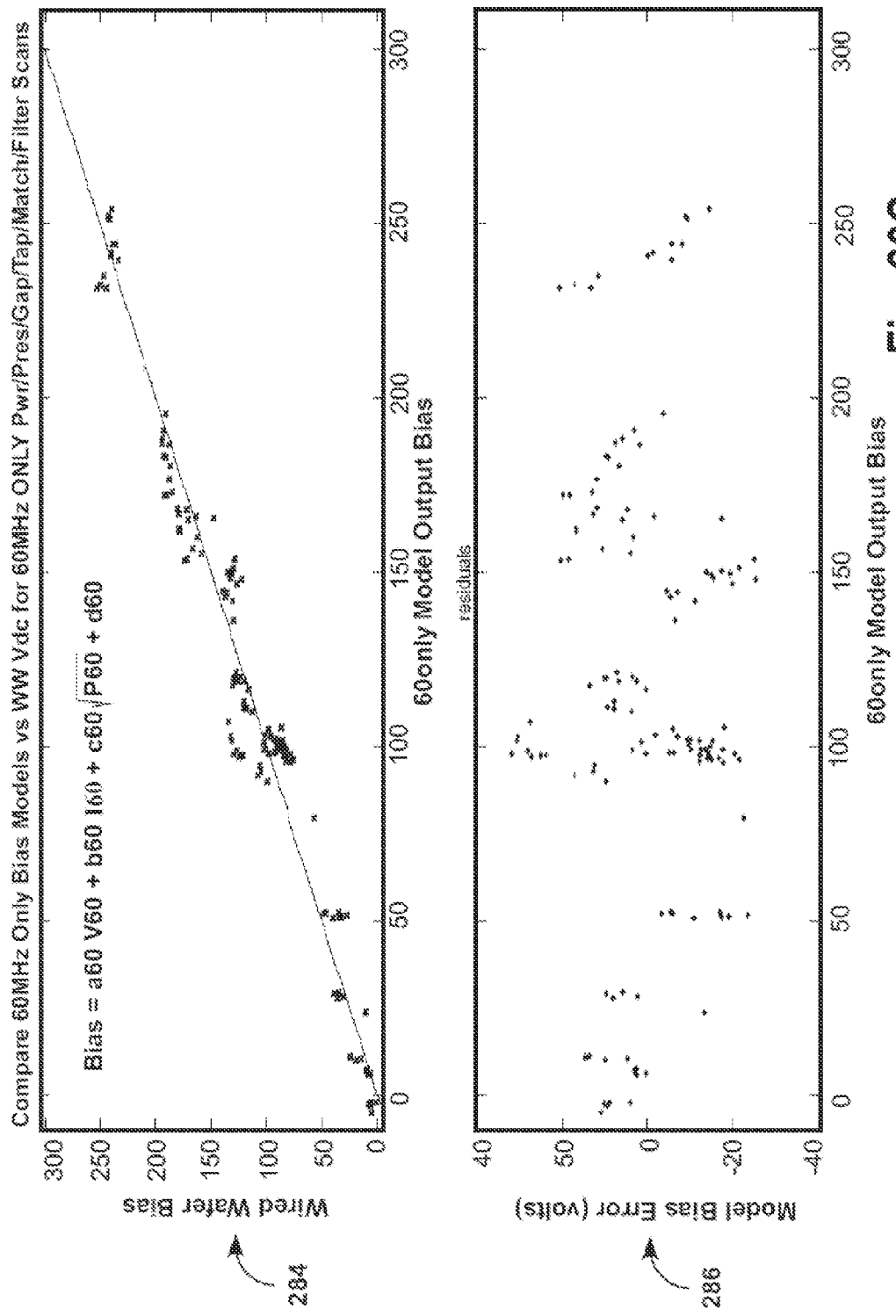
FIG. 20C is a diagram of embodiments of graphs used to illustrate a correlation between a wired wafer bias measured using a sensor tool, a model bias that is determined using the method of FIG. 13, 15, or 17 and an error in the model bias when the z MHz RF generator is on, in accordance with one embodiment described in the present disclosure.

FIG. 20C is a diagram of an embodiment of graphs 284 and 286 to illustrate that there is a correlation between a wired wafer bias, a model bias that is determined using the method 340 (FIG. 13), the method 351 (FIG. 15) or method 363 (FIG. 17), and an error in the model bias. The graphs 284 and 286 are plotted in a manner similar to the graphs 276 and 278 (FIG. 17A) except that the graphs 284 and 286 are plotted when the z MHz RF generator is on and the x and y MHz RF generators are off. Moreover, the model bias of the graphs 284 and 286 is determined using an equation $a60*V60+b60*I60+c60*\sqrt{P60}+d60$, where "V60" represents a voltage magnitude at the point along the path 353 (FIG. 16), "I60" represents a current magnitude at the point, "P60" represents a power magnitude at the point, "a60" is a coefficient, "b60" is a coefficient, "c60" is a coefficient, and "d60" is a constant value.

Figure 20D:
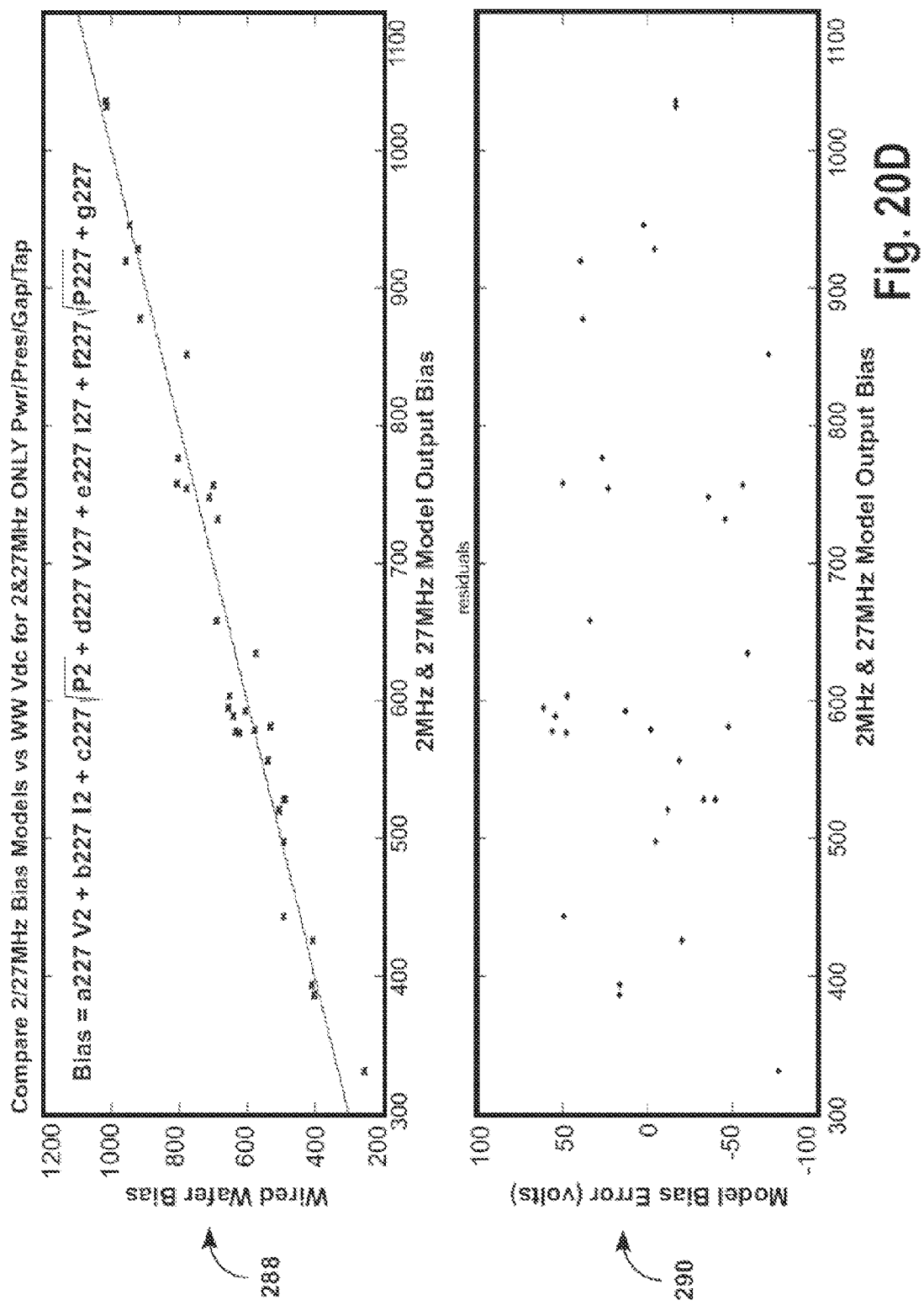
FIG. 20D is a diagram of graphs used to illustrate a correlation between a wired wafer bias measured using a sensor tool, a model bias that is determined using the method of FIG. 13, 15, or 17 and an error in the model bias when the x and y MHz RF generators are on, in accordance with an embodiment described in the present disclosure.

FIG. 20D is a diagram of an embodiment of graphs 288 and 290 to illustrate that there is a correlation between a wired wafer bias, a model bias that is determined using the method 340 (FIG. 13), the method 351 (FIG. 15) or method 363 (FIG. 17), and an error in the model bias. The graphs 288 and 290 are plotted in a manner similar to the graphs 276 and 278 (FIG. 20A) except that the graphs 288 and 290 are plotted when the x and y MHz RF generators are on, and the z MHz RF generator is off. Moreover, the model bias of the graphs 288 and 290 is determined using an equation $a227*V2+b227*I2+c227*\sqrt{P2}+d227*V27+e227*I27+f227*\sqrt{P27}+g227$, where "a227", "b227" and "c227", "d227", "e227" and "f227" are coefficients, and "g227" is a constant value.

Figure 20E:
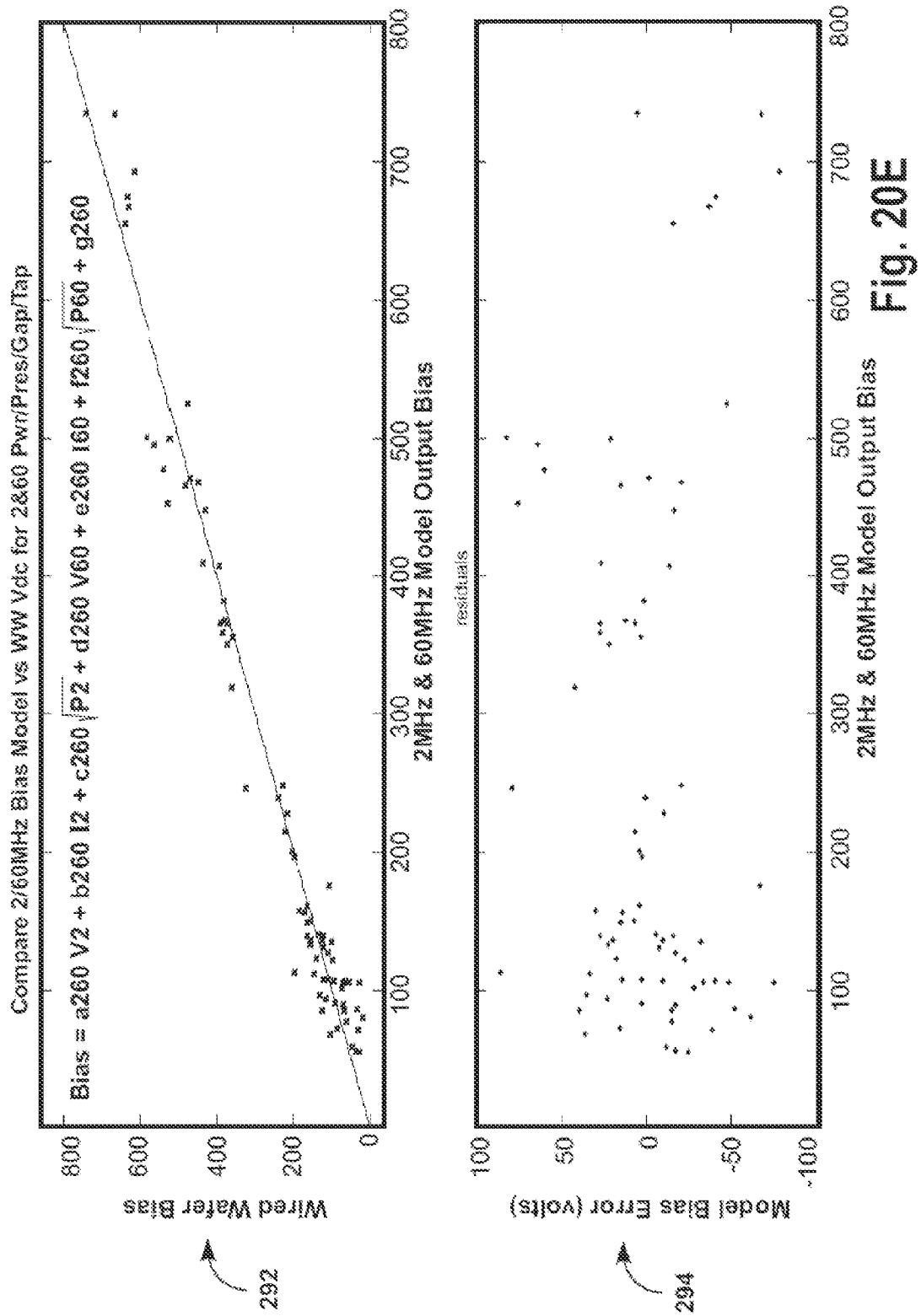
FIG. 20E is a diagram of graphs used to illustrate a correlation between a wired wafer bias measured using a sensor tool, a model bias that is determined using the method of FIG. 13, 15, or 17 and an error in the model bias when the x and z MHz RF generators are on, in accordance with an embodiment described in the present disclosure.

FIG. 20E is a diagram of an embodiment of graphs 292 and 294 to illustrate that there is a correlation between a wired wafer bias, a model bias that is determined using the method 340 (FIG. 13), the method 351 (FIG. 15) or method 363 (FIG. 17), and an error in the model bias. The graphs 292 and 294 are plotted in a manner similar to the graphs 276 and 278 (FIG. 20A) except that the graphs 292 and 294 are plotted when the x and z MHz RF generators are on, and the y MHz RF generator is off. Moreover, the model bias of the graphs 292 and 294 is determined using an equation $a260*V2+b260*I2+c260*\sqrt{P2}+d20*V60+e260*I60+f260*\sqrt{P60}+g260$, where "a260", "b260" "c260", "d260", "e260" and "f260" are coefficients, and "g260" is a constant value.

Figure 20F:
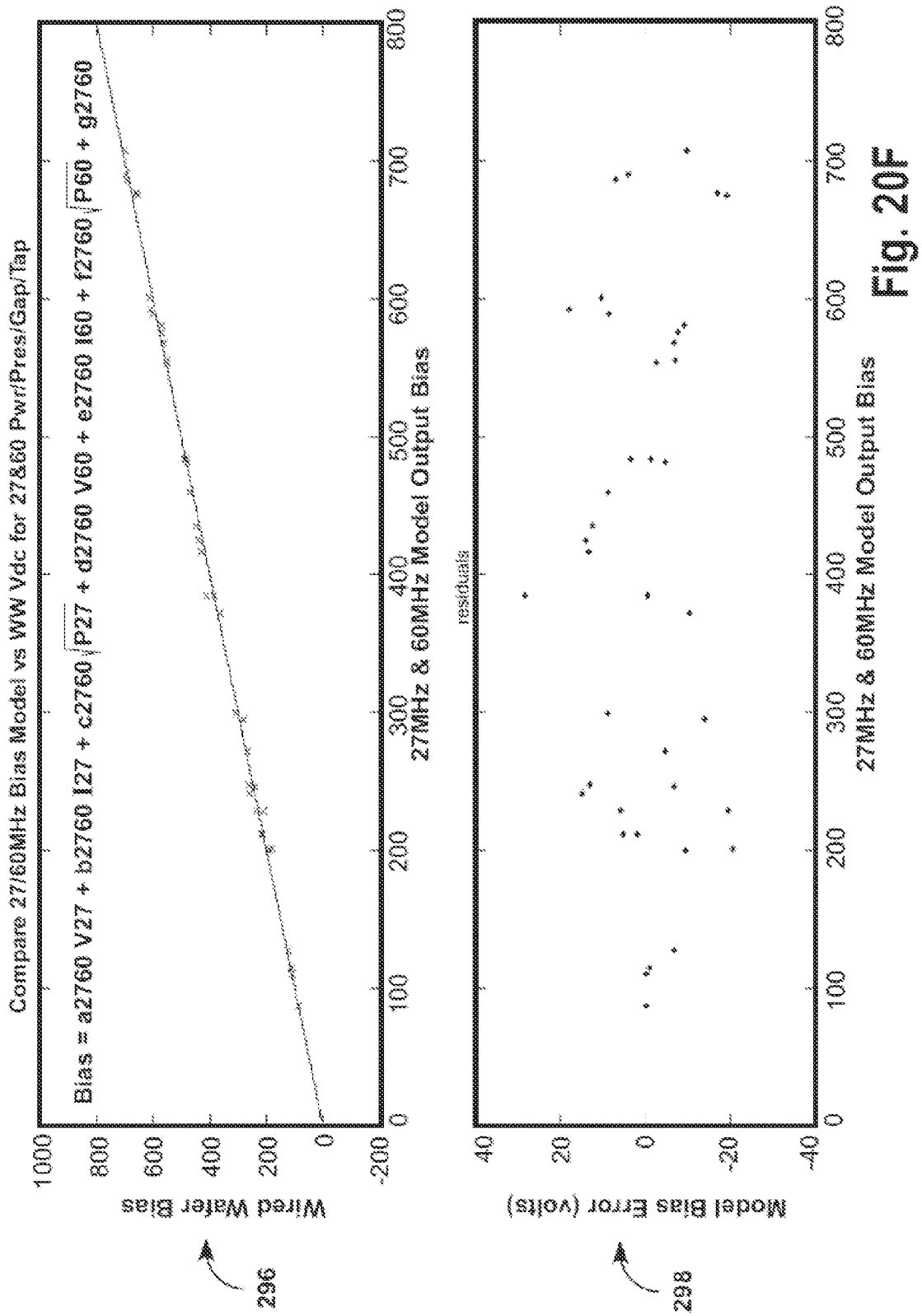
FIG. 20F is a diagram of graphs used to illustrate a correlation between a wired wafer bias measured using a sensor tool, a model bias that is determined using the method of FIG. 13, 15, or 17 and an error in the model bias when the y and z MHz RF generators are on, in accordance with an embodiment described in the present disclosure.

FIG. 20F is a diagram of an embodiment of graphs 296 and 298 to illustrate that there is a correlation between a wired wafer bias, a model bias that is determined using the method 340 (FIG. 13), the method 351 (FIG. 15) or method 363 (FIG. 17), and an error in the model bias. The graphs 296 and 298 are plotted in a manner similar to the graphs 276 and 278 (FIG. 20A) except that the graphs 296 and 298 are plotted when the y and z MHz RF generators are on, and the x MHz RF generator is off. Moreover, the model bias of the graphs 296 and 298 is determined using an equation $a2760*V27+b2760*I27+c2760*\text{sqrt}(P27)+d2760*V60+e2760*I60+f2760*\text{sqrt}(P60)+g2760$, where "a2760", "b2760" "c2760", "d2760", "e2760" and "f2760" are coefficients, and "g2760" is a constant value.

Figure 20G:
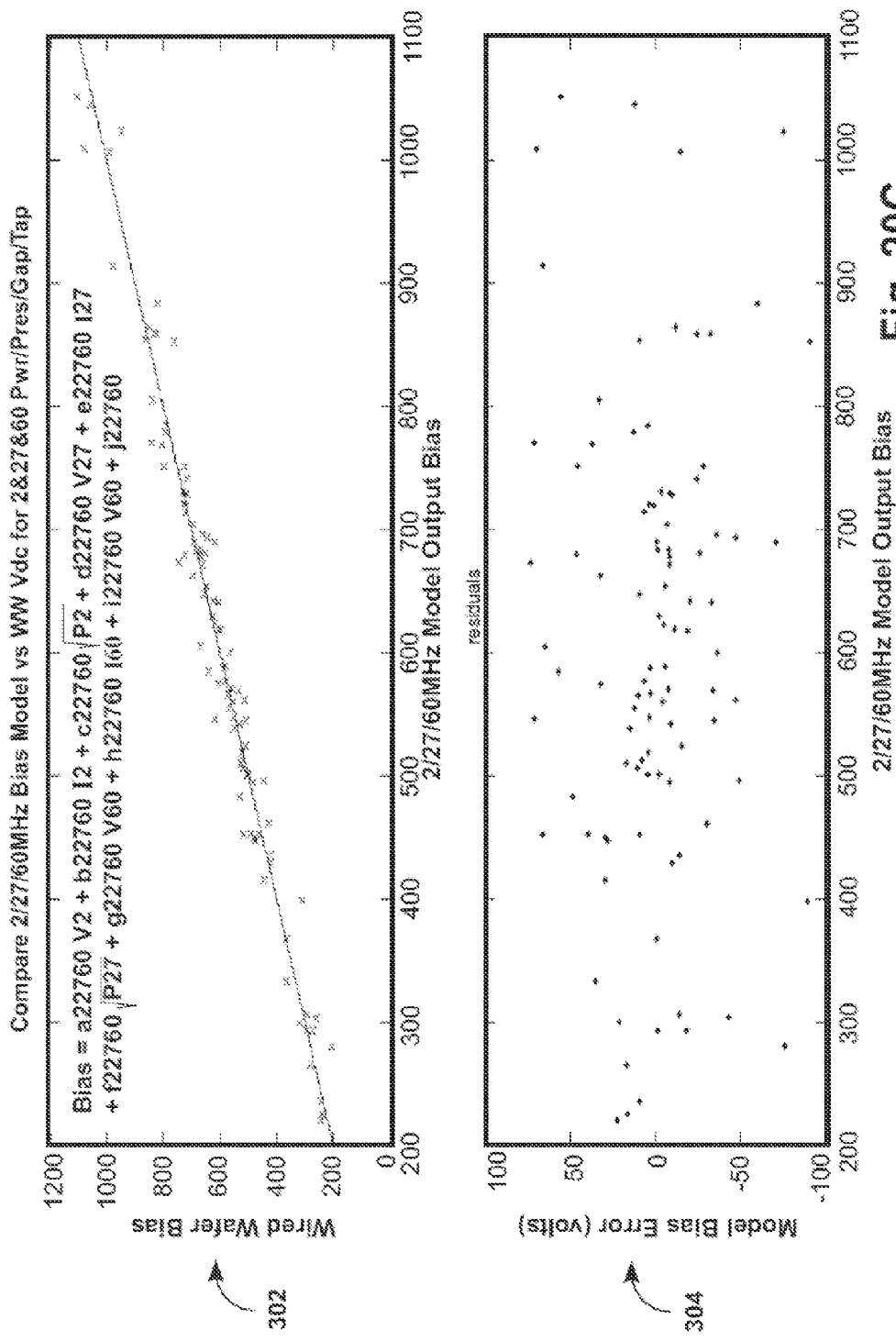
FIG. 20G is a diagram of graphs used to illustrate a correlation between a wired wafer bias measured using a sensor tool, a model bias that is determined using the method of FIG. 13, 15, or 17 and an error in the model bias when the x, y, and z MHz RF generators are on, in accordance with an embodiment described in the present disclosure.

FIG. 20G is a diagram of an embodiment of graphs 302 and 304 to illustrate that there is a correlation between a wired wafer bias, a model bias that is determined using the method 340 (FIG. 13), the method 351 (FIG. 15) or method 363 (FIG. 17), and an error in the model bias. The graphs 302 and 304 are plotted in a manner similar to the graphs 276 and 278 (FIG. 20A) except that the graphs 302 and 304 are plotted when the x, y and z MHz RF generators are on. Moreover, the model bias of the graphs 302 and 304 is determined using an equation $a22760*V2+b22760*I2+c22760*\text{sqrt}(P2)+d22760*V60+e22760*I60+f22760*\text{sqrt}(P60)+g22760*V27+h22760*I27+i22760*\text{sqrt}(P27)+j22760$, where "a22760", "b22760", "c22760", "d22760", "e22760", "f22760" "g22760", "h22760", and "i22760" are coefficients and "j22760" is a constant value.

Figure 21:
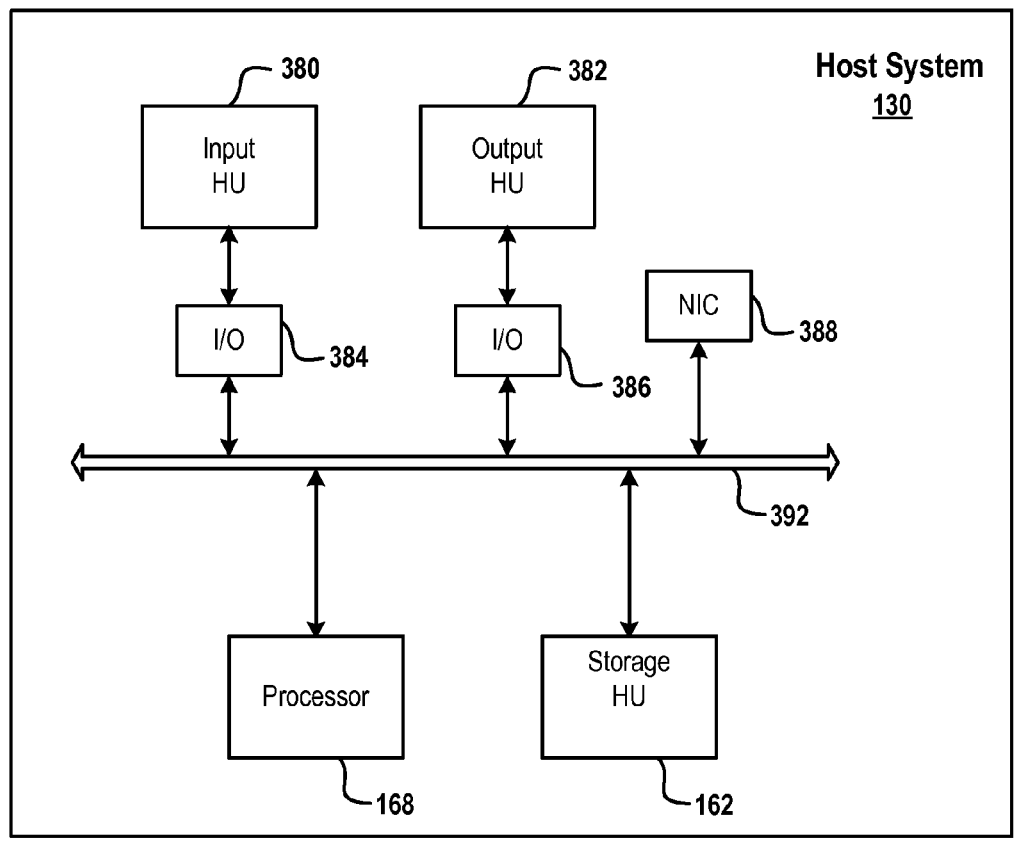
FIG. 21 is a block diagram of a host system of the system of FIG. 1, in accordance with an embodiment described in the present disclosure.

FIG. 21 is a block diagram of an embodiment of the host system 130. The host system 130 includes a processor 168, the storage HU 162, an input HU 380, an output HU 382, an input/output (I/O) interface 384, an I/O interface 386, a network interface controller (NIC) 388, and a bus 390. The processor 168, the storage HU 162, the input HU 380, the output HU 382, the I/O interface 384, the I/O interface 386, and the NIC 388 are coupled with each other via a bus 392. Examples of the input HU 380 include a mouse, a keyboard, a stylus, etc. Examples of the output HU 382 include a display, a speaker, or a combination thereof. The display may be a liquid crystal display, a light emitting diode display, a cathode ray tube, a plasma display, etc. Examples of the NIC 388 include a network interface card, a network adapter, etc.

Examples of an I/O interface include an interface that provides compatibility between pieces of hardware coupled to the interface. For example, the I/O interface 384 converts a signal received from the input HU 380 into a form, amplitude, and/or speed compatible with the bus 392. As another example, the I/O interface 386 converts a signal received from the bus 392 into a form, amplitude, and/or speed compatible with the output HU 382.

RF Power Compensation

Each plasma processing system manufactured for the same process should ideally be identical in performance. The identical performance would allow the user to perform precisely equal processes in each of the plasma chambers and produce precisely equal results across the multiple plasma processing systems using the same input process settings, e.g., process recipe, on each of the multiple plasma processing systems. Unfortunately, production variations in electrical components and physical configuration of each of the plasma processing systems results in non-identical performance. This non-identical performance can result in, for example, non-identical RF power applied to the wafer in each plasma processing system with the same input process settings of frequency, power, pressure, temperature, chemistries, etc.

One approach is to perform a test, such as an etch rate test, on each plasma processing system. The etch rate test includes applying a test/certification etch process including the process settings of frequency, power, pressure, temperature, chemistry, etc., to at least one wafer, more preferably multiple wafers, in each plasma processing system. The etch rates for each plasma processing system can be determined by measuring the amount of material removed in each plasma processing system.

The input process settings can then be changed to increase RF power for a plasma processing system having a lower than desired etch rate. Similarly, the input process settings can then be changed to decrease RF power for a plasma processing system having a higher than desired etch rate. This approach to power compensation is very time consuming and resource consuming. Further, this approach to power compensation requires multiple, manual adjustments to the input process settings for each of the recipes and processes used for each of the plasma processing systems. The etch rate test typically produces an accuracy of about +/−4 to about +/−10 percent. This accuracy is insufficient for many processes. The etch rate test-based adjustments are also not sufficiently accurate in part, because the etch rate test does not measure the actual power applied to the wafer, but merely the results, e.g., the etch rate, of the RF power applied to the wafer. The etch rate test approach to power compensation can also only be performed after the plasma processing system is installed and operational and can inadvertently mask or hide problems such as component failures in the plasma processing system.

The RF power can be adjusted to compensate for variations in the RF transmission and return path using an accurate model of the RF transmission and return path. In one implementation, the plasma processing system controller can include a RF power compensation logic that can automatically adjust one or more input process settings. Such an implementation would free the user from manually adjusting each of the input process settings, e.g., plasma process recipes, for each plasma processing system. Thereby yielding a more repeatable process results within about 1 percent across multiple plasma processing systems.

It is difficult to reliably measure the RF power applied to the wafer during a plasma process as any probe or instrument placed within the plasma or on the top surface of the wafer, will affect the plasma process itself and the corresponding measured Vrf values. Vdc can be calculated from the Vrf and the Irf. The power applied to the wafer is known to be a function of the Vrf, Irf and phase ϕ of the RF, if the equivalent RLC series and RLC shunt values for the electrostatic chuck (ESC) and the RF return path.

The stages of components between the output(s) of RF generator(s) and the input of electrostatic chuck (ESC) can be modeled in their equivalent RLC series and RLC shunt values. The accuracy of the resulting RF model can be confirmed by measuring input and output signals of each stage. Unfortunately, the ESC and the RF return path cannot be accurately modeled in equivalent RLC series and RLC shunt values due to the complexity of the ESC construction and the RF return path.

One implementation estimates the equivalent RLC series and RLC shunt values for the ESC and the RF return path. Each of the estimates the equivalent RLC series and RLC shunt values can be within a selected range. The combinations of the estimated equivalent RLC series and RLC shunt values can then tested to identify a best fitting selection of equivalent RLC series and RLC shunt values. As a result, many thousands of combinations of the estimated equivalent RLC series and RLC shunt values are identified.

Calculating the RF model predicted Vdc includes adding the each of the combinations of the estimated equivalent RLC series and RLC shunt values for the ESC to the RF model representing the stages between the RF generator outputs and the input to the ESC to produce a RF delivery system model. An RF value is input to the RF delivery system model and a model predicted Vdc is produced. Unfortunately, the RF delivery system model is very complex and needs to be simplified to allow relatively timely testing of all of the combinations of the equivalent RLC series and RLC shunt values.

Figure 22:
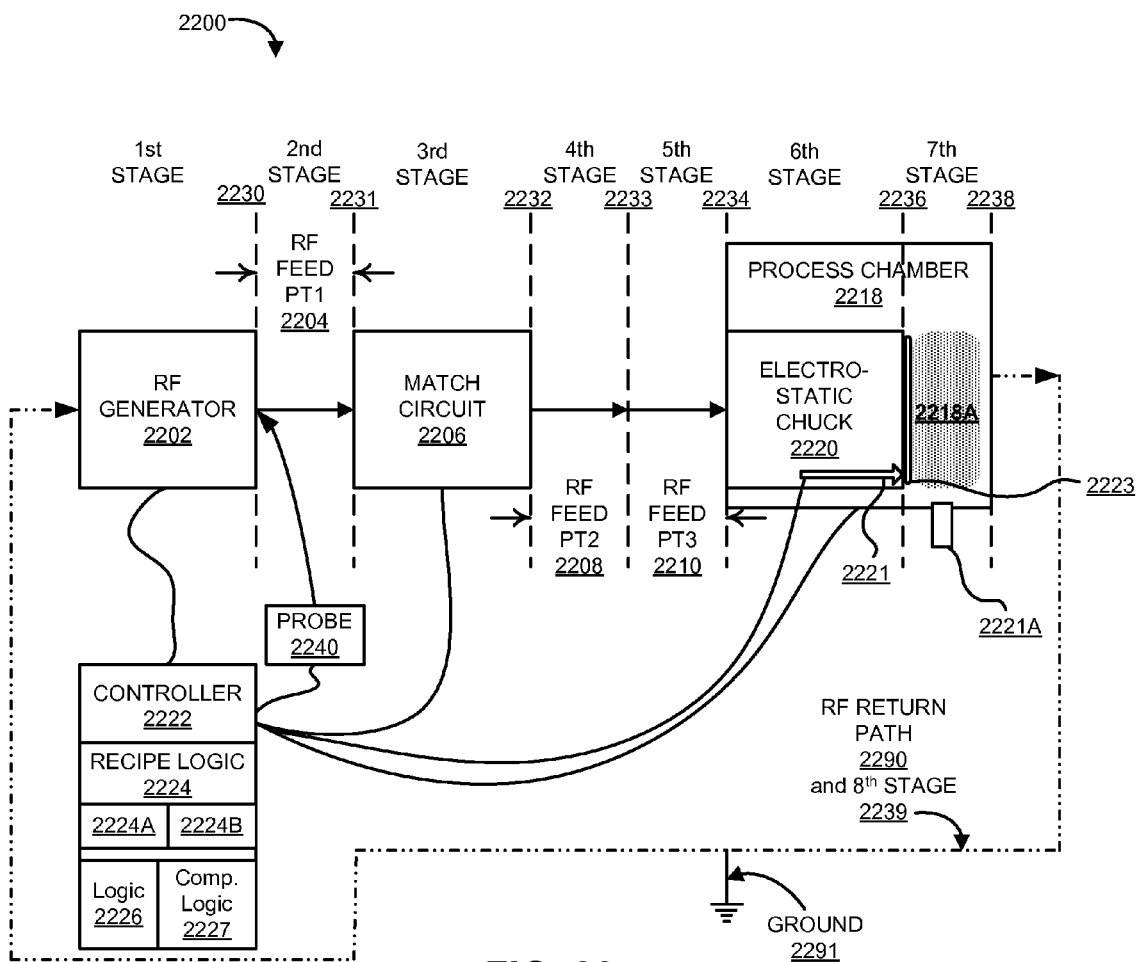
FIG. 22 is a block diagram of the RF transmission system, in accordance with an embodiment described in the present disclosure.

FIG. 22 is a block diagram of the RF transmission system 2200, in accordance with an embodiment described in the present disclosure. The RF transmission system 2200 includes one or more RF generators 2202. The respective outputs of the RF generators 2202 are coupled to inputs of corresponding match circuits 2206 by an RF feed part one 2204 (e.g. RF tunnel). The outputs of the match circuit(s) 2206 are coupled by RF feed part two 2208 (e.g., an RF strap) and part three 2210 (e.g., a cylindrical RF feed) to an electrostatic chuck 2220 disposed in the process chamber 2218. A test probe 2240 such as an RF probe or other voltage or current probe is often connected to the output of the RF generator 2202 to monitor the output of the RF generator. A voltage/current (V/I) probe 2221 is included in the electrostatic chuck to measure the RF induced DC bias voltage that is induced on a wafer 2223 by the RF in the plasma 2218A.

A controller 2222 includes recipe logic 2224 including the calibration recipe 2224A and other recipes 2224B for processing wafers in the process chamber 2218. The controller 2222 is coupled to the one or more RF generators 2202 and provides the respective one or more RF control signals to each RF generator. The controller 2222 can also include additional operational recipes and logic 2226 including RF power compensation logic 2227. The RF power compensation logic 2227 automatically adjusts one or more settings in a plasma process recipe as may be required to compensate for variations in the RF transmission path and return path between different plasma processing systems. The RF power compensation logic 2227 can adjust settings in RF power output from the one more RF generators 2202 and/or impedance of the match circuit 2206 and/or a pressure, temperature, chemistry, etc., and combinations thereof, in an adjusted plasma process recipe used to control the plasma processing system.

The RF transmission system 2200 is shown divided into eight stages 2230-2239. At least a portion of the eight stages 2230-2239 can correspond to test points in the RF transmission system or separate components (e.g., RF generator, 2202, match circuit 2206, RF feed, electrostatic chuck 2220). Alternatively, the stages 2230-2239 can correspond to selected electrical components within one or more of the RF generator, 2202, match circuit 2206, RF feed, electrostatic chuck 2220.

As shown, a first stage includes the RF generator(s) 2202. A second stage begins at first test point at the output 2230 of the RF generator 2202 and includes RF feed part one 2204 (e.g., an RF tunnel) extending to a second test point at the input 2231 of the match circuit 2206. The match circuit 2206 including the internal resistive, capacitive and inductive (RCL) components forms the third stage with a third test point at the output of the match circuit.

A fourth stage of the RF transmission system 2200 begins at the output 2232 of the match circuit 2206 and includes the RF feed part two 2208 (e.g., an RF strap) and continues to a fourth test point 2233 at an intermediate point in the RF feed such as where the RF strap connects to the RF feed part three 2210 (e.g., circumferential RF feed). A fifth stage begins at the fourth test point 2233 and includes the RF feed part three 2210 (e.g., circumferential RF feed) and continues to a fifth test point at an input 2234 of the electrostatic chuck 2220.

The electrostatic chuck 2220 and the components and structures therein form the sixth stage which ends at the top surface 2236 of the electrostatic chuck. The seventh stage 2238 includes the plasma 2218A and the eighth stage 2239 includes the RF return path 2290. As discussed elsewhere herein, the dynamic nature of the plasma 2218A is very difficult to accurately model. Various instruments can detect dynamic parameters of the process such as RF induced DC bias voltage that is induced into the wafer 2223 by the RF present in the plasma 2218A.

It should be understood that dividing the RF transmission system 2200 into eight stages is merely an example for description purposes and the RF transmission system can be divided into more or fewer than eight stages. By way of example, the probe 2240 can monitor the output of the RF generator 2202 and couple the measured output to the controller 2222 or other sources such as an external monitoring system (not shown).

Each of stages 2230-2235 of the RF transmission system 2200 can be simplified to an equivalent series RLC and shunt RLC circuits. The corresponding RLC values can then be used to create a mathematical model of the selected portion of the RF transmission system, as described in more detail above. The RF transmission line model can then be used to predict an output corresponding to a given input of each stage of the RF transmission system 2200. The equivalent series RLC and shunt RLC circuits of each of the stages 2230-2235 can be verified empirically by measuring actual inputs and outputs of each stage and comparing the measured values to the values predicted by the equivalent series RLC and shut RLC circuits. By way of example, the probe 2240 and the V/I probe 2221 and other instruments can monitor the actual RF transmission system 2200 during operational processes such as during a configuration recipe to confirm the accuracy of the various values at the corresponding test points that were predicted RF transmission line model. As the accuracy of each modeled stage 2230-2235 of the RF transmission system is confirmed, the overall accuracy of the RF transmission line model of the RF transmission system, from the RF generator 2202 through to the input of the electrostatic chuck 2210 is increased.

Figure 23:
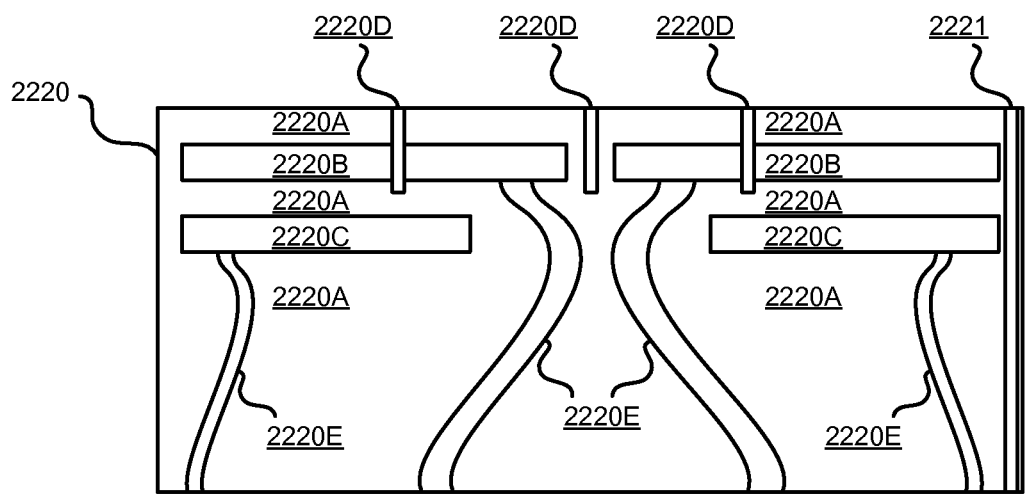
FIG. 23 is a simplified diagram of the electrostatic chuck, in accordance with an embodiment described in the present disclosure.

FIG. 23 is a simplified diagram of the electrostatic chuck 2220, in accordance with an embodiment described in the present disclosure. Unfortunately, the electrostatic chuck 2220 is very complex structure including multiple non-conductive layers 2220A, multiple conductive structures 2220B, lift pins 2220D, conductive cables 2220E, instruments such as V/I probe 2221 and in some instances active components such as heaters 2220C and cooling channels and chambers. As a result of the physical complexity of the electrostatic chuck 2220, it is very difficult to simplify the electrostatic chuck to an equivalent series RLC and shunt RLC circuits. It is theoretically possible to calculate an RF model of the electrostatic chuck 2220 based on the equivalent series RLC and shunt RLC circuit, however, the computational requirements are very large and time consuming and thus are relatively impractical for use for monitoring and controlling plasma 2218A within the plasma process chamber 2218.

Further, the plasma processes conducted in the plasma process chamber 2218 form the plasma 2218A between the electrostatic chuck and a second electrode. As the plasma process is executed many aspects of the plasma 2218A such as pressure, process gas mixtures and concentrations, temperatures, plasma byproduct content of the plasma, vary dynamically. As the various parameters of the plasma 2218A vary dynamically, the impedance of the plasma also varies dynamically. Further, adding an RF probe to the plasma 2218A changes the plasma rendering it very difficult to accurately measure the RF and other aspects of the plasma during the dynamic plasma process. As the impedance of the plasma 2218A varies, the voltages and currents induced into the electrostatic chuck 2220 also vary. As a result, it is very difficult to calculate a useful, accurate RF model of the electrostatic chuck 2220 using the above described approaches to modeling each stage of the RF transmission system 2200.

The RF return path 2290 is a complex path as the RF return signal is coupled through many different structures and components within the plasma process chamber 2218 and external from the plasma process chamber to the return terminal of the RF generator 2202. As a result, the RF return path 2290 can also be difficult to model with equivalent representative shunt and series RLC circuits. The RF return path 2290 is shown tied to ground potential 2291 as an example implementation only and it should be understood that the RF return path may or may not be tied to a ground potential.

The stages 2230-2235 of the RF transmission system 2200 from the RF generator 2202 to the input to the electrostatic chuck 2220 can be accurately modeled as described above. Unfortunately, the equivalent series and shunt RLC circuit model of the entire RF transmission system 2200, including the electrostatic chuck 2220, the plasma 2218A and the RF return path 2290 cannot be accurately modeled using the above described techniques.

Figure 24:
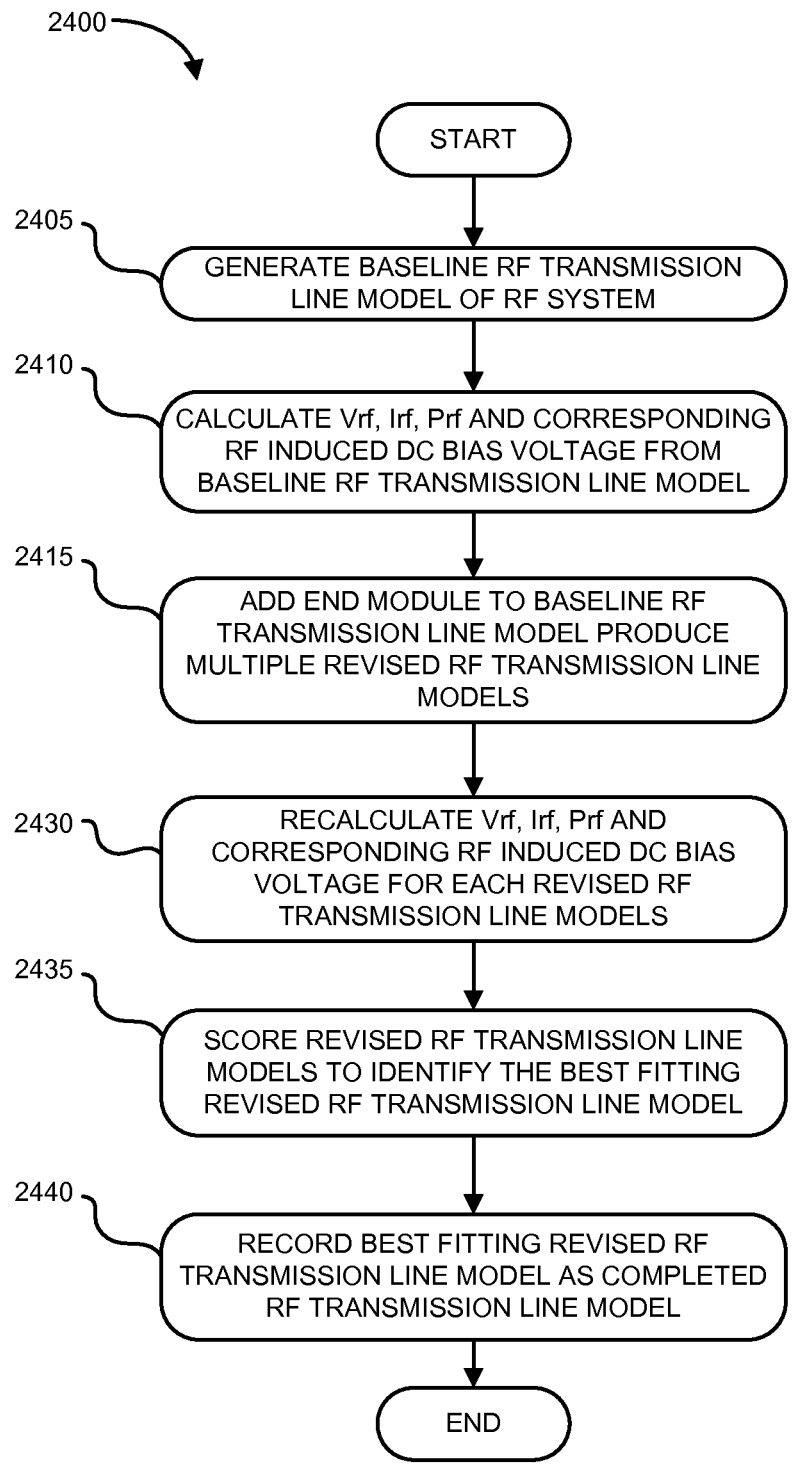
FIG. 24 is a flowchart of the method operations for determining an RF transmission line model for the electrostatic chuck, the plasma and the RF return path, in accordance with an embodiment described in the present disclosure.

FIG. 24 is a flowchart of the method operations 2400 for determining an RF transmission line model for the electrostatic chuck 2220, the plasma 2218A and the RF return path 2290, in accordance with an embodiment described in the present disclosure. Determining the RF transmission line model for the electrostatic chuck 2220, the plasma 2218A and the RF return path 2290 will improve the accuracy of the RF transmission line model of the entire RF transmission system 2200.

In an operation 2405, a baseline RF transmission line model for the RF transmission system stages 223-2235 is generated as described in more detail above. One use of the RF transmission line model is to predict the voltage of the RF in the plasma (Vrf), a current of the RF in the plasma (Irf) and power of the RF in the plasma (Prf) as these values cannot be directly measured. The predicted Vrf, Irf and Prf values can be used to predict a predicted RF induced DC bias voltage using the RF transmission line model. During plasma processes, the actual RF induced DC bias voltage can be measured on the surface of the wafer 2223 with voltage probe 2221.

In an operation 2410, a predicted baseline Vrf, baseline Irf and baseline Prf are determined using the baseline RF transmission line model and several input conditions. The predicted baseline Vrf, baseline Irf and baseline Prf are then used calculate a corresponding predicted baseline RF induced DC bias voltage.

The predicted baseline RF induced DC bias voltage is then compared to an actually measured RF induced DC bias voltage. A baseline model error is defined as the differences between the predicted baseline RF induced DC bias voltage and the actually measured RF induced DC bias voltage. In one example, the baseline model error can be as much as about 10 percent. An accuracy of less than a 10 percent error rate is preferred. The error rate is caused in part by the baseline RF transmission line model not including accurate, equivalent series and shunt RLC circuits for the electrostatic chuck 2220, the plasma 2218A and the RF return path 2290.

In an operation 2415, an end module having the equivalent series and shunt RLC circuits corresponding to the electrostatic chuck 2220, the plasma 2218A and the RF return path 2290 is added to the baseline RF transmission line model to create multiple, revised RF transmission line models. Adding the end module includes identifying RLC values for the equivalent series and shunt RLC circuits for the electrostatic chuck 2220, the plasma 2218A and the RF return path 2290 as described in more detail in FIGS. 25 and 26. Each of the revised RF transmission line models corresponds to one of the local minimums identified in FIGS. 25 and 26.

In an operation 2430, the V'rf, I'rf and P'rf is calculated using each of the revised RF transmission line models. In an operation 2435, the V'rf, I'rf and P'rf of each of the revised RF transmission line models is scored to identify a best fitting one of the revised RF transmission line models as described in FIG. 27. The best fitting one of the revised RF transmission line models is recorded in operation 2440 as a completed RF transmission line model and the method operations can end.

Figure 25:
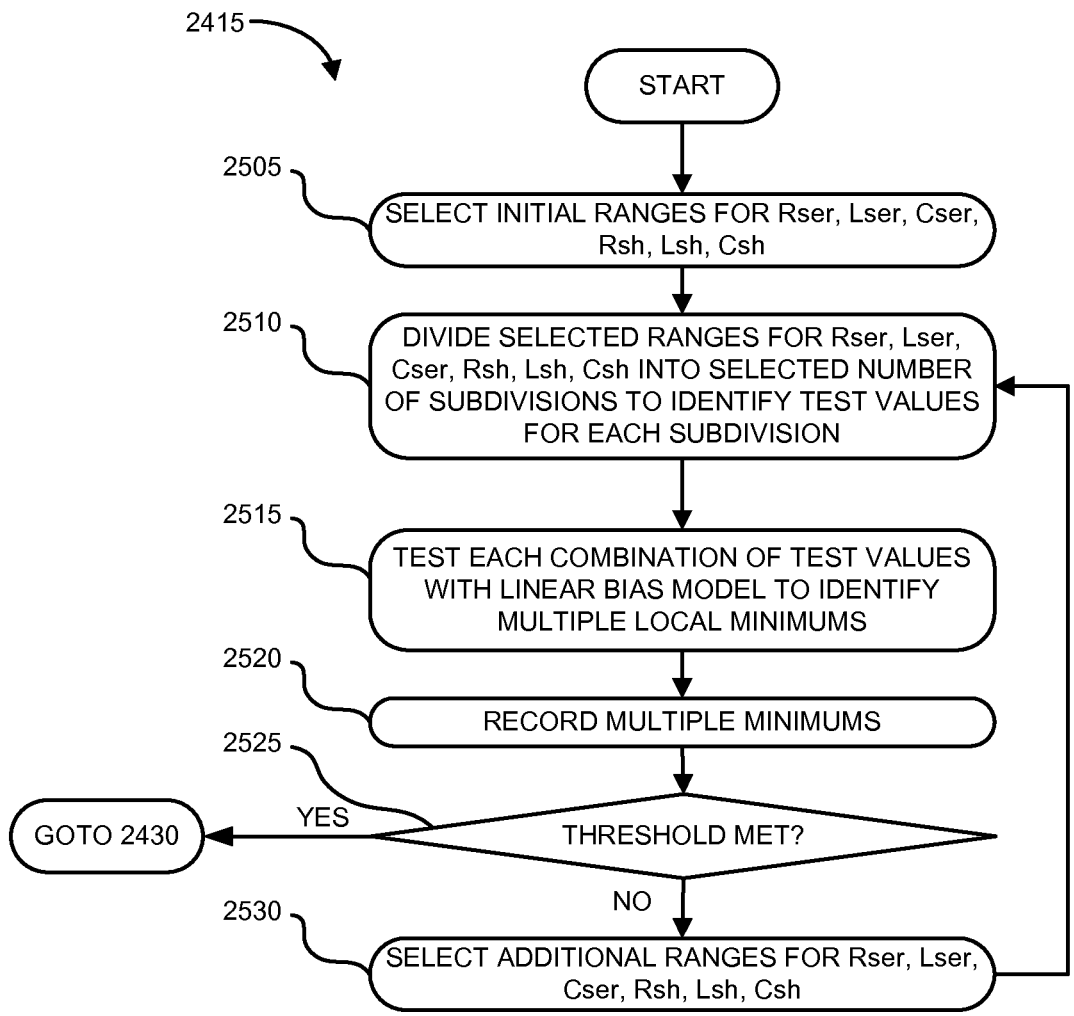
FIG. 25 is a flowchart of the method operations for adding an end module to the baseline RF transmission line model, in accordance with an embodiment described in the present disclosure.

FIG. 25 is a flowchart of the method operations 2415 for adding an end module to the baseline RF transmission line model, in accordance with an embodiment described in the present disclosure. In an operation 2505, ranges for the initial RLC series and shunt values are selected. The initial ranges can be selected randomly or based on a best estimation of the ranges. By way of example, in reviewing the previously modeled stages 2230-2235 of the baseline RF transmission line model some ranges for the RLC series and shunt values for each of the stages fell into approximated ranges. Specifically, for the series values: the Rser values generally fell in a range of about 0 to about 50 ohms, the Lser values generally fell in a range of about 0 to about 50,000 microhenries and the Cser values generally fell in a ranges of about 0 to about 50,000 picofarads. Similarly, for the shunt values: the Rsh values generally fell in a range of about 0 to about 50 ohms, the Lsh values generally fell in a range of about 0 to about 50,000 microhenries and the Csh values generally fell in a range of about 0 to about 50,000 picofarads. The estimated ranges of the RLC values noted in the previously modeled stages 2230-2235 were doubled to attempt to capture the actual RLC values for the end module. Continuing the example: The initial ranges for the Rser and Rsh values were selected as 0-100 ohms range. The initial ranges for the Lser and Lsh were selected as 0 to about 100,000 microhenries range. The initial ranges for the Cser and Csh were selected as 0 to about 100,000 picofarads range.

In an operation 2510, the ranges for the initial RLC series and shunt values are subdivided into a selected number of subdivisions. Any number of subdivisions can be selected, however the greater the number of subdivisions, the greater the number of possible combinations of values would be tested. Given sufficient computing power, each of the ranges of the RLC values could be divided into single units such as there could be 100,000 different values for Lser, Lsh, Cser and Csh and 100 different values for each of Rser and Rsh, however, that would result in 100,000*100,000*100, 000*100,000*100*100=10$^{24}$ different combinations to test which would require a supercomputer to calculate within a reasonable amount of time.

The ranges for the initial RLC series and shunt values are subdivided as follows to reduce the number of combinations to a more workable number: 10 different subdivisions for Lser, Lsh, Cser and Csh and 100 different subdivisions for each of Rser and Rsh, giving 100 million possible combinations to test. It should be understood that these are example numbers of subdivisions and more or fewer subdivisions could be chosen for each of the ranges of each of the test RLC series and shunt values: Rser, Rsh, Lser, Lsh, Cser and Csh.

In an operation 2515, each combination of the test RLC series and shunt values is evaluated using a simplified bias model. The simplified bias model is also referred to as a linear bias model. The linear bias model is a simplified version of a 79 term, 8$^{th}$ order bias model. The linear bias model produces a linear relationship between the RF induced DC bias voltage and Vrf or the Id. The linear bias model can be expressed in voltage or current to calculate the corresponding value includes:

Voltage Model: $a1*V2+a2*V27+a3*V60+a4*V2*V27+a5*V2*V60+a6*V27*V60+a7*V2*V27*V60+a8$ Current Model: $a1*I2+a2*I27+a3*I60+a4*I2*I27+a5*I2*I60+a6*I27*I60+a7*I2*I27*I60+a8$ Where: a1 through a8 are constant values derived using a least squares regression. V2 is equal to the Vrf at 2 MHz. V27 is equal to the Vrf at 27 MHz. V60 is equal to the Vrf at 60 MHz. I2 is equal to the Id at 2 MHz. I27 is equal to the Irf at 27 MHz. I60 is equal to the Irf at 60 MHz. It should be noted that the frequencies of 2, 27 and 60 are for purposes of example explanation only and any one or more frequencies can be used, where the frequencies are not limited to the range of 2-60 MHz. The voltage model and the current model can each be used to calculate a corresponding predicted RF induced DC bias voltage.

The Vrf output from the RF transmission line model is generally only affected by the RLC series components of the final transmission line module and the Id output from the transmission line model is generally only affected by the RLC shunt components of the final transmission line module. Using the voltage and current models above, the series portion and the shunt portion can be optimized separately. This can also reduce the number of possible combinations between the series and shunt RLC values. It should be noted that while only two linear models were used, e.g., the voltage and the current models, any bias model could be used with this method and would produce a different set of local minimums. However, care should be taken when selecting the bias model for this method so as to avoid fitting the input data to the model chosen instead of fitting the model to the data or to the inherent reality of the system.

Testing the test RLC values with the linear bias models may identify multiple local minimums in goodness of fit to measured RF induced DC bias voltage in the RLC series or RLC shunt parameter space. Each of the identified local minimums and the corresponding RLC series and shunt values are recorded such as being stored in a memory system such as a database or a table in an operation 2520.

A sufficient number of minimums are needed to increase the statistical likelihood of capturing the actual global minimum as one of the recorded local minimums. The threshold number of local minimums can be selected at any desired level. Continuing the above example, 1000 local minimums were selected. In an operation 2525, the number of recorded local minimums is compared to the selected threshold number of local minimums to determine if additional local minimums are needed.

If additional local minimums are needed in operation 2525, then the method operations continue in an operation 2530 where additional ranges for the RLC series and shunt values are selected and the method operations continue in operation 2510 as described above. If the selected threshold number of local minimums has been met or exceeded in operation 2525 then the method operations continue in an operation 2430 as discussed above in FIG. 24.

Figure 26:
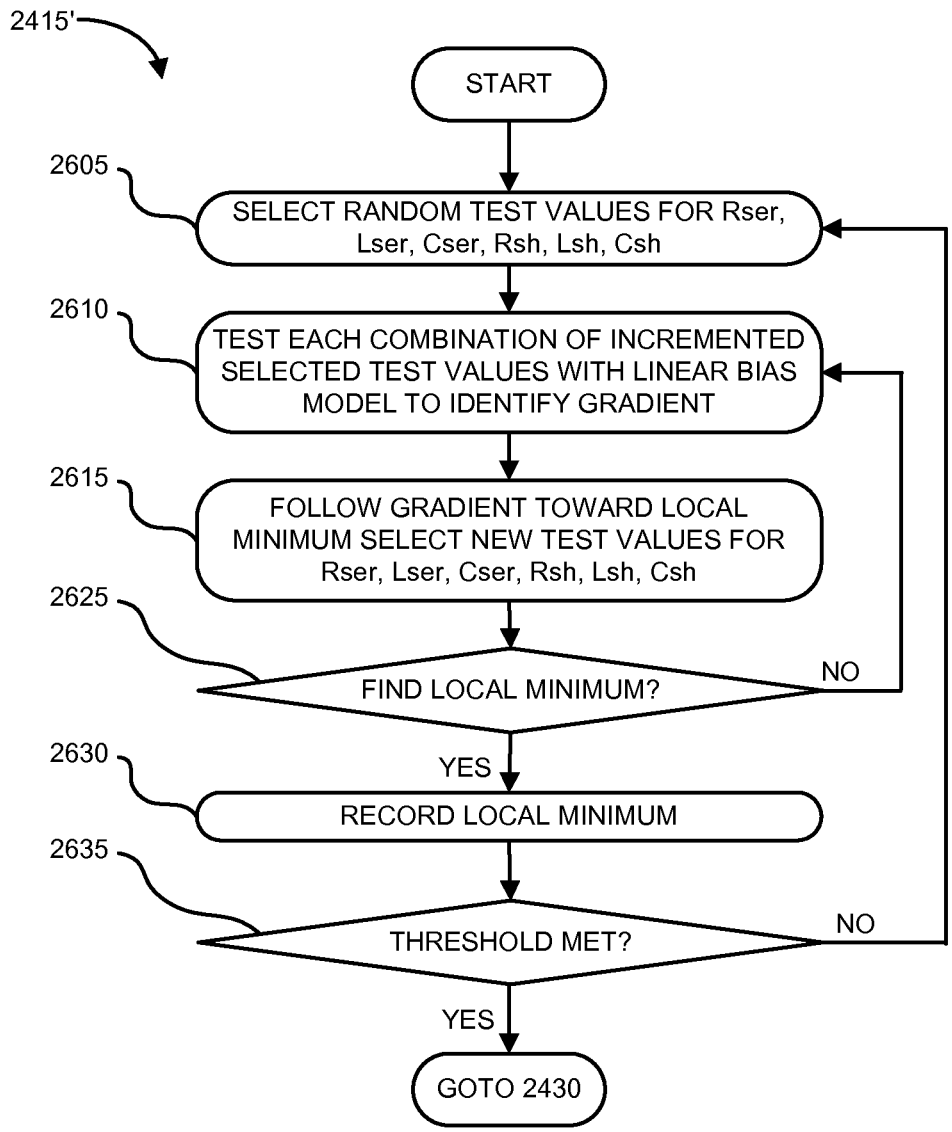
FIG. 26 is a flowchart of an alternate method operations for adding an end module to the baseline RF transmission line model, in accordance with an embodiment described in the present disclosure.

FIG. 26 is a flowchart of an alternate method operations 2415' for adding an end module to the baseline RF transmission line model, in accordance with an embodiment described in the present disclosure. In an operation 2605, random test values for Rser, Lser, Cser, Rsh, Lsh and Csh are selected. In an operation 2610, the selected test values for Rser, Lser, Cser, Rsh, Lsh and Csh are tested using the linear bias model as described above to identify a gradient with respect to corresponding RF induced DC bias voltage goodness of fit. Identifying a gradient is a mathematical analysis of comparing points on each side of the identified point, in each variable (Rser, Lser, Cser, Rsh, Lsh and Csh) and determining the direction of the gradient toward a local minimum.

In an operation 2615, the local gradient is followed toward the local minimum and new values for each of Rser, Lser, Cser, Rsh, Lsh and Csh are selected in the direction indicated by the gradient. By way of example, if the gradient indicates that the curve is sloped downward as Rser is increased, then the new Rser value is selected in a slightly increased value from the previously selected value of Rser. Similarly, each of the remaining values for each of Rser, Lser, Cser, Rsh, Lsh and Csh are selected.

In one implementation, the gradient is identified by selecting one of the serial and shunt RLC values and then selecting a first gradient test value offset a selected positive increment from, e.g., is greater than, the selected serial and shunt RLC value. A second gradient test value can be selected. The second gradient test value is offset a selected negative increment from, e.g., is less than, the selected serial and shunt RLC value. The gradient is calculated using the first gradient test value and the second and the gradient test value and establishing a slope e.g., gradient, of a line passing through the first gradient test value and the second gradient test value.

If the gradient is negative, e.g., downward, from the second gradient test value toward the first gradient test value, then a local minimum is likely located some unknown distance in a direction greater than the first gradient test value. Following the gradient, the first gradient test value can be selected as a new second gradient test value and a new first gradient test value selected. The new first gradient test value is offset a positive increment from the new second gradient test value and the gradient through the new first gradient test value and the new second gradient test value is determined and the process repeated iteratively until a local minimum is found.

If the gradient is positive, e.g., upward, from the second gradient test value toward the first gradient test value, then a local minimum is likely located some unknown distance in a direction less than the second gradient test value. Following the gradient, the second gradient test value can be selected as a new first gradient test value and a new second gradient test value selected. The new second gradient test value is offset a negative increment from the new first gradient test value and the gradient through the new first gradient test value and the new second gradient test value is determined and the process repeated iteratively until a local minimum is found.

In another implementation, the gradient is identified by selecting one of the serial and shunt RLC values and then selecting a first gradient test value offset a selected positive increment from, e.g., is greater than, the selected serial and shunt RLC value. Optionally, the first gradient test value can be offset a selected negative increment from, e.g., is less than, the selected serial and shunt RLC value. The gradient is calculated using the first gradient test value and the selected serial and shunt RLC value and establishing a slope e.g., gradient, of a line passing through the first gradient test value and the selected serial and shunt RLC value.

If the gradient is negative, e.g., downward, from the selected serial and shunt RLC value toward the first gradient test value, then a local minimum is likely located some unknown distance in a direction greater than the first gradient test value. Following the gradient, the first gradient test value can be selected as a new second gradient test value and a new first gradient test value selected. The new first gradient test value is offset a positive increment from the new second gradient test value and the gradient through the new first gradient test value and the new second gradient test value is determined and the process repeated iteratively until a local minimum is found.

If the gradient is positive, e.g., upward, from the selected serial and shunt RLC value test value toward the first gradient test value, then a local minimum is likely located some unknown distance in a direction less than the second gradient test value. Following the gradient, the second gradient test value can be selected as a new first gradient test value and a new second gradient test value selected. The new second gradient test value is offset a negative increment from the new first gradient test value and the gradient through the new first gradient test value and the new second gradient test value is determined and the process repeated iteratively until a local minimum is found.

In another implementation, the gradient is identified by selecting one of the serial and shunt RLC values and then selecting a first gradient test value offset a selected negative increment from, e.g., is less than, the selected serial and shunt RLC value. The gradient is calculated using the first gradient test value and the selected serial and shunt RLC value and establishing a slope e.g., gradient, of a line passing through the first gradient test value and the selected serial and shunt RLC value.

If the gradient is negative, e.g., downward, from the first gradient test value toward the selected serial and shunt RLC value, then a local minimum is likely located some unknown distance in a direction greater than the selected serial and shunt RLC value. Following the gradient, the selected serial and shunt RLC value can be selected as a new second gradient test value and a new first gradient test value selected. The new first gradient test value is offset a positive increment from the new second gradient test value and the gradient through the new first gradient test value and the new second gradient test value is determined and the process repeated iteratively until a local minimum is found.

If the gradient is positive, e.g., upward, from the first gradient test value toward the selected serial and shunt RLC value test value, then a local minimum is likely located some unknown distance in a direction less than the first gradient test value. Following the gradient, the first gradient test value can be selected as a new first gradient test value and a new second gradient test value selected. The new second gradient test value is offset a negative increment from the new first gradient test value and the gradient through the new first gradient test value and the new second gradient test value is determined and the process repeated iteratively until a local minimum is found.

A local minimum is encountered when adjusted higher and lower in value in a selected RLC test value indicates moving upward in the curve, away from the current minimum. Each of the identified local minimums and the corresponding RLC values are recorded such as being stored in a memory system such as a database or a table in an operation 2520.

A sufficient number of minimums are needed to increase the statistical likelihood of capturing the actual global minimum as one of the recorded local minimums. The threshold number of local minimums can be selected at any desired level. Continuing the above example, 1000 local minimums can be selected. In an operation 2635, the number of recorded local minimums is compared to the selected threshold number of local minimums to determine if the threshold has been met.

If, in operation 2635, the threshold has not been met, then the method operations continue in an operation 2605 where additional random test values for the Rser, Lser, Cser, Rsh, Lsh and Csh are selected. If the selected threshold number of local minimums has been met or exceeded in operation 2635 then the method operations continue in an operation 2430 as discussed above in FIG. 24.

Figure 27:
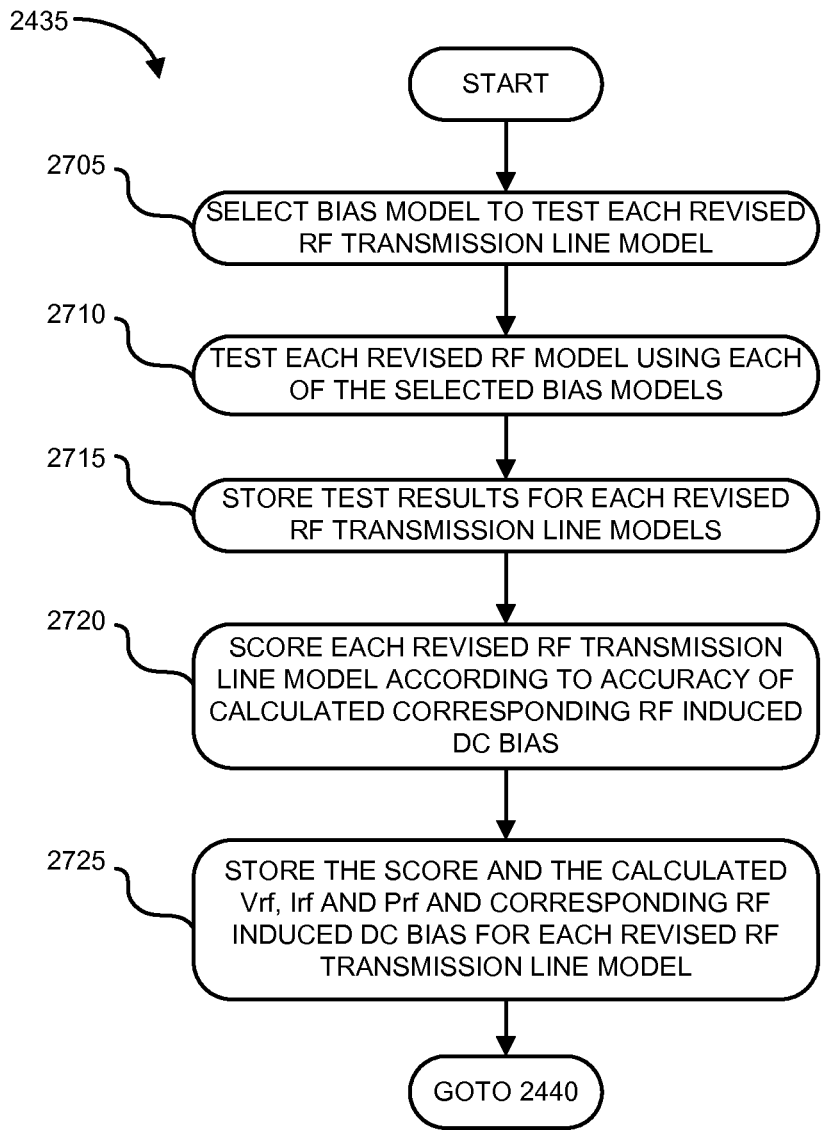
FIG. 27 is a flowchart of the method operations for scoring each of the revised RF transmission line models, in accordance with an embodiment described in the present disclosure.

FIG. 27 is a flowchart of the method operations 2435 for scoring each of the revised RF transmission line models, in accordance with an embodiment described in the present disclosure. In an operation 2705, one or more bias models are selected to test the accuracy of each of the revised RF transmission line models. By way of example, the linear bias model described above or the 79 term, $8^{th}$ order bias model or some other suitable bias model can be selected to evaluate each of the revised RF models. The RLC values of each of the revised RF transmission line models are input to each of the selected bias model and the corresponding predicted RF induced DC bias voltage are calculated in an operation 2710 and stored in an operation 2715. Each of the bias models can produce a different predicted RF induced DC bias voltage value.

In an operation 2720, the predicted RF induced DC bias voltage are compared to an empirically measured induced DC bias voltage. A score is assigned to each of the revised RF transmission line models corresponding to the accuracy of the predicted RF induced DC bias voltage produced by the revised RF model. The score for each revised RF transmission line models is recorded in an operation 2725 and the method operations continue in operation 2440 as discussed above.

It is also noted that the use of three parameters, e.g., RF voltage, RF current, and the phase between the RF current and the RF voltage (or RF power), etc., to model wafer bias allows better determination of wafer bias voltage compared to the use of RF voltage alone. For example, wafer bias calculated using the three parameters has a stronger correlation to non-linear plasma regimes compared to a relation between RF voltage and the non-linear plasma regimes. As another example, wafer bias calculated using the three parameters is more accurate than that determined using a voltage probe alone.

Figure 28:
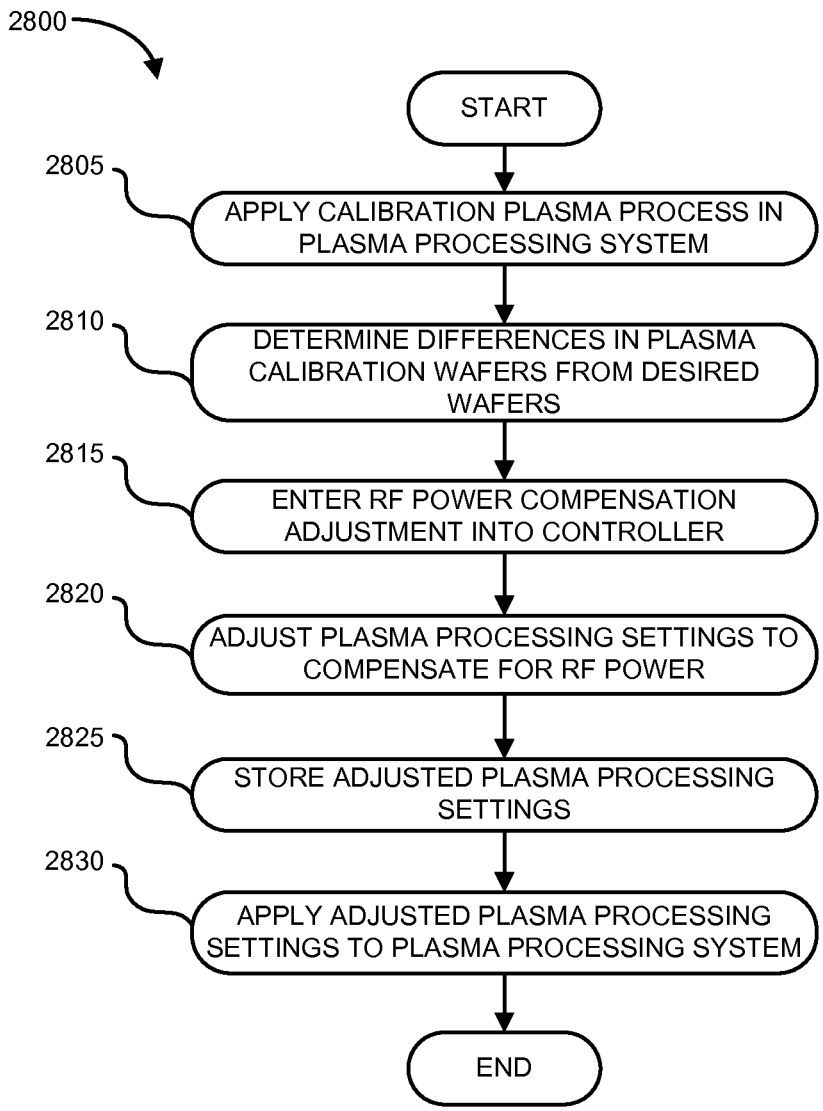
FIG. 28 is a flowchart of the method operations for adjusting a plasma process recipe to compensate for RF power differences due to the RF transmission path and the RF return path, in accordance with an embodiment described in the present disclosure.

FIG. 28 is a flowchart of the method operations 2800 for adjusting a plasma process recipe to compensate for RF power differences due to the RF transmission path and the RF return path 2290, in accordance with an embodiment described in the present disclosure. In an operation 2805, a calibration plasma process is applied to one or more wafers in the plasma processing system. One or more plasma parameters are measured during the calibration plasma process. By way of example, a signal measured by one or more probes 2221 and 2240 can be monitored and measured during the calibration plasma process. The monitored and measured plasma parameters can be monitored and measured by a sensor 2221A, as shown in FIG. 22. The monitored and measured plasma parameters can include one or more of a voltage, a current, a frequency, a phase of a signal, a plasma process chamber temperature, a plasma process chamber pressure, a flow rate input or output from the plasma process chamber, plasma process chamber chemistry including the mixture of process gases input to the plasma process chamber and/or the etch byproducts produced in the plasma process chamber.

In an operation 2810 the processed wafers and/or one or more measured plasma parameters are compared to a desired calibration plasma process result as predicted by a complete RF transmission line model to identify any differences in the corresponding one or more measured plasma parameters.

In an operation 2815, the RF power compensation adjustments are entered in the RF compensation logic 2227. The RF power compensation adjustments can be manually entered into the RF compensation logic 2227 and/or input from another source, e.g., a network connected source, or any other source external from the RF compensation logic. The RF compensation logic 2227 can also determine the RF power compensation adjustments according to the differences between the desired calibration plasma process result and the actual results of the calibration plasma process applied to the plasma processing system.

In an operation 2820, the RF power compensation logic 2227 adjusts one or more plasma processing recipes such as may be stored in the recipe logic 2224. Adjusting the plasma processing recipes can include adjustments to one or more aspects of the plasma processing recipes. By way of example, the RF power, e.g., RF voltage, RF current, phase between RF current and RF voltage, RF frequency, output from the RF generator(s) 2202 settings can be adjusted in the plasma processing recipes. Additionally or alternatively, the output of the match circuit 2206 can be adjusted in the plasma processing recipes. Additionally or alternatively the bias voltage, pressure, temperature, chemistries, flow rates, durations of each plasma process, etc. can be adjusted in the plasma processing recipes.

In an operation 2825, the adjusted plasma processing recipes can also be stored for later use. By way of example, the adjusted plasma processing recipes can be stored in the recipe logic 2224 in the controller 2222. When the plasma processing is initiated, the controller 2222 utilizes the adjusted plasma processing recipes, in an operation 2830. The method operations can then end.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator and the y MHz RF generator are coupled to an inductor within the ICP plasma chamber.

It is also noted that although the operations above are described as being performed by the processor of the host system 130 (FIG. 1), in some embodiments, the operations may be performed by one or more processors of the host system 130 or by multiple processors of multiple host systems.

It should be noted that although the above-described embodiments relate to providing an RF signal to the lower electrode of the ESC 177 (FIGS. 1 and 18) and to the lower electrode of the ESC 192 (FIG. 11), and grounding the upper electrodes 179 and 264 (FIGS. 1 and 11), in several embodiments, the RF signal is provided to the upper electrodes 179 and 264 while the lower electrodes of the ESCs 177 and 192 are grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations in the flowchart of FIG. 2, FIG. 13, FIG. 15, FIG. 17 and FIGS. 24-28 above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma processing system comprising:
a plasma processing chamber including an electrostatic chuck;
an RF transmission path including:
at least one RF generator;
a match circuit having an input coupled to an output of the at least one RF generator; and
an RF feed coupling a match circuit output to an RF input to the electrostatic chuck;
an RF return path coupled between the plasma processing chamber and the at least one RF generator; and
a plasma processing system controller coupled to the plasma processing chamber and the RF transmission path, the system controller including:
a recipe logic including computer readable instructions for at least one plasma processing recipe including a plurality of plasma processing settings; and
an RF power compensation logic including computer readable instructions for adjusting at least one of the plurality of plasma processing settings.

2. The system of claim 1, wherein the recipe logic includes computer readable instructions for a calibration plasma process recipe.

3. The system of claim 2, wherein the plasma processing chamber includes a sensor configured to measure at least one of a voltage, and/or a current, and/or a frequency, and/or a phase of a signal, and/or a plasma process chamber temperature, and/or a plasma process chamber pressure, and/or a flow rate input or output from the plasma process chamber, and/or a mixture of process gases input to the plasma process chamber, and/or the etch byproducts produced in the plasma process chamber.

4. The system of claim 2, wherein the plasma processing chamber includes a sensor configured to measure a plasma induced voltage on a wafer supported on the electrostatic chuck during an execution of a calibration plasma process defined by the calibration plasma process recipe.

5. The system of claim 2, wherein the RF power compensation logic further includes computer readable instructions for measuring at least one plasma parameter during an execution of a calibration plasma process.

6. The system of claim 5, wherein the RF power compensation logic further includes computer readable instructions for comparing a measured at least one plasma parameter to a corresponding at least one plasma parameter predicted by a complete RF transmission line model.

7. The system of claim 6, wherein the complete RF transmission line model includes RF models for the RF transmission path, the plasma and the RF return path.

8. The system of claim 1, wherein the at least one RF generator includes at least two RF generators and each one of the at least two RF generators generate a different output signal frequency.

9. The system of claim 1, wherein the at least one RF generator includes at least three RF generators and each one of the at least three RF generators generate a different output signal frequency.

10. A method for adjusting a plasma process recipe comprising:
determining an RF compensation adjustment including:
applying a calibration plasma process to at least one wafer in a plasma processing chamber;
measuring at least one plasma parameter during the calibration plasma process; and
comparing the measured at least one plasma parameter to a corresponding at least one plasma parameter predicted by a complete RF transmission line model to determine an RF compensation adjustment, the complete RF transmission line model including an RF transmission path, a plasma in the plasma processing chamber and an RF return path;
receiving the RF compensation adjustment in an RF power compensation logic;
adjusting at least one of a plurality of plasma processing settings included in the plasma processing recipe;
storing the adjusted at least one of a plurality of plasma processing settings; and
applying a plasma process to a process wafer, the applied plasma process including the adjusted at least one of the plurality of plasma processing settings.

11. The method of claim 10, wherein the RF power compensation logic compares the measured at least one plasma parameter to the corresponding at least one plasma parameter predicted by a complete RF transmission line model.

12. The method of claim 10, wherein the RF compensation adjustment is determined by a difference between the measured at least one plasma parameter and the corresponding at least one plasma parameter predicted by the complete RF transmission line model.

13. The method of claim 10, wherein the at least one of the plurality of plasma processing settings include at least one of an RF power, and/or an RF voltage, and/or an RF current, and/or a phase of an RF signal, and/or an RF frequency.

14. The method of claim 10, wherein the at least one of the plurality of plasma processing settings include an output of a match circuit included in the RF transmission path.

15. The method of claim 10, wherein the at least one of the plurality of plasma processing settings include a bias voltage, and/or a plasma processing chamber pressure, and/or a plasma processing chamber temperature, and/or a plasma processing chamber chemistries, and/or a plasma processing chamber flow rate input and/or output, and/or a duration of at least one plasma process.

16. The method of claim 10, wherein the RF transmission path includes at least two RF generators and each one of the at least two RF generators generate a different output signal frequency.

17. A plasma processing system comprising:
a plasma processing chamber including an electrostatic chuck;
an RF transmission path including:
at least one RF generator;

a match circuit having an input coupled to an output of the at least one RF generator; and an RF feed coupling a match circuit output to an RF input to an electrostatic chuck input;

an RF return path coupled between the plasma processing chamber and the at least one RF generator; and a plasma processing system controller coupled to the plasma processing chamber and the RF transmission path, the plasma processing system controller including:

a recipe logic including computer readable instructions for at least one plasma processing recipe including a plurality of plasma processing settings; and an RF power compensation logic including:

computer readable instructions for adjusting at least one of the plurality of plasma processing settings;

computer readable instructions for measuring a plasma induced voltage on a wafer during a calibration plasma process; and computer readable instructions for comparing the plasma induced voltage measured on the wafer to a corresponding plasma induced voltage on the wafer as predicted by a complete RF transmission line model, the complete RF transmission line model including RF models for the RF transmission path, a plasma produced in the plasma processing chamber and the RF return path.

18. The system of claim 17, wherein the at least one RF generator includes at least two RF generators and each one of the at least two RF generators generate a different output signal frequency.

* * * * *